(12) United States Patent
McKinzie, III

(10) Patent No.: US 9,362,601 B2
(45) Date of Patent: * Jun. 7, 2016

(54) APPARATUS AND METHOD FOR BROADBAND ELECTROMAGNETIC MODE SUPPRESSION IN MICROWAVE AND MILLIMETERWAVE PACKAGES

(71) Applicant: WEMTEC, INC., Fulton, MD (US)

(72) Inventor: William E. McKinzie, III, Fulton, MD (US)

(73) Assignee: WEMTEC, INC., Fulton, MD (US)

(*) Notice: Subject to any disclaimer, the term of this patent is extended or adjusted under 35 U.S.C. 154(b) by 0 days.

This patent is subject to a terminal disclaimer.

(21) Appl. No.: 14/631,088

(22) Filed: Feb. 25, 2015

(65) Prior Publication Data

US 2015/0171498 A1 Jun. 18, 2015

Related U.S. Application Data

(63) Continuation of application No. 13/276,957, filed on Oct. 19, 2011, now Pat. No. 9,000,869, which is a continuation-in-part of application No. 12/711,923, filed on Feb. 24, 2010, now Pat. No. 8,816,798, which (Continued)

(51) Int. Cl.
*H01P 1/16* (2006.01)
*H05K 1/02* (2006.01)
(Continued)

(52) U.S. Cl.
CPC ........ *H01P 1/163* (2013.01); *H01P 1/16* (2013.01); *H01P 1/20* (2013.01); *H01P 1/2005* (2013.01);
(Continued)

(58) Field of Classification Search
CPC .................. H01P 1/16; H01P 1/20; H05K 1/0234–1/0236
USPC ................. 333/212, 251, 174–176; 343/909
See application file for complete search history.

(56) References Cited

U.S. PATENT DOCUMENTS

| 3,638,148 A | 1/1972 | Haliford et al. |
| 3,863,181 A | 1/1975 | Glance et al. |

(Continued)

FOREIGN PATENT DOCUMENTS

| JP | 2003008309 A | 1/2003 |
| JP | 2003-060101 | 2/2003 |

(Continued)

OTHER PUBLICATIONS

Rotman, W., "Plasma Simulation by Artificial Dielectrics and Parallel-Plate Media", *IRE Transactions on Antennas and Propagation*, January, Authorized licensed use limited to: William McKinzie, downloaded on Dec. 10, 2009 from IEE Xplore, 1962, pp. 82-95.

(Continued)

*Primary Examiner* — Dean Takaoka
*Assistant Examiner* — Alan Wong
(74) *Attorney, Agent, or Firm* — Brinks Gilson & Lione

(57) ABSTRACT

A parallel plate waveguide structure may be configured to suppress spurious propagating modes by including a lossy frequency selective surface (FSS) formed from a resistive film. The electromagnetic material properties of individual layers disposed between the conductive plates of the waveguide may be engineered to extend the suppression band of the fundamental TE mode up to the cutoff frequency of the second TE mode, and to simultaneously create a multi-octave TM mode suppression band. Applications include, for example, cavity mode suppression in microwave and millimeterwave assemblies at the board, package, and chip level.

13 Claims, 53 Drawing Sheets

Related U.S. Application Data is a continuation-in-part of application No. 12/187,071, filed on Aug. 6, 2008, now Pat. No. 8,514,036.

(60) Provisional application No. 60/964,680, filed on Aug. 14, 2007.

(51) Int. Cl.

| | | |
|---|---|---|
| *H01P 1/163* | (2006.01) | |
| *H01P 1/20* | (2006.01) | |
| *H01P 3/08* | (2006.01) | |
| *H01Q 15/02* | (2006.01) | |
| *H05K 1/16* | (2006.01) | |

(52) U.S. Cl.
CPC .............. *H01P 3/082* (2013.01); *H05K 1/0234* (2013.01); *H05K 1/0236* (2013.01); *H05K 1/167* (2013.01); *Y10T 29/49124* (2015.01)

(56) References Cited

U.S. PATENT DOCUMENTS

| | | | |
|---|---|---|---|
| 4,268,803 | A | 5/1981 | Childs et al. |
| 4,689,585 | A | 8/1987 | Sequeira |
| 4,739,448 | A | 4/1988 | Rowe et al. |
| 5,030,935 | A | 7/1991 | Williams et al. |
| 5,126,716 | A | 6/1992 | Munger |
| 5,225,796 | A | 7/1993 | Williams et al. |
| 5,376,901 | A | 12/1994 | Chan et al. |
| 5,481,232 | A | 1/1996 | Wu et al. |
| 5,585,741 | A | 12/1996 | Jordan |
| 5,801,605 | A | 9/1998 | Filakovsky |
| 6,023,209 | A | 2/2000 | Faulkner et al. |
| 6,262,495 | B1 | 7/2001 | Yablonovitch et al. |
| 6,337,661 | B1 | 1/2002 | Kondoh et al. |
| 6,476,771 | B1 | 11/2002 | McKinzie, III |
| 6,580,395 | B2 | 6/2003 | Koshizaka et al. |
| 6,649,852 | B2 | 11/2003 | Chason et al. |
| 6,707,682 | B2 | 3/2004 | Akiba et al. |
| 6,710,745 | B2 | 3/2004 | Koshizaka et al. |
| 6,756,932 | B1 | 6/2004 | Barker et al. |
| 6,774,867 | B2 | 8/2004 | Diaz et al. |
| 6,897,831 | B2 | 5/2005 | McKinzie et al. |
| 6,906,674 | B2 | 6/2005 | McKinzie, III et al. |
| 6,919,862 | B2 | 7/2005 | Hacker et al. |
| 6,949,707 | B1 | 9/2005 | Tonomura |
| 6,967,282 | B2 | 11/2005 | Tonomura et al. |
| 7,123,118 | B2 | 10/2006 | McKinzie, III |
| 7,142,822 | B2 | 11/2006 | Tanaka et al. |
| 7,157,992 | B2 | 1/2007 | McKinzie, III |
| 7,197,800 | B2 | 4/2007 | Sievenpiper et al. |
| 7,215,007 | B2 | 5/2007 | McKinzie, III et al. |
| 7,215,301 | B2 | 5/2007 | Choi et al. |
| 7,239,222 | B2 | 7/2007 | Nagaishi et al. |
| 7,250,835 | B2 | 7/2007 | Higgins et al. |
| 7,342,471 | B2 | 3/2008 | McKinzie, III |
| 7,414,491 | B2 | 8/2008 | Higgins |
| 7,586,444 | B2 | 9/2009 | Berlin et al. |
| 7,813,145 | B2 | 10/2010 | Stoneham et al. |
| 8,013,777 | B2 * | 9/2011 | Sim ................ H01Q 17/00 342/1 |
| 8,514,036 | B2 * | 8/2013 | McKinzie, III ........... H01P 1/16 333/175 |
| 8,816,798 | B2 * | 8/2014 | McKinzie, III ........... H01P 1/16 333/175 |
| 9,000,869 | B2 * | 4/2015 | McKinzie, III ........... H01P 1/16 333/175 |
| 2002/0167456 | A1 | 11/2002 | McKinzie, III |
| 2005/0007289 | A1 | 1/2005 | Zarro et al. |
| 2006/0038639 | A1 | 2/2006 | McKinzie, III |
| 2008/0102565 | A1 | 5/2008 | Zeng et al. |
| 2009/0244874 | A1 | 10/2009 | Mahajan et al. |

FOREIGN PATENT DOCUMENTS

| | | |
|---|---|---|
| JP | 2003304106 A | 10/2003 |
| JP | 2005-033798 | 2/2005 |
| WO | WO 94/00892 | 1/1994 |
| WO | WO 2009/146007 A | 12/2009 |

OTHER PUBLICATIONS

Williams, D.F. "Damping of the Resonant Modes of a Rectangular Metal Package", IEEE Transactions on Microwave Theory and Techniques, vol. 37, No. 1, Jan. 1989, pp. 253-256.

Sievenpiper, Daniel Frederic, "High-Impedance Electromagnetic Surfaces", University of California, Los Angeles, 1999, pp. 1-4.

Coccioli et al., *UC-PBG Substrate for Planar Antennas*; University of California at Los Angeles; Oct. 1999.

* cited by examiner

APPARATUS AND METHOD FOR BROADBAND ELECTROMAGNETIC MODE SUPPRESSION IN MICROWAVE AND MILLIMETERWAVE PACKAGES

RELATED APPLICATIONS

This application is a continuation of U.S. non-provisional application Ser. No. 13/276,957, filed on Oct. 19, 2011, which is continuation-in-part of U.S. non-provisional application Ser. No. 12/711,923 filed on Feb. 24, 2010, now U.S. Pat. No. 8,816,798, issued on Aug. 23, 2014, which is a continuation-in-part of U.S. non-provisional application Ser. No. 12/187,071, filed on Aug. 6, 2008, now U.S. Pat. No. 8,514,036, issued Aug. 20, 2013, which claims priority to U.S. provisional application Ser. No. 60/964,680, filed on Aug. 14, 2007, each of which are incorporated herein by reference

TECHNICAL FIELD

The field of the invention relates generally to systems and methods for suppressing the propagation of electromagnetic waves in structures and, more particularly, to suppress parasitic modes, spurious modes, or electromagnetic noise in electrical packages.

BACKGROUND

FIG. 1(a) illustrates a generic microwave or millimeterwave integrated circuit (MMIC) package fabricated as a shielded package and containing at least two microstriplines 140 and 150. This package also includes a cover 110 and a substrate 120 with conductive sidewalls 165 which, when sealed together with a conductive seal 130, create an enclosed cavity 115 of sufficient volume to accommodate one or more MMICs. The substrate and cover are dielectric materials of relative permittivity $\in_{r5}$ and $\in_{r1}$ respectively. The cavity formed therebetween may be an air filled region where the permittivity of the air is denoted as $\in_0$. Package materials may include semiconductors (Si, SiGe, GaAs), ceramics (Al2O3, AlN, SiC, BeO), metals (Al, Cu, Au, W, Mo), and metal alloys (FeNiCo (Kovar), FeNiAg (SILVAR), CuW, CuMo, Al/SiC) and many others. The substrate and cover need not be made of the same materials.

The package may be shielded with conductive surfaces 160, 170 to prevent radiation from internal sources (transmitters) and to protect internal circuits from undesired coupling with fields external to the package. The conductive surfaces 160, 170 form a parallel-plate waveguide (PPW) that allows a quasi-TEM (transverse electromagnetic) mode to be supported inside the package. The TEM mode has a vertical (z-directed) electric field which propagates in any x or y direction inside the package, and has a phase velocity of $(\omega/c)\sqrt{\in_{eff}}$ where $\omega$ is the angular frequency, c is the speed of light in a vacuum; and, the effective dielectric constant of the PPW is given by $$\varepsilon_{eff} = \frac{t_1 + t_3 + t_5}{t_1/\varepsilon_{r1} + t_3 + t_5/\varepsilon_{r5}}$$

where $t_1$, $t_3$, and $t_5$ are the thicknesses of the cover, air region, and substrate, respectively. A parasitic or unintentional PPW mode may be excited at discontinuities of the microstriplines such as at ends, gaps, and bends. This results in crosstalk between otherwise isolated microstriplines. The parasitic modes will also reflect at the sides of the package and result in undesired package resonances or parasitic resonances. Package resonances may exist in an empty rectangular package at frequencies near $$f_{nm} = \frac{c}{2\pi\sqrt{\varepsilon_{eff}}} \sqrt{\left(\frac{m\pi}{W}\right)^2 + \left(\frac{n\pi}{L}\right)^2}$$

where W and L are the width and length of the rectangular package. The addition, for example, of an integrated circuit die into the package can dramatically lower the frequency of such resonances.

A conventional means of suppressing the parasitic resonances is to add lossy ferrite-loaded materials as thin layers inside the package. This is a relatively expensive method of mode suppression. Also, the ferrite layers need to be adhesively attached to a conductive surface to obtain the expected attenuation, and conducting surfaces may not be readily available inside of every package. Millimeterwave packages tend to be very small which exacerbates the assembly challenges of installing ferrite-loaded materials.

SUMMARY

A structure for suppressing electromagnetic waves includes a first conductive surface and a second conductive surface spaced apart from the first conductive surface; and a lossy frequency selective surface (FSS). The lossy FSS is disposed between the first conductive surface and the second conductive surface.

In an aspect, a package for an electrical circuit includes a first conductive surface, a second conductive surface. A plurality of patches are positioned at a first fixed distance from the first conductive surface and a second fixed distance from the second conductive surface, and adjacent patches are coupled by a resistance.

In another aspect, apparatus for suppressing parallel-plate waveguide (PPW) modes in a package is disclosed, including a first conductive surface; and, a second conductive surface, spaced apart from the first conductive surface. A first lossy anisotropic magneto-dielectric layer and an isotropic layer are positioned so that the first lossy anisotropic magneto-dielectric layer and the isotropic dielectric layer are located between at least a portion of the first conductive surface and the second conductive surface.

In another aspect, a method for controlling parallel-plate waveguide (PPW) modes in a package is disclosed, the method including the steps of providing a first and a second conductive surface sized and dimensioned to form at least a part of the package; and, disposing a lossy frequency selective surface (FSS) between the first conductive surface and the second conductive surface.

In a further aspect, a method for controlling parallel-plate waveguide (PPW) modes is disclosed, the method including the steps of: providing a first conductive surface, and a second conductive surface, the second conductive surface disposed parallel to the first conductive surface; at least one of the first conductive surface or the second conductive surface forms a part of a microwave or millimeterwave circuit package. A first anisotropic magneto-dielectric layer comprising a first sub-layer and a second sub-layer and an isotropic dielectric layer are provided, such that the first anisotropic magneto-dielectric layer and the isotropic dielectric layer are positioned between the first conductive surface and the second conductive surface. The thickness of the first sub-layer and the second sub-layer, the complex permittivity and permeability of the first sub-layer and the second sub-layer, and the thickness and dielectric constant of the isotropic dielectric layer are selected such that a transverse electric (TE) wave amplitude is suppressed over a frequency interval.

In yet another aspect, a method for suppressing parallel-plate waveguide (PPW) modes is disclosed, the method including the steps of: providing a first conductive surface, and a second conductive surface, positioned parallel to the first conductive surface; at least one of the first conductive surface or the second conductive surface forming a part of a microwave or millimeterwave circuit package; providing a substrate positioned between the first and second conductive surfaces; providing an array of patches formed on the substrate such that the patches from effective sheet capacitance C; providing resistances between patches of the first array of conductive patches so as to form an effective sheet resistance R; and selecting the effective sheet resistance R to achieve a selected attenuation level for the fundamental TE mode extending from zero frequency up to at least the TE mode 2 cutoff frequency.

In still another aspect, surface wave suppression structure is disclosed, the structure being a conductive surface, a resistive sheet spaced apart from the conductive surface, and an array of posts which electrically connect the conductive surface to the resistive sheet.

In a further aspect, a method of fabricating a structure having controlled electromagnetic properties includes: providing a dielectric substrate having a pattern of posts formed between opposing surfaces thereof; forming a patterned resistive layer on a first surface of the dielectric substrate; and, forming a conductive layer on a second surface of the dielectric layer opposing the resistive layer, such that the posts connect the resistive layer to the conductive layer. The spacing, shape, dimensions and conductivity of the posts, and the dimensions and shape of the patterned resistive layer are selected such that the propagation of TM modes is suppressed in amplitude over a desired frequency band.

In a related aspect, a method for suppressing parallel-plate waveguide (PPW) modes is disclosed, comprising: providing a first conductive surface, and a second conductive surface, disposed parallel to the first conductive surface. At least one of the first conductive surface or the second conductive surface forms a part of a radio frequency circuit package. A substrate is disposed between the first and second conductive surfaces; and a resistive sheet is formed on the substrate, The intrinsic resistance value of the resistive sheet is selected to form an effective sheet resistance R; and, an array of vias electrically connects the resistive sheet to one of the first or the second conductive surfaces. The size and spacing of the array of vias, the separation distance between the first and the second conductive surfaces, and the effective sheet resistance R are selected to suppress propagation of TM modes over a desired frequency band.

A method of fabricating a circuit assembly for use in a package is disclosed, the circuit assembly having opposing conductive surfaces, spaced apart so as to provide a first dielectric layer having a first relative dielectric constant and a thickness. An array of posts is formed connecting opposing surfaces of the first dielectric layer, and a conductive layer on one of the surfaces of the first dielectric layer connects an end of the posts. A resistive layer is formed on another of the surfaces of the first dielectric layer connects another end of the posts. The resistive layer is processed so as to form a plurality patches having a geometric pattern.

A package for an electrical circuit is described, the package having a first conductive surface and a second conductive surface. A resistive layer is spaced at a first fixed distance from the first conductive surface and a second fixed distance from the second conductive surface. A first dielectric material, having a relative dielectric constant greater than unity, is disposed between the resistive layer and the first conductive surface; and a second dielectric material, having a relative dielectric constant greater than or equal to unity, disposed between the resistive layer and the second conductive surface. The first distance, the second distance and the relative dielectric constants of dielectric layers disposed between the resistive film and the conductive surfaces are selected such that propagation of a TE mode is suppressed in amplitude over a selected frequency interval.

DESCRIPTION

Reference will now be made in detail to several examples; however, it will be understood that the claimed invention is not limited to such examples. Like numbered elements in the same or different drawings perform equivalent functions. In the following description, numerous specific details are set forth in the examples in order to provide a thorough understanding of the subject matter of the claims which, however, may be practiced without some or all of these specific details. In other instances, well known process operations or structures have not been described in detail in order not to unnecessarily obscure the description.

When describing a particular example, the example may include a particular feature, structure, or characteristic, but every example may not necessarily include the particular feature, structure or characteristic. This should not be taken as a suggestion or implication that the features, structure or characteristics of two or more examples should not or could not be combined, except when such a combination is explicitly excluded. When a particular feature, structure, or characteristic is described in connection with an example, a person skilled in the art may give effect to such feature, structure or characteristic in connection with other examples, whether or not explicitly described.

Figure 1:
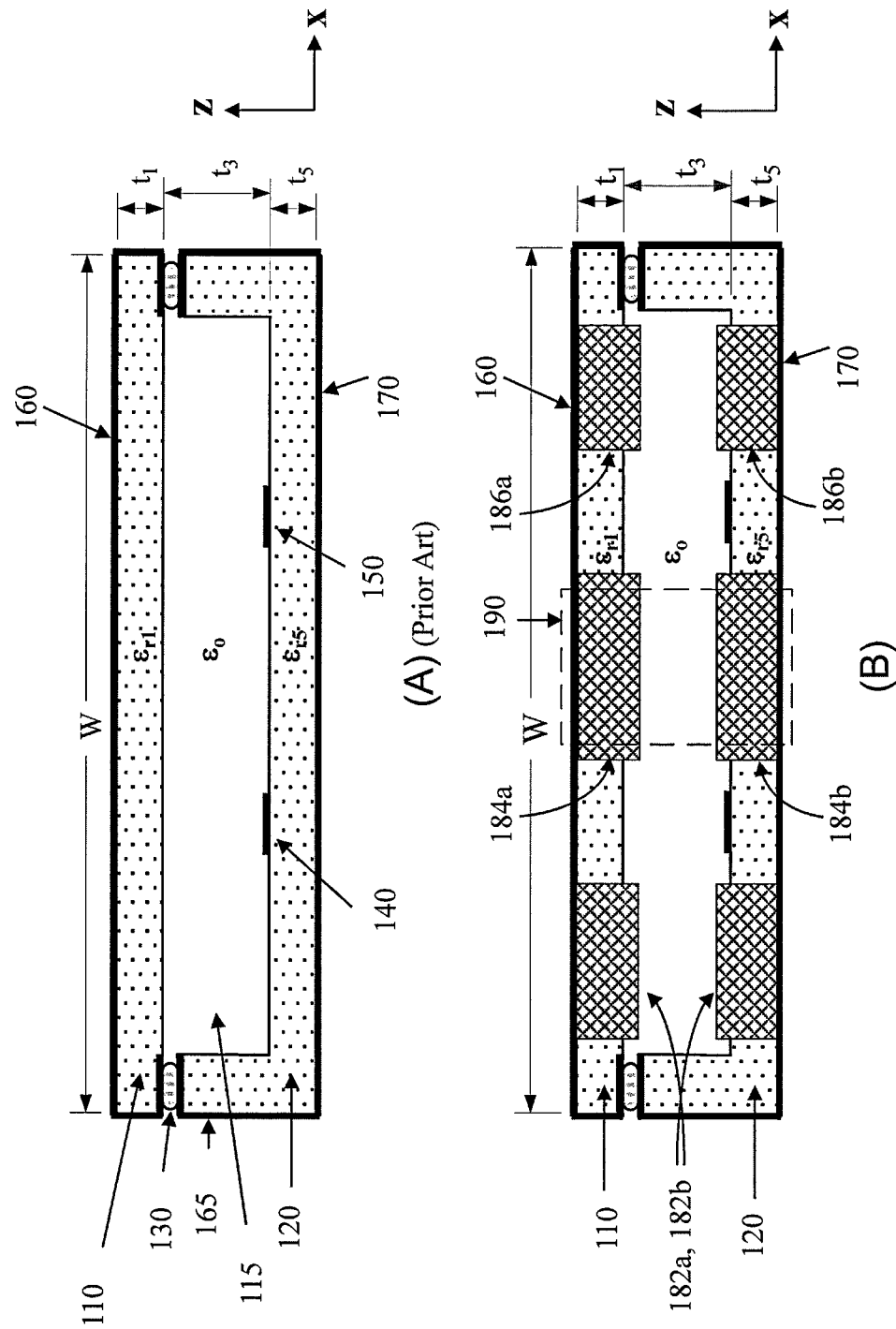
FIG. 1 shows cross sectional views of a shielded microwave package with internal microstriplines (a) as in the prior art, and (b) with EBG structures of a first example.

FIG. 1(b) represents a microwave integrated circuit (MMIC) package that is the same as that shown in FIG. 1(a) but with the addition of electromagnetic bandgap (EBG) structures 182, 184, and 186. The package has a cover 110, a substrate 120 and a cavity 115, plus microwave or millimeterwave transmission lines such as microstriplines 140 and 150, and other components of a MMIC that are not shown. Also included in the package are conductive surfaces 160 and 170 which may be electromagnetic shields for EMI (electromagnetic interference) and EMC (electromagnetic compatibility) purposes. However, such conductive surfaces may also guide parallel-plate waveguide (PPW) modes therebetween. Such modes may be termed parasitic modes because they may promote undesired crosstalk or coupling between the transmission lines 140, 150 and because they may create cavity resonances within the package. The electronic bandgap (EBG) structures 182, 184, and 186 may be incorporated in the package to suppress the PPW modes over certain frequency ranges.

The EBG structures in FIG. 1(b) may be fabricated as part of the substrate such as 184b, or as part of the cover such as 184a. The EBG structures may function as a pair, and cooperate to determine the electronic band gap EBG, which may also be called the stopband. Between the EBG structures 184a and 184b there may be a cavity region which may be air filed as shown, or filled with an isotropic dielectric, such as a molding or potting compound. A portion of the package containing EBG structures 184a and 184b, the conductive surfaces 160 and 170, and the cavity region between them may be considered to be an inhomogeneous PPW 190. The inhomogeneous PPW 190 may allow an EBG to be realized.

Herein, a PPW is considered to be a pair of parallel conductive planes whose area is sufficient to encompass at least a 3×3 array of unit cells associated with an EBG structure. These parallel planes may have holes or voids in the conductive surfaces thereof, but such holes or voids should not have an area greater than about one fourth of the area of a given unit cell so as to have a small influence on the local value of the stopband properties of the EBG structure. A person of skill in the art will appreciate that such holes, voids or apertures may be needed to accommodate the circuitry and other structures which may be part of a MMIC package. The figures and descriptions herein therefore may be considered to represent an ideal situation, which may be adapted to the design of specific product. When a coupling or radiating slot is introduced into one of the conductive planes of the PPW, one may improve the efficiency of microwave or millimeterwave transitions and the efficiency of slot radiators. The height of the PWW may be reduced without heavy excitation of PPW modes which may have the effect of lowering efficiency.

Five Layer Effective Medium Model of the Inhomogeneous PPW

Figure 2:
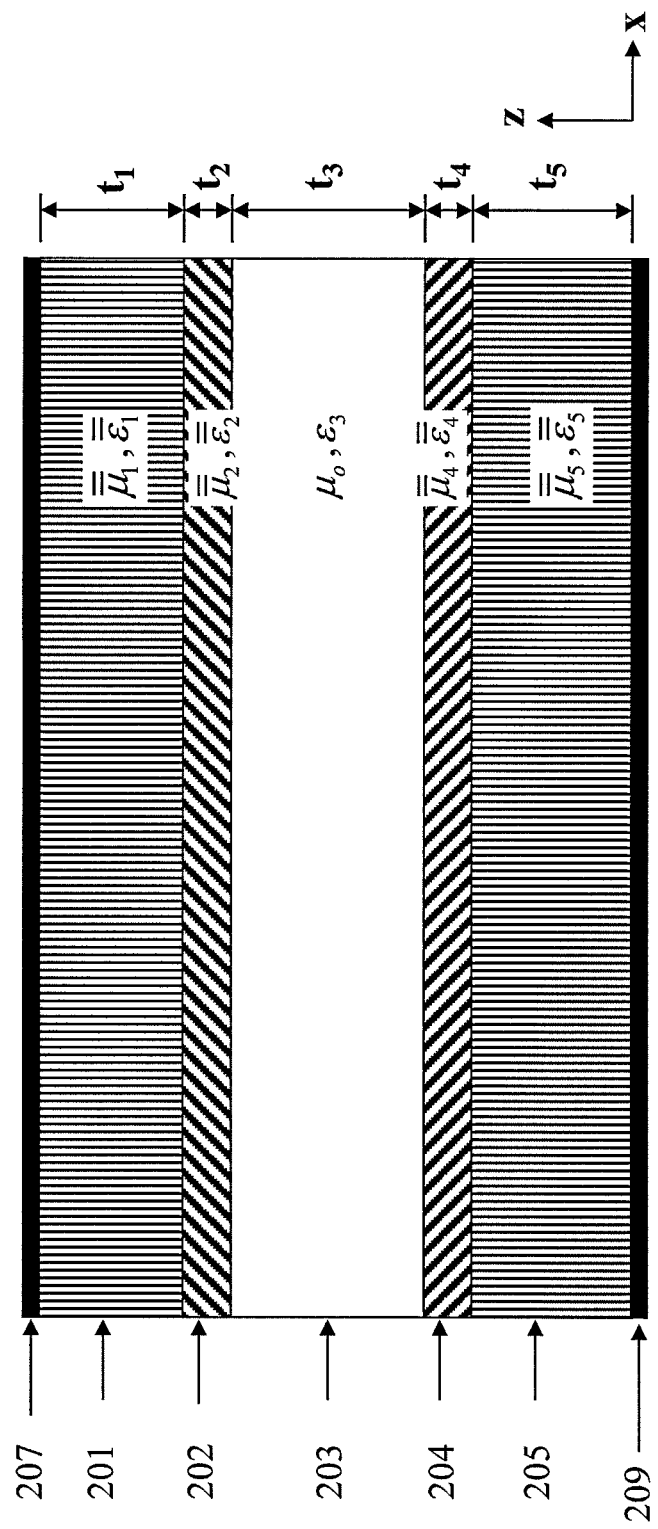
FIG. 2 shows an effective medium model for an example.

FIG. 2 illustrates an inhomogeneous parallel-plate waveguide (PPW) 190. The inhomogeneous PPW may contain anisotropic magneto-dielectric layers 201, 202, 204, and 205 in which the permittivity and permeability may be mathematically described as tensors. Layer 203 may be an isotropic dielectric layer of relative permittivity $\in_3$, and, in some examples, this layer may be an air gap where $\in_3=1$. The layers are contained between the upper conductor 207 and the lower conductor 209 such that the internal electromagnetic fields are effectively confined between upper and lower conductors.

For computation and description of the examples, a coordinate system is used in which the in-plane directions are the x and y Cartesian coordinates, and the z axis is normal to the layered structure.

Each magneto-dielectric layer in FIG. 2 may have a unique tensor permittivity $\overline{\in}$ and a unique tensor permeability $\overline{\mu}$. The tensor permittivity and tensor permeability of each layer may have non-zero elements on the main diagonal, with the x and y tensor directions being in-plane with each respective layer, and the z tensor direction being normal to the layer interface.

In this analytic model, which may be termed an effective medium model of the structure of FIG. 2, each magneto-dielectric layer is a bi-anisotropic media: both the permeability $\overline{\mu}$ and the permittivity $\overline{\in}$ are tensors. Furthermore, each magneto-dielectric layer may be uniaxial: that is, two of the three main diagonal components are equal, and off-diagonal components are zero, for both $\overline{\mu}$ and $\overline{\in}$. Each layer 201, 202, 204, and 205 may be considered a bi-uniaxial media where the equal tensor components of the main diagonals are in the transverse direction.

An effective medium model means that individual layers are modeled as homogeneous such that, in the long wavelength limit (as the guide wavelength becomes long with respect to the unit cell dimensions of a periodic structure), the tensor permittivity and permeability of the individual layers accurately model the electromagnetic properties of the physical structure, which may be periodic.

Composite materials that may be described by an effective medium model may be termed magneto-dielectric materials, metamaterials, metalo-dielectric materials, or similar art recognized names. Generally, the metamaterial is comprised of sub-wavelength inclusions of one or more materials having properties differing from the surrounding matrix. Such metamaterials may be formed to have a variety of electromagnetic properties over a wide range of physical scale sizes, where the design scale is measured in wavelengths. Metamaterials exhibit electromagnetic properties which are generally not found in any single material.

If the PPW structure of FIG. 2 were to be filled with an isotropic homogeneous dielectric material, the dominant electromagnetic propagation mode would be a transverse electromagnetic (TEM) mode that has a uniform z-directed E field and a uniform y-directed H field, assuming propagation in the x direction. However, as depicted in FIG. 2 the structure is an inhomogeneously-filled waveguide which will support both TM-to-x and TE-to-x modes. At low frequencies, the lowest order TM mode may resemble the ideal TEM mode. TM modes have normal (z-directed) E fields. The z-directed E field may be excited by discontinuities in printed transmission lines. The electromagnetic coupling, or the reaction integral, between the fields associated with transmission line discontinuities and the fields associated with intrinsic modes of the inhomogeneous PPW, may be enhanced when the total thickness of the waveguide is decreased. In practice, MMIC packages may be designed to be as thin as physically possible, consistent with industrial designs. However, this may increase the importance of suppressing unwanted electromagnetic coupling.

For the inhomogeneous PPW of FIG. 2, magneto-dielectric layers 201 and 205 may be defined to have a normal (z direction) permittivity which behaves like a plasma for z-directed E fields. In these layers, the z-tensor-component of relative permittivity $\in_{iz}$ for i=1 and 5 is negative for frequencies from DC up to the plasma frequency of $\omega_p$. The plasma frequency may be determined by controlling the period of the unit cells and the diameter of the metallic vias (shown, for example, in FIG. 4) in accordance with equation (27), as described below. Above the plasma frequency, $\in_{zi}$ is positive and becomes asymptotic at high frequency to the permittivity value of the host or background medium, defined as $\in_{ri}$:

$$\varepsilon_{zi}(\omega) = \varepsilon_{ri}\left[1 - \left(\frac{\omega_p}{\omega}\right)^2\right] \text{ for } i = 1 \text{ and } 5. \tag{1}$$

Also, $\in_{zi}$ for i=1 and 5 may be negative over a range of frequencies that includes the stopband of the EBG structure. The transverse tensor components $\in_{xi}$ and $\in_{yi}$ may have permittivity values near to that of the host or background medium $\in_{ri}$. The non-zero components of tensor permeability, $\mu_{xi}$, $\mu_{yi}$, and $\mu_{zi}$ for i=1 and 5 may have values near to that of the host or background medium permeability defined as $\mu_{ri}$ for layers i=1 and 5. For nonmagnetic host media, $\mu_{ri}=1$.

The anisotropic magneto-dielectric layers 202 and 204 may be characterized by a high transverse capacitance $C_i$ where i=2 and 4. The transverse permittivity of layers 202 and 204 may be expressed as $\in_{xi}=\in_{yi}=C_i/(\in_0 t)\gg 1$. Note that these layers may be chosen by design to have a relative transverse permittivity that is substantially greater than unity. To simplify the description herein, we shall assume that the transverse capacitances in layers 202 and 204 are substantially constant, but this is not intended to be a limitation. In general, the transverse capacitance may be frequency dependent and defined as $Y_i=j\omega C_i$ where $Y_i$ is a admittance function expressed in a second Foster canonical form as taught by Diaz and McKinzie in U.S. Pat. No. 6,512,494, U.S. Pat. No. 6,670,932, and U.S. Pat. No. 6,774,867, which are incorporated herein by reference.

Magneto-dielectric layers 202 and 204 may have a normal permittivity $\in_{zi}$ for i=2 and 4 substantially equal to unity. The layers may also have a relative transverse permeability $\mu_{xi}$ and $\mu_{yi}$ which is also close to unity. However, as a consequence of a desired high transverse permittivity $\in_{trans,i}$, the normal permeability may be depressed in these layers. This is because layers 202 and 204 model physical layers having conductive inclusions introduced to create high electric polarization in a transverse direction. However, these inclusions allow eddy currents to flow thereon in the x-y plane, which may suppress the ability of magnetic flux to penetrate in the normal direction. Hence, $$\mu_{zi} \cong \frac{2\varepsilon_{avg}}{\varepsilon_{trans,i}} \ll 1 \text{ where } \varepsilon_{trans,i} = \varepsilon_{xi} = \varepsilon_{yi} \gg 1,$$

and $\in_{avg}$ is the average relative dielectric constant of the host media for layers 202 and 204. If layers 202 and 204 model arrays of thin coplanar patches, then the parameter $\in_{avg}$ may be approximately the arithmetic average of the host relative dielectric constants on either side of the coplanar patches. If the inclusions modeled as layers 202 and 204 are more elaborate and have physical extent in the z direction, then $\in_{avg}$ may be as large as the host or background dielectric material located between the inclusions. The mathematical differences for simulation may not change the analysis procedure used to determine the fundamental stopband. Both cases will be shown in later examples.

The desired electromagnetic constituent parameters of the magneto-dielectric layers 201, 202, 204, and 205 of FIG. 2, may be expressed as:

$$\bar{\bar{\varepsilon}}_i = \begin{bmatrix} \varepsilon_{xi} & 0 & 0 \\ 0 & \varepsilon_{yi} & 0 \\ 0 & 0 & \varepsilon_{zi} \end{bmatrix} = \begin{bmatrix} \cong \varepsilon_{ri} & 0 & 0 \\ 0 & \cong \varepsilon_{ri} & 0 \\ 0 & 0 & \varepsilon_{ri}\left[1 - \left(\frac{\omega_p}{\omega}\right)^2\right] \end{bmatrix} \tag{2}$$

for $i = 1$ and 5, $$\bar{\bar{\mu}}_i = \begin{bmatrix} \mu_{xi} & 0 & 0 \\ 0 & \mu_{yi} & 0 \\ 0 & 0 & \mu_{zi} \end{bmatrix} = \begin{bmatrix} \cong \mu_{ri} & 0 & 0 \\ 0 & \cong \mu_{ri} & 0 \\ 0 & 0 & \cong \mu_{ri} \end{bmatrix} \tag{3}$$

for $i = 1$ and 5, $$\bar{\bar{\varepsilon}}_i = \begin{bmatrix} \varepsilon_{xi} & 0 & 0 \\ 0 & \varepsilon_{yi} & 0 \\ 0 & 0 & \varepsilon_{zi} \end{bmatrix} = \begin{bmatrix} \frac{C_i}{\varepsilon_0 t_i} & 0 & 0 \\ 0 & \frac{C_i}{\varepsilon_0 t_i} & 0 \\ 0 & 0 & \cong \varepsilon_{ri} \end{bmatrix} \tag{4}$$

for $i = 2$ and 4, $$\bar{\bar{\mu}}_i = \begin{bmatrix} \mu_{xi} & 0 & 0 \\ 0 & \mu_{yi} & 0 \\ 0 & 0 & \mu_{zi} \end{bmatrix} = \begin{bmatrix} \cong \mu_{ri} & 0 & 0 \\ 0 & \cong \mu_{ri} & 0 \\ 0 & 0 & \frac{2\varepsilon_{avg}}{\varepsilon_{trans,i}} \end{bmatrix} \tag{5}$$

for $i = 2$ and 4, where, for all four layers, $\in_{ri}$ is typically between about 2 and about 10, and $\mu_{ri}$ is typically unity. For layers 202 and 204, the transverse relative permittivity $\in_{i,trans}=C_i/(\in_0 t_i)$ may be between about 100 and about 3000.

To calculate the existence of TM mode stopbands within the inhomogeneous PPW of FIG. 2, one may use the transverse resonance method (TRM). The TRM is a mathematical technique used to predict the complex propagation constant in the x direction, $k_x$, as a function of frequency. Each layer is modeled as an equivalent transmission line (TL), where the impedance along the line is the ratio of the transverse electric field $E_x$ to the transverse magnetic field $H_y$, assuming a TM mode and propagation in the x direction. Where the magneto-dielectric layers are assumed uniaxial, electromagnetic mode propagation in the y direction has the same properties as that of the x direction.

Figure 3:
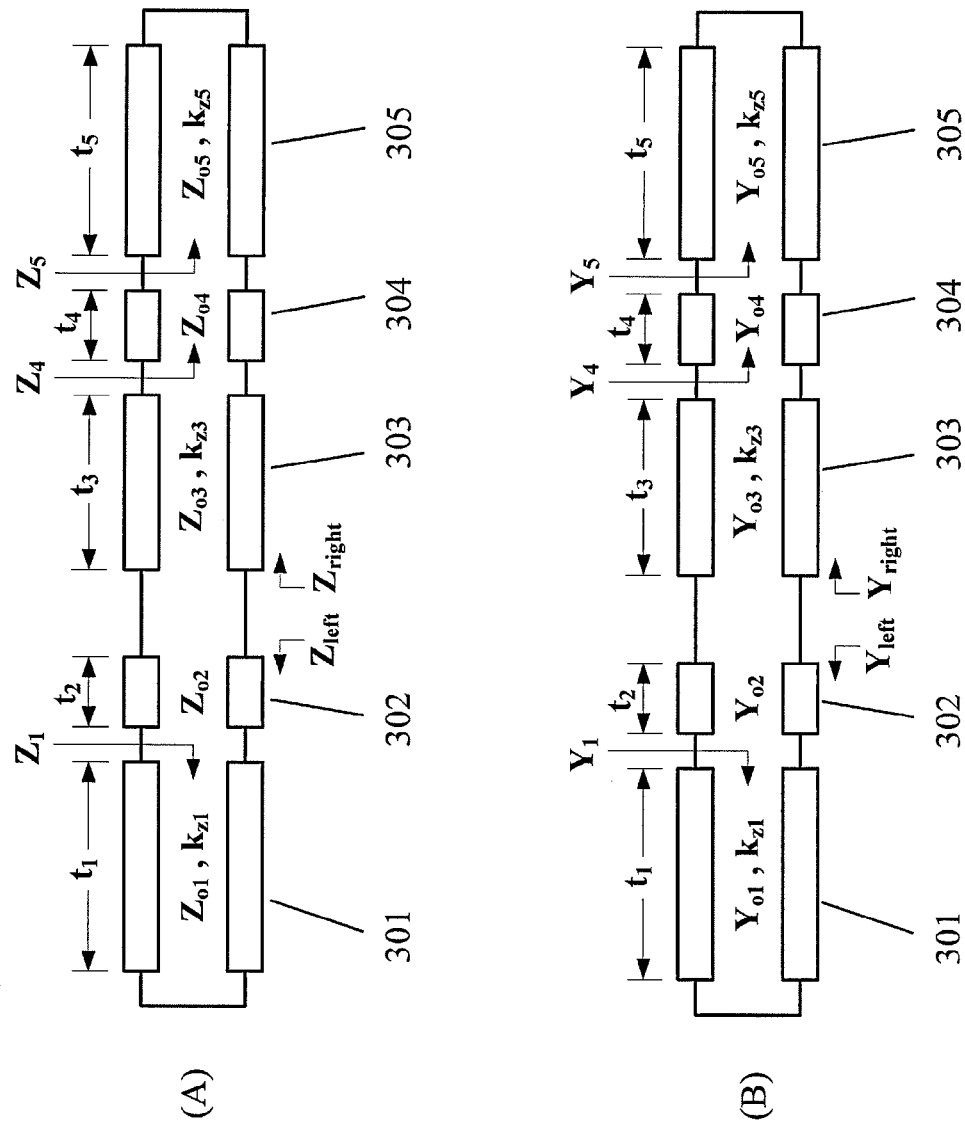
FIG. 3 is an equivalent circuit model using transmission lines to represent the effective medium layers shown in FIG. 2.

The equivalent transmission line (TL) model for the inhomogeneous PPW of FIG. 2 is shown in FIGS. 3(a) and 3(b). This equivalent circuit is comprised of five concatenated TLs, one for each layer shown in FIG. 2. Short circuits on both ends (left and right) represent the upper and lower conductors 207 and 209 respectively. Transmission lines 301, 302, 303, 304, and 305 are used to model transverse electric field $E_x$ and the transverse magnetic field $H_y$ in layers 201, 202, 203, 204, and 205, respectively. At any reference plane along the multi-section transmission line model, $E_x$ and $H_y$ are continuous. This also means that the impedance, being the ratio of $E_x/H_y$, is continuous. Continuity of the impedance leads directly to the fundamental transverse resonance relationship:

$$Z_{left}(\omega)+Z_{right}(\omega)=0. \quad (6)$$

The roots of the transverse resonance equation yield the modal propagation constant $k_x$ which may be real, imaginary, or complex. The transverse resonance equation may be applied at any reference plane along the multi-section TL and, for example, the transverse resonance plane may be the interface between TL 302 and TL 303, for mathematical convenience.

For TM-to-x modes, the impedance $E_x/H_y$ may be written as:

$$Z_{oi} = \frac{k_{zi}}{\omega \varepsilon_o \varepsilon_{xi}}, \text{ for } i = 1, 2, 3, 4 \text{ and } 5. \quad (7)$$

where $k_{zi}$ is the frequency dependent propagation constant in the normal or z direction:

$$k_{zi}(\omega, k_x) = \sqrt{\left(\frac{\omega}{c}\right)^2 \varepsilon_{xi}\mu_{yi} - k_x^2 \frac{\varepsilon_{xi}}{\varepsilon_{zi}}}, \text{ for } i = 1, 2, 4 \text{ and } 5. \quad (8)$$

For the isotropic dielectric layer 203, the z-directed propagation constant reduces to:

$$k_{z3}(\omega, k_x) = \sqrt{\left(\frac{\omega}{c}\right)^2 \varepsilon_{x3} - k_x^2}. \quad (9)$$

From equations (7) through (9) the TM mode impedances $Z_{left}(\omega)$ and $Z_{right}(\omega)$ are:

$$Z_{left}(\omega) = Z_{o2} \frac{Z_1 \cos(k_{z2}t_2) + jZ_{o2}\sin(k_{z2}t_2)}{Z_{o2}\cos(k_{z2}t_2) + jZ_1 \sin(k_{z2}t_2)} \quad (10)$$

where $$Z_1(\omega) = jZ_{o1}\tan(k_{z1}t_1) \quad (11)$$

and $$Z_{right}(\omega) = Z_{o3} \frac{Z_4 \cos(k_{z3}t_3) + jZ_{o3}\sin(k_{z3}t_3)}{Z_{o3}\cos(k_{z3}t_3) + jZ_4 \sin(k_{z3}t_3)} \quad (12)$$

where $$Z_4(\omega) = Z_{o4} \frac{Z_5 \cos(k_{z4}t_4) + jZ_{o4}\sin(k_{z4}t_4)}{Z_{o4}\cos(k_{z4}t_4) + jZ_5 \sin(k_{z4}t_4)} \quad (13)$$

$$Z_5(\omega) = jZ_{o5}\tan(k_{z5}t_5). \quad (14)$$

To predict the existence of TE modes within the inhomogeneous PPW of FIG. 2, one may also use the TRM. FIG. 3(b) shows the same transmission line equivalent circuit as FIG. 3(a) but where the impedances are expressed as admittances. For TE-to-x modes, the admittance $H_x/E_y$ may be written as:

$$Y_{oi} = \frac{k_{zi}}{\omega \mu_o \mu_{xi}} \text{ for } i = 1, 2, 3, 4 \text{ and } 5. \quad (15)$$

For TE waves, the z-directed propagation constants are:

$$k_{zi}(\omega, k_x) = \sqrt{\left(\frac{\omega}{c}\right)^2 \varepsilon_{yi}\mu_{xi} - k_x^2 \frac{\mu_{xi}}{\mu_{zi}}} \text{ for } i = 1, 2, 4 \text{ and } 5. \quad (16)$$

$$\text{and } k_{z3}(\omega, k_x) = \sqrt{\left(\frac{\omega}{c}\right)^2 \varepsilon_{y3} - k_x^2} \text{ for } i = 3. \quad (17)$$

The transverse resonance equation may equivalently be expressed using admittances as:

$$Y_{left}(\omega)+Y_{right}(\omega)=0. \quad (18)$$

From equations (15) through (17) one may calculate the TE mode admittances $Y_{left}(\omega)$ and $Y_{right}(\omega)$:

$$Y_{left}(\omega) = Y_{o2} \frac{Y_1 \cos(k_{z2}t_2) + jY_{o2}\sin(k_{z2}t_2)}{Y_{o2}\cos(k_{z2}t_2) + jY_1 \sin(k_{z2}t_2)} \quad (19)$$

where $$Y_1(\omega) = -jY_{o1}\cot(k_{z1}t_1) \quad (20)$$

and $$Y_{right}(\omega) = Y_{o3} \frac{Y_4 \cos(k_{z3}t_3) + jY_{o3}\sin(k_{z3}t_3)}{Y_{o3}\cos(k_{z3}t_3) + jY_4 \sin(k_{z3}t_3)} \quad (21)$$

where $$Y_4(\omega) = Y_{o4} \frac{Y_5 \cos(k_{z4}t_4) + jY_{o4}\sin(k_{z4}t_4)}{Y_{o4}\cos(k_{z4}t_4) + jY_5 \sin(k_{z4}t_4)} \quad (22)$$

$$Y_5(\omega) = -jY_{o5}\cot(k_{z5}t_5) \quad (23)$$

An EBG Structure after FIG. 2 with Overlay Capacitors

Figure 4:
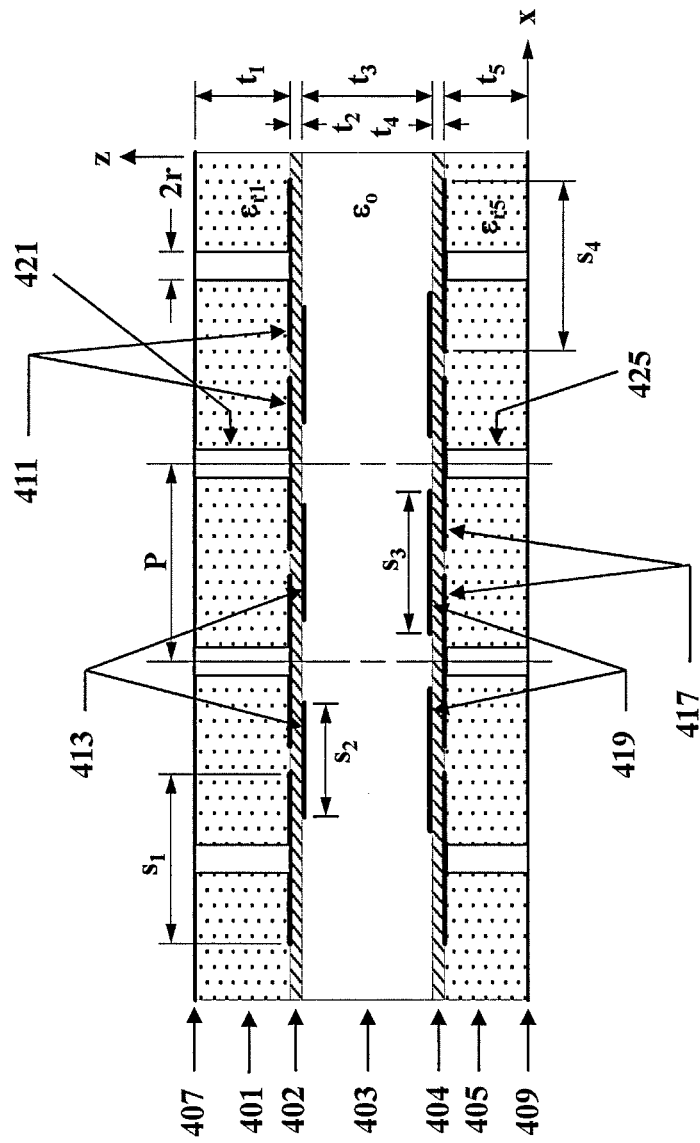
FIG. 4 illustrates an example as an EBG structure with overlay capacitors.

To illustrate the use of the effective media model shown in FIG. 2, an example is analyzed by comparing a full-wave analysis to the TRM using the effective media model for the EBG structure of FIG. 4. This is an inhomogeneous PPW containing upper and lower conducting planes 407 and 409, respectively. The periodic structures contained therein have a square lattice of period P. The square lattice is not a limitation, as other lattices, such as triangular, hexagonal, or rectangular, may be used. This example has a rodded medium in dielectric layers 401 and 405 which represents a periodic array of conductive vias 421 that connect the upper conducting plane 407 to upper conductive patches 411 located at the interface between layers 401 and 402, and vias 425 that extend from the lower conducting plane 409 to lower conductive patches 417 located at the interface between layers 404 and 405. These two rodded mediums in host dielectric layers 401 and 405 have a negative z-axis permittivity in the fundamental stopband, which will be described in greater detail below. The relatively thin dielectric layer 402, the upper conductive patches 411, and the upper conductive overlay patches 413 may be selected to exhibit a high effective transverse permittivity, which may be much greater than unity, for layer 202 in the effective media model. Similarly, dielectric layer 404, the lower conductive patches 417, and the lower conductive overlay patches 419 may be selected to exhibit a high relative transverse permittivity, also much greater than unity, for layer 204 in the effective media model. In this example, there is an air gap 403 between dielectric layers 402 and 404. Thicknesses of the five dielectric layers 401 through 405 are correspondingly denoted as $t_1$ through $t_5$. The relative dielectric constant of the host dielectric media for layers 401 through 405 is denoted as $\in_{r1}$ through $\in_{r5}$, where $\in_{r3}=1$ for the air gap.

In FIG. 4 the patches are square in shape, although any polygonal shape may be used. Patches 411 and 417 may be centered on the vias, while patches 413 and 419 may be centered on the gaps between the vias. Vias 421 and 425 are conducting rods, and they may be uniform circular cylinders of radius r as in this example. However, any cross sectional shape of via may be used and the cross sections may differ, for example, between upper and lower rodded mediums. The conductive vias may, for example, be fabricated as shells that are filled with a conductor or insulator, to achieve a hermetic seal for the package, but such filling is not necessary to obtain an electromagnetic bandgap EBG. The vias 421 and 425 may have a central axis which is aligned between dielectric layer 401 and dielectric layer 405, however, this is not a limitation as the vias may be offset by any distance and the effective media model will be unchanged. In general, vias 421 and associated patches 411 and 413 may have a different period than the vias 425 and associated patches 417 and 419. However, in the example of FIG. 4 the EBG structure has only one period associated with its square lattice.

Vias 421 and 425 are illustrated as blind vias that terminate on patches closest to the conducting planes 407 and 409. Alternatively, these vias may be through vias. Alternatively, these vias may connect to the overlay patches 413 and 419, in which case the vias would not be electrically connected to patches 411 and 417. The transverse relative permittivity $\epsilon_{t,trans} = C_i/(\epsilon_0 t_i)$ for layers 202 and 204 may remain unchanged under these conditions.

Figure 5:
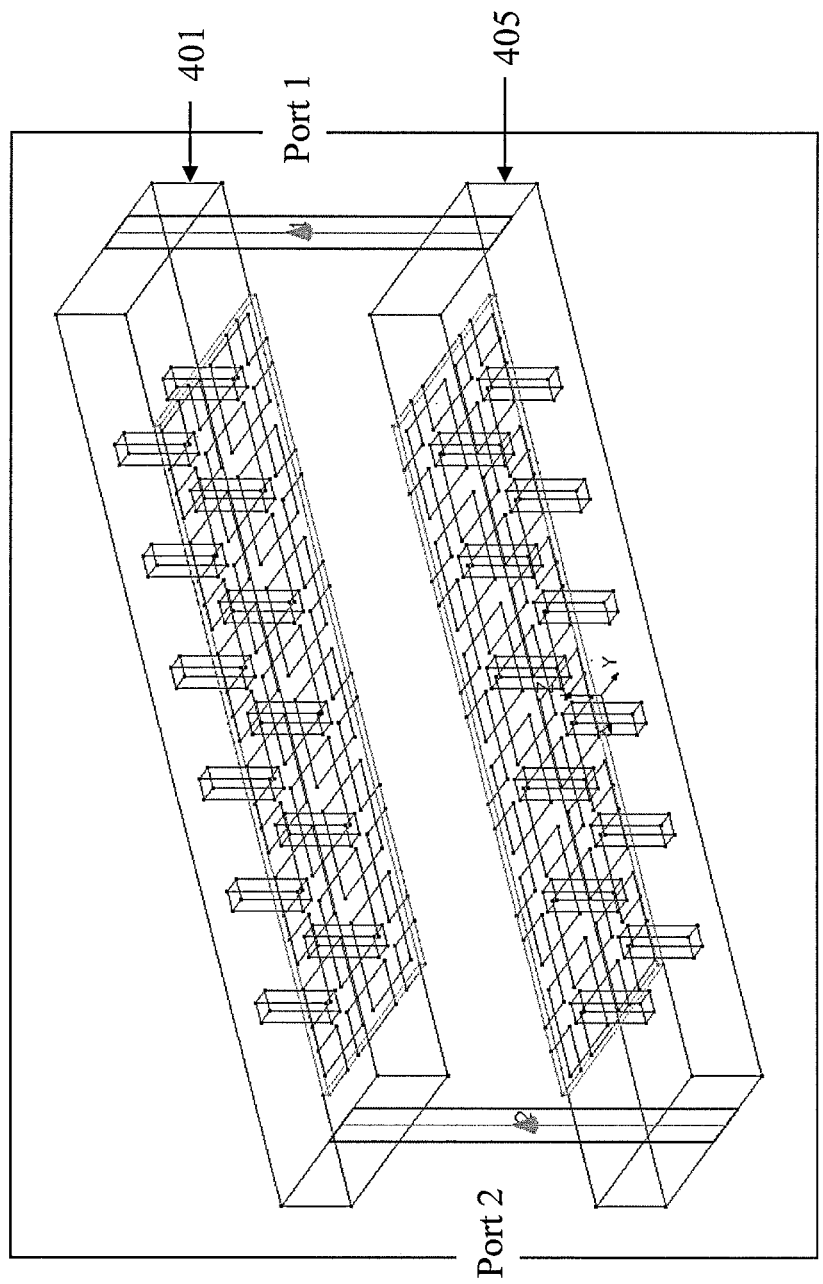
FIG. 5 shows a three-dimensional (3D) wire frame model used in a full-wave electromagnetic simulation of the EBG structure of FIG. 4.

This example of an EBG structure has been simulated using MICROSTRIPES, a three dimensional (3D) electromagnetic simulator licensed from CST in Framingham, Mass. A wire frame view of the solid model used is illustrated in FIG. 5. This 3D model has TM mode waveguide ports on each end for power transmission calculations. The electric field of the TM mode is vertically polarized (z direction) as indicated by the arrowheads at each port. Between the ports lie a series of six unit cells of the EBG structure. In this 3D model, thicknesses and dielectric constants are selected to be typical of an LTCC (Low Temperature Co-fired Ceramic) package design. Specifically: P=500 um with a square lattice, $s_1=s_2=s_3=s_4=390$ um, $t_1=t_5=300$ um, $t_2=t_4=25$ um, $t_3=1000$ um, $\epsilon_{r1}=\epsilon_{r5}=6$, and $\epsilon_{r2}=\epsilon_{r4}=10$. The modeled vias are 90 um square which approximates the cross sectional area of a circular 100 um diameter via. All of the layers are non-magnetic, so $\mu_{ri}=1$ for i=1, 2, 4, and 5.

Figure 6:
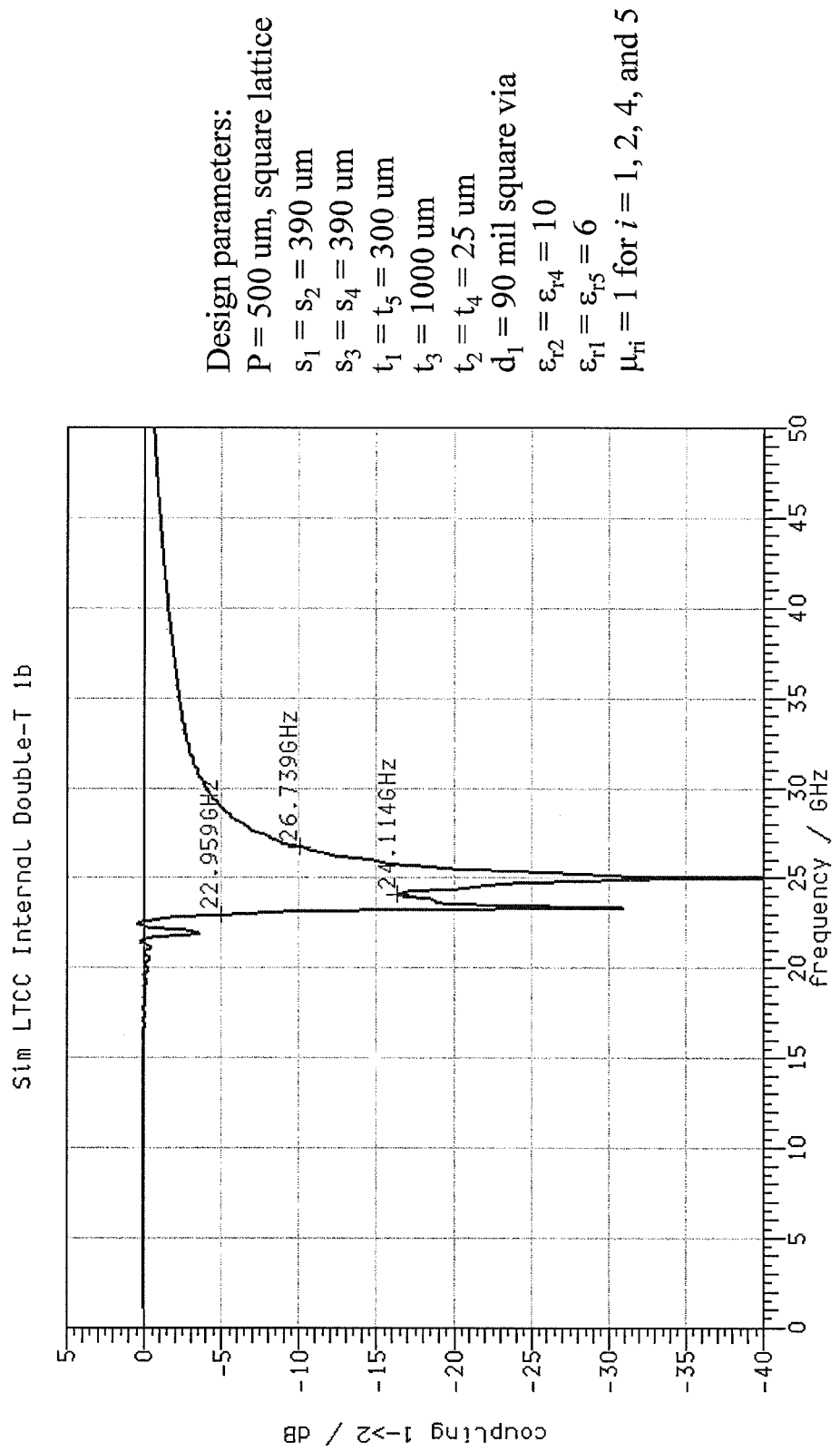
FIG. 6 shows the full-wave transmission response S21 for the finite length EBG structure of FIG. 5.

The transmission response from the MICROSTRIPES simulation of FIG. 5 is shown in FIG. 6. This transmission plot shows a fundamental stopband beginning near 23 GHz and extending at least beyond 27 GHz. In this example, the design parameters were selected to place the stopband to include the 24 GHz US ISM (Industrial, Scientific, Medical) band of 24.0 GHz to 24.250 GHz.

The rodded media of dielectric layers 401 and 405 may be modeled, for example, with formulas given by Clavijo, Diaz, and McKinzie in "Design Methodology for Sievenpiper High-Impedance Surfaces: An Artificial Magnetic Conductor for Positive Gain Electrically-Small Antennas," IEEE Trans. Microwave Theory and Techniques, Vol. 51, No. 10, October 2003, pp. 2678-2690, which is incorporated herein by reference. The permeability tensors for magneto-dielectric layers 201 and 205 may be written as:

$$\bar{\bar{\mu}}_1 = \bar{\bar{\mu}}_5 = \begin{bmatrix} \mu_{x1} & 0 & 0 \\ 0 & \mu_{y1} & 0 \\ 0 & 0 & \mu_{z1} \end{bmatrix} = \begin{bmatrix} \mu_{r1}\frac{(1-\alpha)}{(1+\alpha)} & 0 & 0 \\ 0 & \mu_{r1}\frac{(1-\alpha)}{(1+\alpha)} & 0 \\ 0 & 0 & \mu_{r1}(1-\alpha) \end{bmatrix}, \quad (24)$$

where the parameter $\alpha$ is the ratio of via cross sectional area to the unit cell area A: and $$\alpha = \frac{\pi r^2}{A} = \frac{\pi r^2}{P^2} \quad (25)$$

The parameter $\alpha$ is typically much less than unity making the main diagonal elements in (24) slightly diamagnetic for the case of a non-magnetic host dielectric:

$$\mu_{r1} = \mu_{r5} = 1.$$

Figure 7:
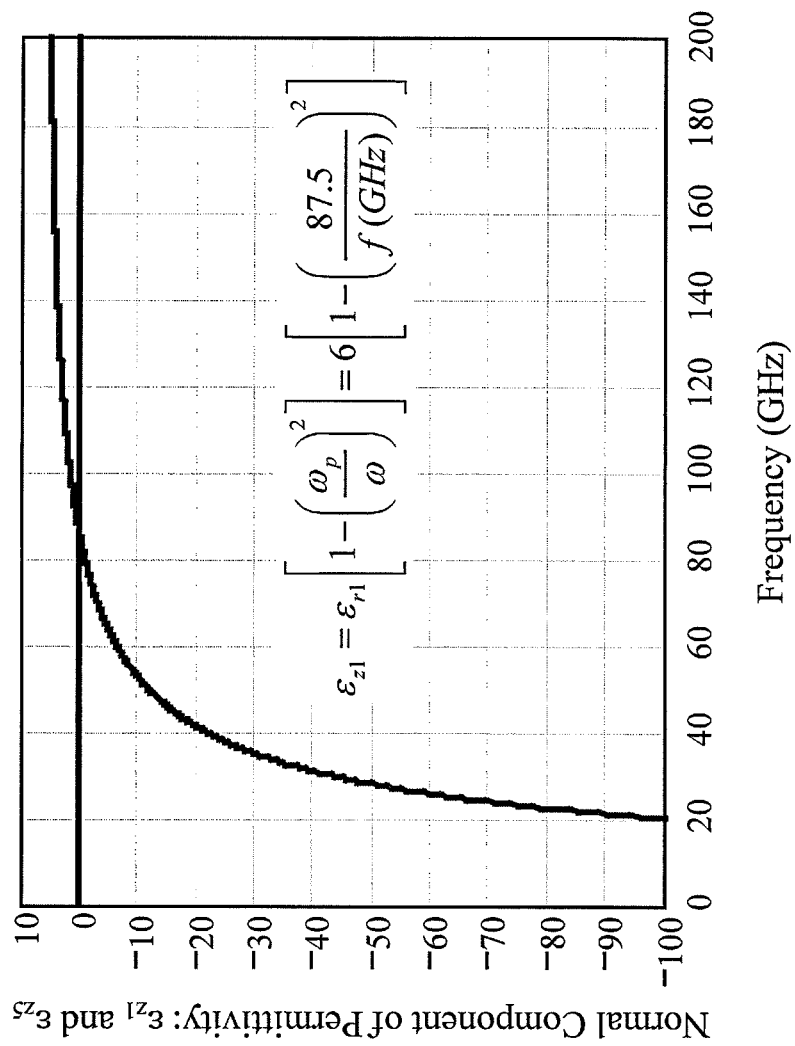
FIG. 7 shows the normal direction permittivity function for magneto-dielectric layers 201 and 205 in the effective medium model of FIG. 2.

The permittivity tensor for magneto-dielectric layers 201 and 205 may be written as:

$$\bar{\bar{\epsilon}}_1 = \bar{\bar{\epsilon}}_5 = \begin{bmatrix} \epsilon_{x1} & 0 & 0 \\ 0 & \epsilon_{y1} & 0 \\ 0 & 0 & \epsilon_{z1} \end{bmatrix} = \quad (26)$$

$$\begin{bmatrix} \epsilon_{r1}\frac{(1+\alpha)}{(1-\alpha)} & 0 & 0 \\ 0 & \epsilon_{r1}\frac{(1+\alpha)}{(1-\alpha)} & 0 \\ 0 & 0 & \epsilon_{r1}\left[1 - \left(\frac{\omega_p}{\omega}\right)^2\right] \end{bmatrix},$$

where the plasma frequency of the rodded media may be expressed as:

$$\omega_p^2 = \frac{1}{\frac{\mu_{r1}\epsilon_{r1}A}{4\pi c^2}\left(\ln\left(\frac{1}{\alpha}\right) + \alpha - 1\right)}, \quad (27)$$

and c is the speed of light in a vacuum. Using the design parameters for the MICROSTRIPES model of FIGS. 5 and 6, $\alpha = 0.031$ which is much less than unity, the plasma frequency $\omega_p$ is 87.5 GHz. A plot of the normal (z-axis) component of permittivity for the rodded media is shown in FIG. 7. The normal permittivities $\epsilon_{z1}$ and $\epsilon_{z5}$ are negative over the frequency range associated with the fundamental stopband: about 23 GHz to about 30 GHz.

The permittivity and permeability tensors for the magneto-dielectric layers 202 and 204 are given above in equations (4) and (5). To calculate the effective capacitance $C_i$ one may use the parallel-plate capacitor formula to obtain a lower bound:

$$C_i = \frac{\epsilon_0 \epsilon_{ri}\left(\frac{s_i - g}{2}\right)}{t_i} \text{ for } i = 2 \text{ and } 4. \quad (28)$$

Here, for simplicity, the square patches on opposite sides of dielectric layer 402 are assumed to be the same size ($s_1=s_2$), and the same assumption holds for dielectric layer 404 ($s_3=s_4$). However, this is not intended to be a limitation.

Figure 8:
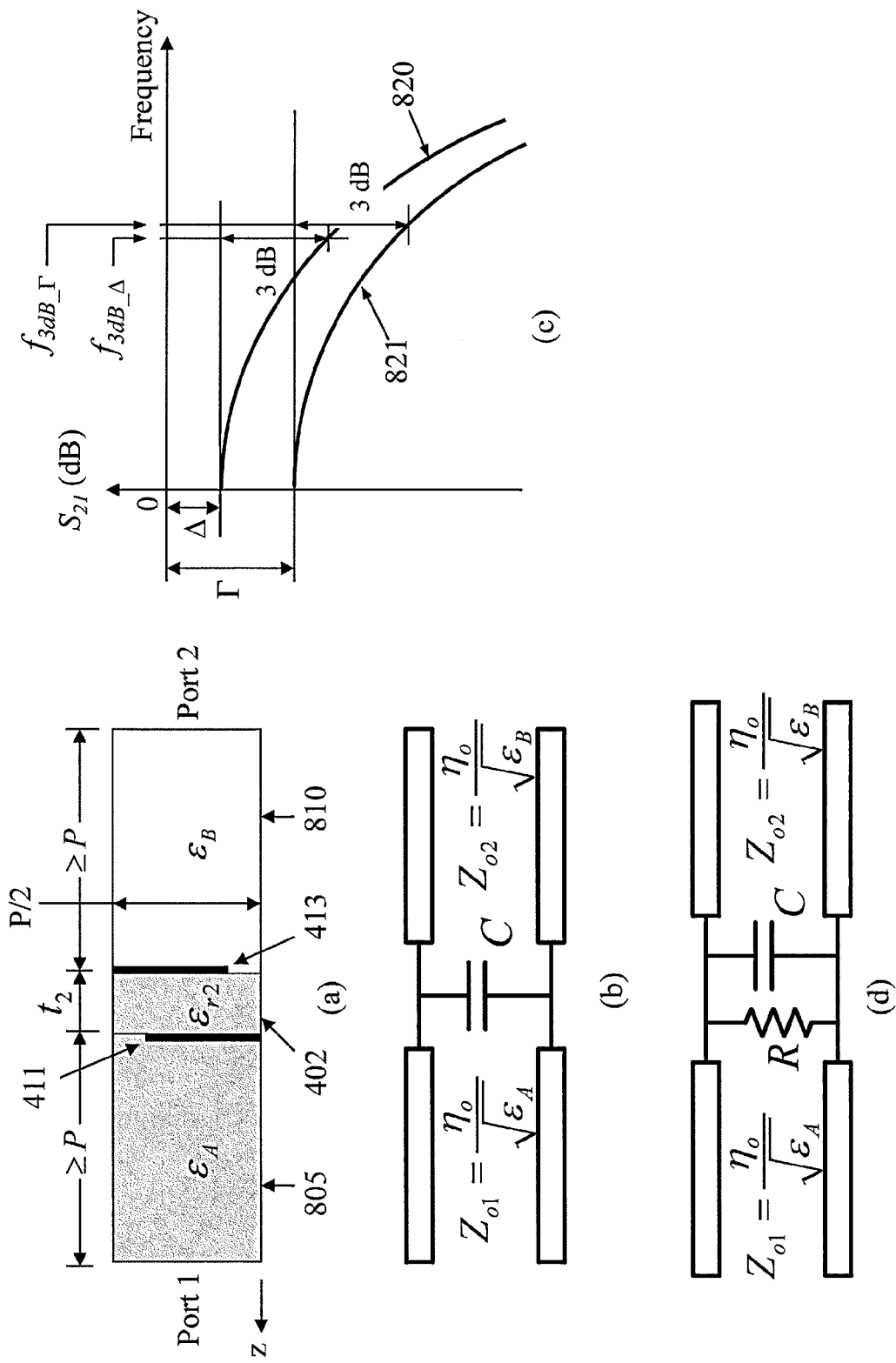
FIG. 8 illustrates a method for calculation of the effective sheet capacitance and effective sheet resistance for a periodic array of isolated conducting obstacles embedded in a host dielectric media: (a) waveguide model for a full-wave simulation; (b) equivalent transmission line model assuming no losses; (c) the resulting transmission response in dB vs. frequency, and (d) equivalent transmission line model assuming resistive loss.

The parallel-plate formula may be suitable for cases where the dielectric layer thickness $t_i$ is much less than the gap g between patches. However, when the dielectric layer thickness of layers 402 and 404 are comparable to the gap dimensions, the fringe capacitance between edges may become significant. For the geometry of FIG. 4, and more the complex geometries of subsequent examples, the effective capacitance C may be calculated from $S_{21}$ transmission curves using the procedure shown in FIG. 8. A full-wave electromagnetic simulator is used to model one quarter of a unit cell area of layer 402 as a shunt obstacle in a TEM (transverse electromagnetic) mode waveguide. This is shown in FIG. 8(a) where a port 1 terminates a first dielectric-filled TEM mode waveguide (WG) 805 containing a relative dielectric constant of $\in_A = \in_{r1}$, and port 2 terminates a second dielectric-filled TEM mode WG 810 containing a relative dielectric constant of $\in_B = 1$. Waveguides 805 and 810 are on opposite sides of the dielectric layer 402. Conductive patches 411 and 413 may also be modeled as a physical component to determine the actual capacitance. The ports on each end are placed at least one period away from dielectric layer 402 to allow sufficient distance for higher order non-TEM modes to decay. In this example, the WG cross section is square since the unit cell has a square footprint and the two planes of symmetry inside each unit cell allow reduction of the solid model to only one fourth of the area of the unit cell. FIG. 8(b) shows the equivalent transmission line model for the TEM mode. The desired capacitance is a shunt load placed at the junction between two transmission lines of potentially dissimilar characteristic impedance, where $\eta_0$ is the wave impedance of free space: 377Ω. The full wave simulation of FIG. 8(a) may have a transmission response 820 shown generically in FIG. 8(c). Curve 820 gives the zero frequency limit of the transmission loss, Δ, as well as the frequency $f_{3dB\_\Delta}$ at which its transmission response has fallen by 3 dB from its zero frequency limit. As a check on the simulation results, the zero frequency limit of transmission loss may be determined analytically using the relative dielectric constants of the waveguides for each port:

$$\Delta = 20\log\left(\frac{\sqrt[4]{\frac{\varepsilon_A}{\varepsilon_B}} + \sqrt[4]{\frac{\varepsilon_B}{\varepsilon_A}}}{2}\right) dB. \quad (29)$$

Finally, the desired shunt capacitance for the lossless FSS may be calculated from:

$$C = \frac{\sqrt{\varepsilon_{rA}} + \sqrt{\varepsilon_{rB}}}{2\pi f_{3dB\_\Delta}\eta_o} \text{(Farads/sq.)} \quad (30a)$$

For the example shown in FIGS. 5 and 6, Δ=0.844 dB and C=0.109 pF per square. The assumption that a shunt capacitance models the magneto-dielectric layers 202 and 204 is valid when these layers are electrically thin at the frequency of interest, meaning $$\frac{\omega}{c}\sqrt{\varepsilon_{ri}}\, t_i \square\, 1 \text{ for } i = 2 \text{ and } 4.$$

The procedure described in FIG. 8 may be used to calculate the effective capacitance of any arbitrarily-shaped obstacle or arbitrary inclusion assuming the unit cell has a square footprint where the period is the same in the x and y directions. In general, the periodic array of these arbitrarily-shaped obstacles may be modeled as magneto-dielectric layers 202 or 204.

If a resistive loss mechanism, such as a resistive film coplanar with patches 411 or 413 of FIG. 8, is incorporated into the periodic capacitive FSS, then the equivalent circuit model of FIG. 8(d) is appropriate to model TEM mode transmission. The full-wave transmission simulation for this case yields the transmission curve 821 shown in FIG. 8(c). Due to the addition of the resistive loss mechanism, the zero frequency limit of the resulting transmission loss 821 has increased to a higher value: Γ. Note that Δ and Γ are both positive values in dB since they represent transmission loss or insertion loss. The effective sheet resistance used to model the lossy FSS can be calculated from the following formula:

$$R = \frac{\eta_o}{\left[10^{\left(\frac{\Gamma-\Delta}{20}\right)} - 1\right]\left(\sqrt{\varepsilon_A} + \sqrt{\varepsilon_B}\right)} \text{(Ohms/sq.)} \quad (30b)$$

where Γ is the low frequency limit of the transmission loss (in dB) when the resistive film is included, and Δ is the low frequency limit of the transmission loss (in dB) when the resistive film is omitted. Δ may be calculated from equation (29) without performing a full-wave simulation. Although a full-wave simulation may be needed to evaluate Γ, equation (30b) is valid for any arbitrary geometry of lossy FSS unit cell as long as it is periodic with a square lattice. As a simple example, assume that $\in_A=6$ and $\in_B=1$ such that Δ=0.844 dB. When a resistive loss is added assume the zero frequency transmission loss changes to Γ=2.561 dB. Equation (30b) may then be used to calculate an effective sheet resistance for the unit cell of 500 Ω/sq.

For some examples of lossy FSS structures, as will be shown below in FIGS. 47 and 48, the effective sheet capacitance is a function of the resistive film size and location. The addition of a resistive film may actually increase the effective sheet capacitance. However, even in these more complex lossy FSS structures, one can use a full-wave simulation of the normal incidence transmission response to calculate the effective sheet capacitance C by using the formula $$C = \frac{\sqrt{\varepsilon_A} + \sqrt{\varepsilon_B}}{2\pi f_{3dB\_\Delta}\eta_o} \text{(Farads/sq.)} \quad (30c)$$

where $f_{3dB\_\Gamma}$ is the frequency at which the value of transmission response 821 has fallen by 3 dB relative to its zero frequency limit of Γ. Note that $f_{3dB\_\Gamma}$ is a different frequency from $f_{3dB\_\Delta}$ because of the nonzero value of the effective sheet resistance R.

Using the calculated effective capacitance of 0.109 pF/sq. for both layers 402 and 404 in the example yields the transverse permittivity of $\in_{xi}=\in_{yi}=C_i/(\in_0 t_i)=494$ for magneto-dielectric layers 202 and 204. In the example of FIG. 4, $\in_{avg}=\in_{ri}=10$, which allows the normal permeability to be calculated as $$\mu_{zi} = 2\frac{\varepsilon_{avg}}{\varepsilon_{trans,i}} = 2\frac{10}{494} = .0405$$

for magneto-dielectric layers 202 and 204. This completes the mapping of the physical example of FIG. 4 into the effective media model of FIG. 2.

Figure 9:
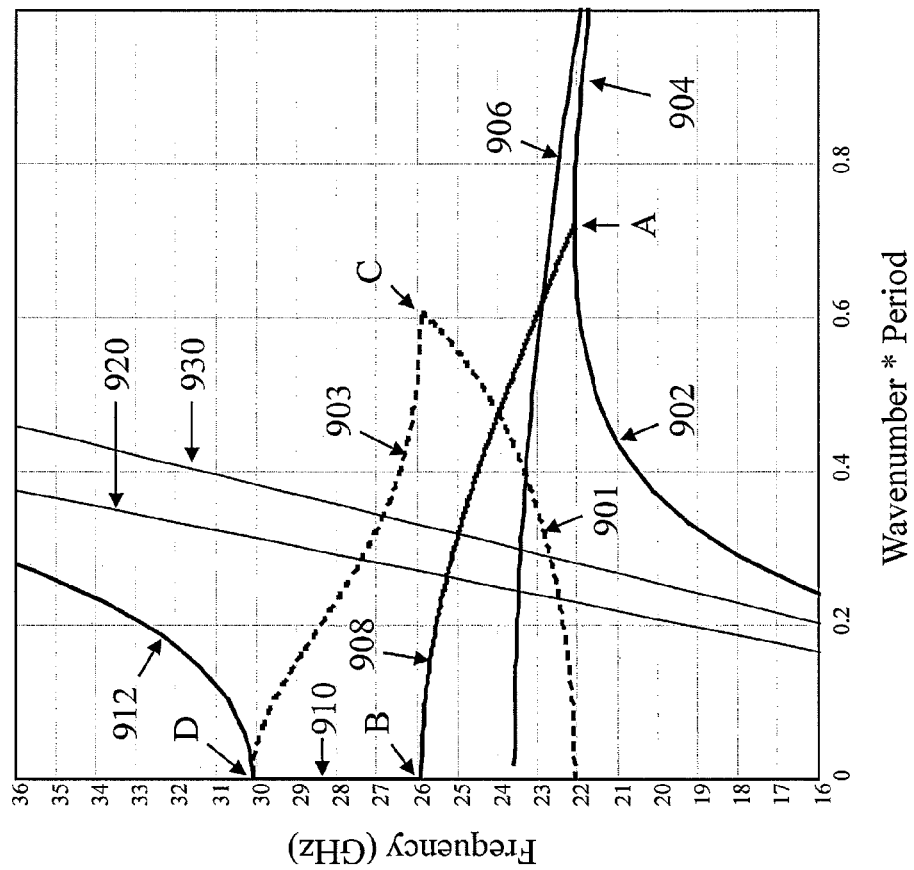
FIG. 9 is a TM mode dispersion diagram based on the effective medium model for the example of FIG. 4.

Application of the TRM to FIG. 2 allows evaluation the TM mode propagation constant, $k_x$. Equation (6) may be solved numerically for real and complex roots $k_x$, as a function of frequency. The numerical root finding was performed with Mathcad 14 licensed from Parametric Technology Corporation, but other general purpose software such as Matlab and Mathematica may be used for this purpose. The real and imaginary components of $k_x$ are plotted in the dispersion diagram of FIG. 9. The parameters for FIG. 9 are those assumed ($\epsilon_{r1}=\epsilon_{r5}=6$, $\epsilon_{r2}=\epsilon_{r4}=10$, $t_1=t_5=300$ um, $t_2=t_4=25$ um, $t_3=1000$ um) and calculated for the above example ($\omega_p=87.5$ GHz, $\alpha=0.031$, $\epsilon_{x2}=\epsilon_{x4}=494$, $\mu_{y1}=\mu_{y5}=0.940$, and $\mu_{y2}=\mu_{y4}=1$). The abscissa is the product of wavenumber $k_x$ and the period P. This normalizes the abscissa to the range of zero to $\pi$ for the irreducible Brillouin zone, since the Brillouin zone boundary is $\pi/P$.

In FIG. 9, the real part of the propagation constant $k_x$ is shown as a solid dark line. The imaginary part of $k_x$ is the attenuation constant, and is displayed as a dashed dark line. The line 920 is the free-space light line based on the speed of light in a vacuum. The line 930 is the light line based on the effective dielectric constant of the inhomogeneous PPW if all of the interior conductors were removed:

$$\varepsilon_{eff} = \frac{t_1+t_2+t_3+t_4+t_5}{\frac{t_1}{\varepsilon_{r1}}+\frac{t_2}{\varepsilon_{r2}}+\frac{t_3}{1}+\frac{t_4}{\varepsilon_{r4}}+\frac{t_5}{\varepsilon_{r5}}} \cong 1.49. \qquad (31)$$

At low frequencies, below about 20 GHz, only one TM mode exists, labeled as 902, and it is asymptotic to the light line 930. Forward propagating modes are characterized by $k_x$ curves of positive slope. Conversely, backward propagating modes are characterized by $k_x$ curves of negative slope. Slow waves (phase velocity relative to the speed of light c) are plotted below the light line 920 while fast waves are plotted above line 920. The group velocity of a given mode is proportional to the slope of its dispersion curve, varying over the range of zero to c. Hence, the dominant mode is a slow forward wave that cuts off near 22 GHz where its group velocity (and slope) goes to zero at point A. There is a backward TM mode (curve 904) that is possible between about 15 GHz and 22 GHz. There is another distinct backward TM mode (curve 906) that is asymptotic to curve 904 at high wavenumbers, and it is cut off above approximately 23.6 GHz. There exists a forward fast wave (curve 912) whose low frequency cutoff is near 30 GHz. This fast TM mode is asymptotic to the light line 920 at high frequency.

Between 22 GHz and 30 GHz, the effective medium model predicts the existence of a backward wave complex mode and a purely evanescent mode. The complex mode has a real part 908 that extends from point A to point B. It has a corresponding imaginary part 901. This represents a backward propagating TM mode that attenuates as it travels. The evanescent TM mode exists from about 26 GHz to about 30 GHz and the real part is zero, bounded between endpoints B and D. The imaginary part of this evanescent mode is non-zero and has endpoints C and D. The effective medium model predicts an apparent stopband from near 22 GHz to near 30 GHz. It is an apparent stopband because the complex mode (908, 901) does exist in this frequency band, but the mode is attenuating as it travels. Furthermore, the backward TM mode 906 is also possible above 22 GHz, but its group velocity (and slope) is so low that it will be difficult to excite by coupling from another mode. The only other mode possible to couple with it over this frequency range is the complex mode that already has a significant attenuation constant. The frequency most likely for coupling between these two modes is that frequency where curves 906 and 908 intersect, which in this example is near 23 GHz.

A comparison of the full-wave transmission response in FIG. 6 for the finite EBG structure to the dispersion diagram of FIG. 9 shows substantial agreement. The transmission response shows an apparent stopband beginning near 23 GHz as compared to 22 GHz in the effective medium model. The transmission response shows a peak at about 24 GHz, which may be due to a backward wave mode. Note the intersection of backward wave modes shown as curves 906 and 908 in the effective medium model occurs near 23 GHz. The difference between these two frequencies within each model is consistent at about 1 GHz. Furthermore, the frequency of greatest stopband attenuation is near 25 GHz in the transmission response and near 26 GHz in the effective medium model. This is a frequency difference between models of about 1 GHz or 4%.

As another comparison, the peak attenuation predicted by the effective medium model is $\text{lm}\{k_x\}P=0.61$ which yields an attenuation of about 5.3 dB per unit cell. As there are 5 complete unit cells (between centers of vias) in the finite structure, the peak attenuation should be on the order of 26.5 dB plus mismatch loss. FIG. 6 shows the peak attenuation to be on the order of 40 dB which is reasonable given the anticipated impedance mismatch between the port impedance of the full-wave model and the Bloch-mode impedance of the EBG structure. The only feature that is not in clear agreement in both the effective medium model and the full-wave simulation is the upper band edge. The effective medium model predicts a distinct band edge to the stopband near 30 GHz while the transmission response for the finite EBG structure shows a soft transition near this frequency.

The effective medium model thus provides some physical insight into the nature of the possible TM modes, and may be computationally much faster to run compared to a full-wave simulation.

The structures and methods described herein may also be used as a slow-wave structure to control the phase velocity and the group velocity of the dominant PPW mode. Consider curve 902 in FIG. 9. The value of $\omega/k_x$ on any curve in the dispersion diagram is the phase velocity for that mode propagating in the x direction. For any point on curve 902, this value is less than the speed of light, and the speed may be controlled by adjusting the slope of curve 930 (using the effective dielectric constant) and by adjusting the cutoff frequency (point A). The slow wave factor, $k_x/k_0$, for the dominant TM mode (quasi-TEM mode, or curve 902) is greater than unity for any of the inhomogeneous PPW examples described herein. Applications of these concepts may also include delay lines, microwave lenses, and antenna beamformers, such as Rotman lenses or Luneberg lenses.

An EBG Structure after FIG. 2 with Single Layer Patches

Figure 10:
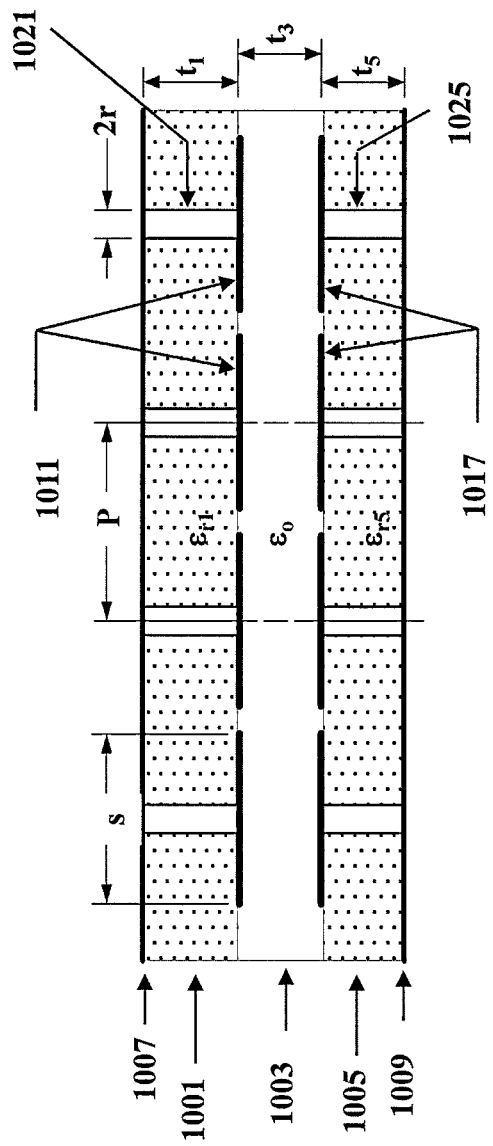
FIG. 10 shows an example after FIG. 2 as an EBG structure with single layer patches.

Another example is shown in FIG. 10. It is similar to the example of FIG. 4, but it has fewer dielectric layers and patches. However, this example may also be modeled using the effective medium layers shown in FIG. 2.

This example of FIG. 10 is an inhomogeneous PPW containing upper and lower conducting planes 1007 and 1009 respectively. The periodic structure contained within has a square lattice of period P; there is an air gap 1003 between dielectric layers 1001 and 1005; thicknesses of the three dielectric layers 1001, 1003, and 1005 are denoted as $t_1$, $t_3$, and $t_5$, respectively, and the relative dielectric constants of these layers are denoted as $\epsilon_{r1}$, and $\epsilon_{r5}$, respectively.

This example contains a rodded medium in dielectric layers 1001 and 1005 which is a periodic array of conductive vias 1021 that extend from the upper conducting plane 1007 to a single layer of upper conductive patches 1011 located at the interface between layers 1001 and 1003, and an array of conductive vias 1025 that connect the lower conducting plane 1009 to a single layer of lower conductive patches 1017 located at the interface between layers 1003 and 1005. These two rodded mediums in host dielectric layers 1001 and 1005 may have a negative z-axis permittivity in the fundamental stopband, as previously described.

The upper conducting vias 1021 connect to a coplanar array of conducting patches 1011. The patches may be, for example, square and form a closely spaced periodic array designed to achieve an effective capacitance estimated as:

$$C_2 = \varepsilon_0 \varepsilon_{avg} \frac{2P}{\pi} \ln\left(\frac{2P}{\pi g}\right), \tag{32}$$

where $\epsilon_{avg} = (1+\epsilon_{r1})/2$ and $g=P-s$ is the gap between patches. The thickness $t_2$ for the effective medium layer 202 may be selected to be arbitrarily small, and the transverse permittivity for this layer may be expressed as:

$$\varepsilon_{x2} = \varepsilon_{y2} = \frac{C_2}{\varepsilon_0 t_2} = \varepsilon_{avg} \frac{2P}{\pi t_2} \ln\left(\frac{2P}{\pi g}\right). \tag{33}$$

The effective capacitance $C_2$ will be lower for the single layer of patches used in FIG. 10 when compared to the two layers of overlapping patches shown in FIG. 4. For the same parameters used in the above example, where P=500 um, s=390 um, $\epsilon_{r1}$=6, then $C_2$ is 0.01048 pF/sq. The z-axis permittivity $\epsilon_{z2}$ for layer 202 may be set to unity.

Evaluation of the effective capacitance $C_4$ and the transverse permittivity $\epsilon_{x4}=\epsilon_{y4}$ of the effective media layer 204 may, for the lower array of patches 1017, be accomplished by using equations (32) and (33) with only a change of subscripts. The upper rodded media need not have the same period, thickness, via diameter, patch size, shape or host dielectric constant as the lower rodded media. That is, each may be designed independently.

The upper and lower conductive patches 1011 and 1017 may be positioned as shown in FIG. 10 to be opposing one another. In this orientation, there will be some parallel-plate capacitance between opposing patches. However, herein, it is predominantly the fringe capacitance between adjacent coplanar patches that is enhanced. The objective is to provide a relative transverse permittivity for effective media model layers 202 and 204 that is much greater than unity.

Figure 11:
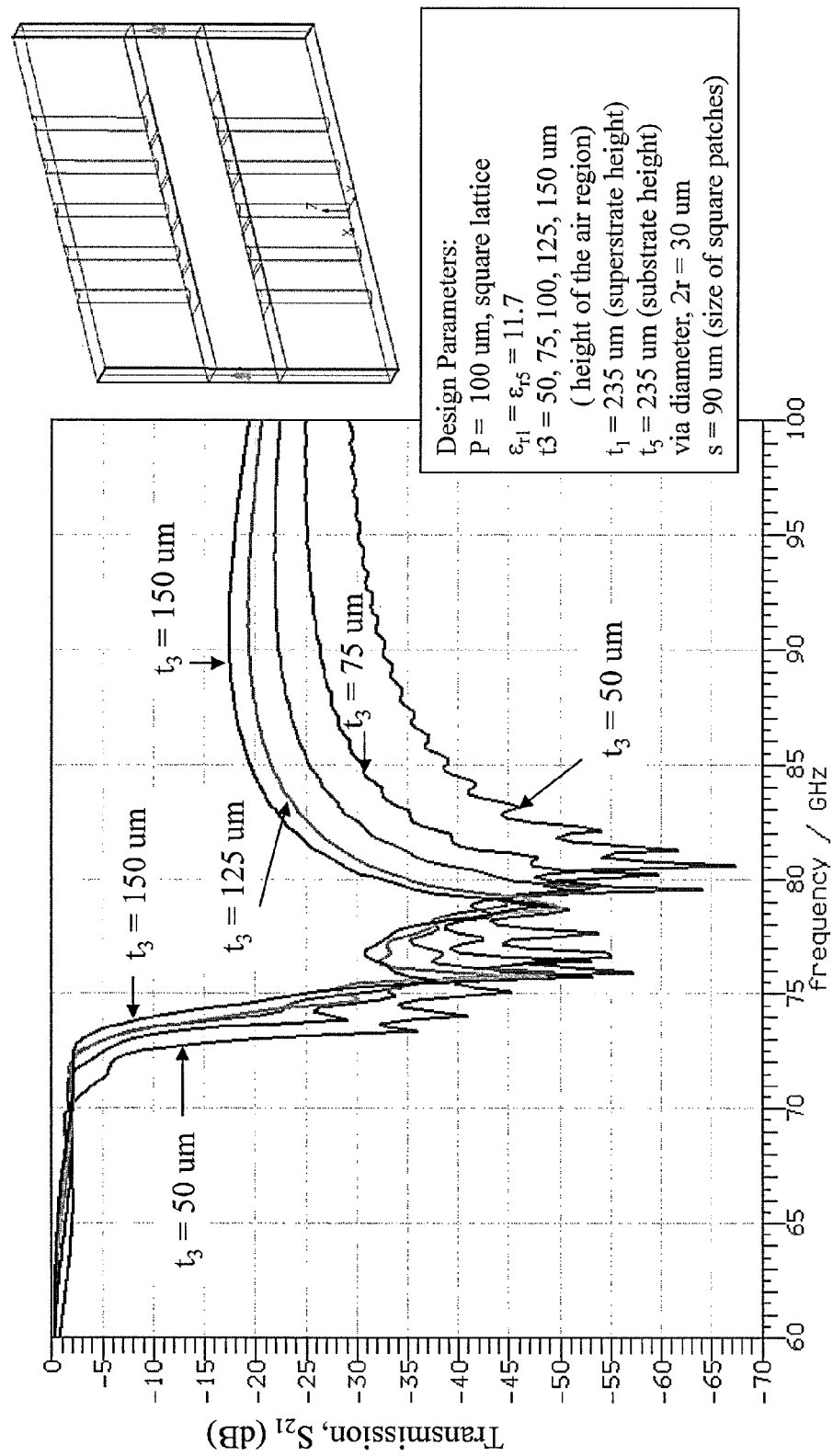
FIG. 11 shows the full-wave transmission response S21 for the finite EBG structure of FIG. 10.

The example shown in FIG. 10, may be fabricated, for example, with high resistivity semiconductor wafers such that $\epsilon_{r1}=\epsilon_{r5}$=11.7, P=100 um, upper and lower via diameter 2r=30 um, upper and lower patches have size s=90 um, and $t_1=t_5$=235 um. The transmission response $S_{21}$ through five unit cells is shown in FIG. 11 where the height of the air gap 1003 is varied parametrically from 50 um to 150 um in 25 um increments. This is a MMW EBG structure designed to exhibit a stopband at 77 GHz. The MICROSTRIPES solid model is also shown in FIG. 11 where the dielectric layers are omitted for clarity. Note that only ½ of a unit cell in the transverse direction is simulated since magnetic walls are the boundary condition for the sides of the WG. Magnetic walls may be considered to exist at the planes of symmetry which intersect the center of vias and the center of gaps. The ports are vertically polarized TE waveguides with zero frequency cutoff due to the magnetic sidewalls. The parametric results of FIG. 11 show that as the height of the air gap $t_3$ grows, the depth and bandwidth of the fundamental stopband will decrease. Conversely, as the gap $t_3$ decreases, the depth and bandwidth of the fundamental stopband will increase.

An EBG Structure after FIG. 2 with Non-Uniform Vias

Figure 12:
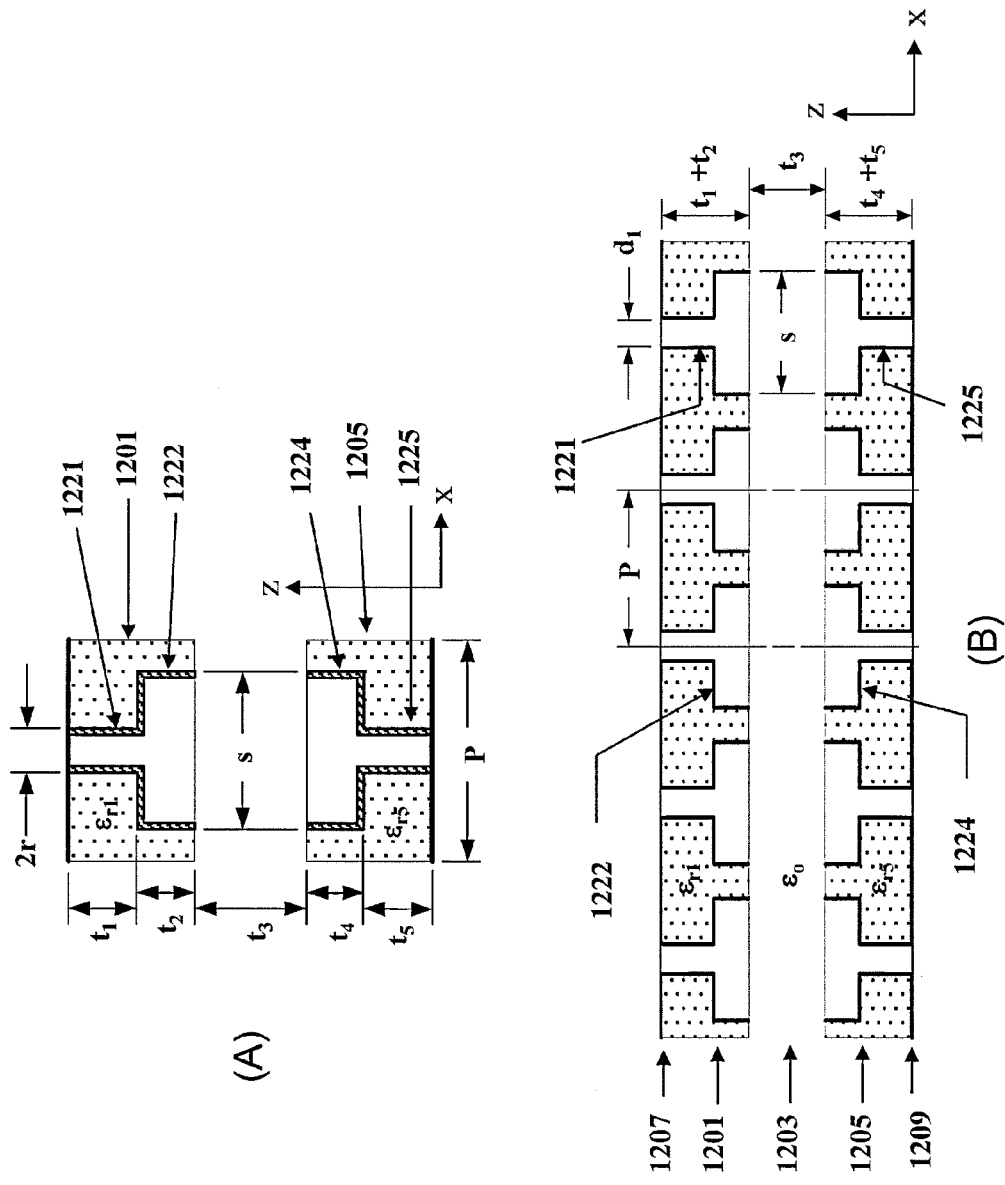
FIG. 12 shows an example after FIG. 2 as an EBG structure with non-uniform vias.

Another EBG structure is shown in FIG. 12. The structure is an inhomogeneous WG containing an array of vias where the vias have a non-uniform cross-sectional shape characterized by a high-aspect-ratio section which transitions into a low-aspect-ratio section. Herein, aspect ratio is defined as the ratio of via length to the largest cross sectional dimension, which is the diameter for a common cylindrical via. Each non-uniform via may be one contiguous conductor. The high-aspect-ratio section may be used to realize a rodded media, and the low-aspect-ratio section may be used to enhance the capacitive coupling between vias, or equivalently, to enhance the transverse permittivity for equivalent magneto-dielectric layers 202 and 204 in the effective medium model.

FIG. 12(b) is an inhomogeneous WG formed by upper and lower conducting planes 1207 and 1209. The periodic structure contained within has a square lattice of period P. In this example, there is an air gap 1203 between dielectric layers 1201 and 1205. Thicknesses of the three dielectric layers 1201, 1203, and 1205 are denoted as $t_1+t_2$, $t_3$, $t_4+t_5$, respectively, and the relative dielectric constants of these layers are denoted as $\epsilon_{r1}$, 1, and $\epsilon_{r5}$, respectively.

FIG. 12(a) illustrates a detail of the unit cell in which a higher aspect ratio via 1221 of length $t_1$ connects the upper conductor 1207 to a lower aspect ratio via 1222. Via 1221 may have a circular cylindrical shape with a diameter of 2r. The lower aspect ratio via 1222 may have a length of $t_2$ and may have an essentially square footprint whose exterior side length is s. Therefore, the separation distance between adjacent lower aspect ratio vias in an array environment of FIG. 12(b) may be only P-s. The higher and lower aspect ratio vias 1221 and 1222 have a combined length $t_1+t_2$ which spans the thickness of the upper dielectric layer 1201. Similarly, the lower non-uniform vias may be comprised of a higher aspect ratio via 1225 of length $t_5$ that connects the lower conductor 1209 to a lower aspect ratio via 1224. Via 1225 may also have a circular cylindrical shape with a diameter of 2r. The lower aspect ratio via 1224 has a length of $t_4$ and may have an essentially square footprint whose exterior side length is also s. It is not necessary for the upper and lower non-uniform vias to be mirror images of each other as they appear in FIG. 12 since, in general, the vias may have different diameters, different side lengths, and even different cross-sectional shapes. Furthermore, for example, the periods of the upper and lower vias may be different.

The array of higher aspect ratio vias 1221 forms a rodded medium in the upper dielectric layer 1201 which may be mapped into the magneto-dielectric layer 201 in the effective medium model. Similarly, the array of higher-aspect-ratio vias 1225 form a rodded medium in the lower dielectric layer 1205 which may be mapped into magneto-dielectric layer 205 in the effective medium model. These two rodded mediums in host dielectric layers 1201 and 1205 may have a negative z-axis permittivity in the fundamental stopband as described above. The permeability tensor and permittivity tensor for each rodded media may be calculated using equations (24) through (27).

The array of lower aspect ratio vias 1222 forms an effective capacitance $C_2$ in the upper dielectric layer 1201 which may be mapped into magneto-dielectric layer 202 in the effective medium model. Similarly, the array of lower aspect ratio vias 1224 forms an effective capacitance $C_4$ in the lower dielectric layer 1205 which may be mapped into magneto-dielectric layer 204 in the effective medium model. The permeability tensor and permittivity tensor for layers 202 and 204 may be calculated using equations (4) and (5). The value of $\in_{avg}$ in (5) is the host permittivity of the background dielectric, namely $\in_{r1}$ or $\in_{r5}$. To estimate the effective capacitance $C_i$ one may use the parallel-plate capacitor formula to obtain a lower bound:

$$C_i \cong \frac{\varepsilon_o \varepsilon_{r1} s t_i}{P-s} \text{ for } i = 2 \text{ and } 4. \tag{34}$$

A more accurate estimate of $C_i$ may be obtained using the procedure described in FIG. 8 and equation (30). All of the conductive portions of the lower aspect ratio via should be included in this simulation to find $f_{3dB}$.

The non-uniform vias may be fabricated in a semiconductor wafer by using reactive ion etching (RIE). This process is capable of fabricating substantially vertical sidewalls for 3D structures. Two different masks may be used to fabricate the high aspect ratio holes and the low aspect ratio holes in separate steps. Then the entire via structure may be plated with metal. Shown in FIG. 12 are substantially vertical sidewalls for the low aspect ratio vias. The side walls may be tapered during fabrication by simultaneously using RIE and chemical etching processes. Using both RIE and chemical etching may speed up the processing steps.

Figure 13:
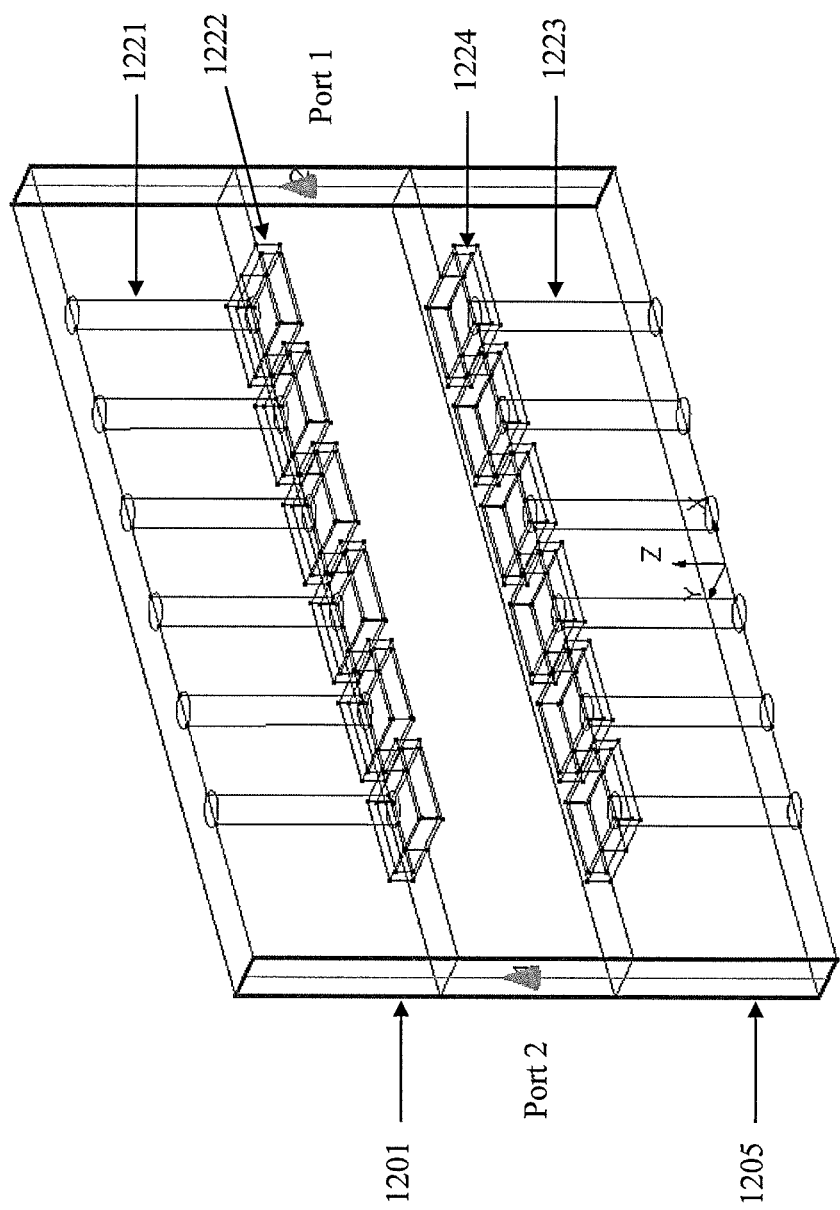
FIG. 13 shows a 3D wire frame model used in a full-wave electromagnetic simulation of the EBG structure of FIG. 12.
Figure 14:
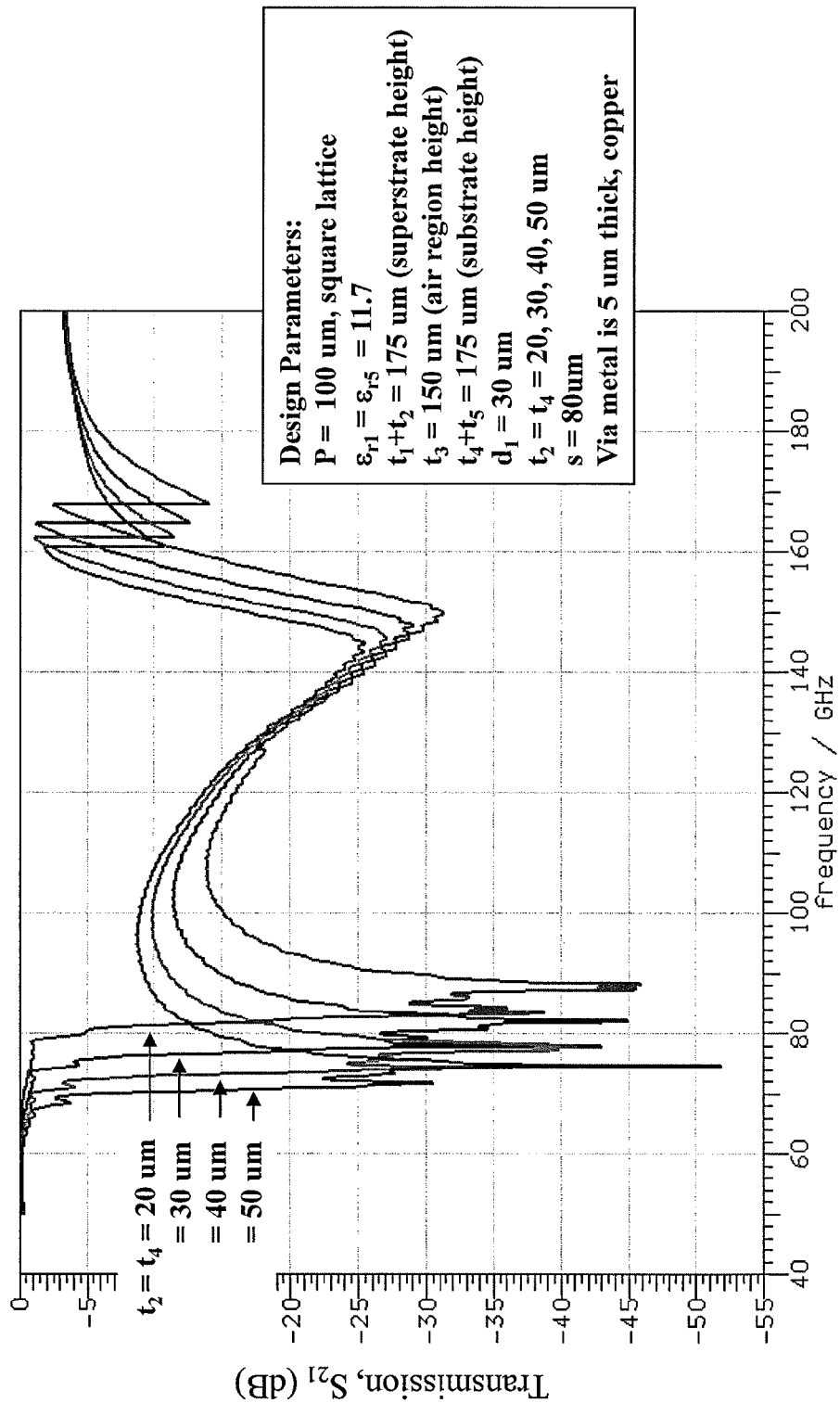
FIG. 14 shows a full-wave simulation of transmitted power through the finite length model of the EBG structure shown in FIG. 13.

In an example, the structure shown in FIG. 12 may be fabricated using silicon wafers such that $\in_{r1} = \in_{r5} = 11.7$ and P=100 um. Higher aspect vias are circular in cross section with diameters 2r=30 um, and lower aspect vias are square in cross section with size s=80 um. Dielectric layers have a thickness $t_1+t_2=t_4+t_5=175$ um. The air gap $t_3=150$ um. The transmission response $S_{21}$ through six unit cells is shown in FIG. 14 where the height of the lower aspect ratio vias 1122 and 1224 are varied parametrically from 20 um to 50 um. This millimeterwave (MMW) EBG structure was designed to yield a stopband centered near about 80 GHz. The MICROSTRIPES solid model used for simulation is shown in FIG. 13. Again, only ½ of a unit cell in the transverse direction is simulated since magnetic walls are the boundary condition for the sides of the waveguide. The parametric results of FIG. 14 show that, as the length of the lower aspect ratio vias increases, so does the effective capacitance $C_2$ and $C_4$, which lowers the frequency of the fundamental stopband.

The example of FIG. 12 has lower-aspect-ratio vias comprised of solid conducting walls. However, the sidewalls may be comprised of a linear array of smaller diameter vias. This may be suitable for manufacturing if LTCC or organic laminate technology is used. The lower-aspect-ratio via may resemble a bird cage with a solid conducting floor and walls of vertical, smaller diameter vias. The LTCC example may or may not have a conductive ceiling in this example.

The example of FIG. 12 is illustrated with hollow vias. In practice, the non-uniform vias may be partially or completely filled with dielectric materials without substantially altering the performance. The interior of the vias may be filled with a conductive material, which may result in a slight shift (lowering) of the frequency response since the effective capacitance may increase by a relatively small percentage.

The EBG structure of FIG. 12 may be considered as two separate dielectric slabs 1201 and 1205, each slab having an array of conductive vias 1221, 1222, 1224, and 1225. If the upper dielectric slab 1201, which may correspond to a cover in a package, is removed, the remaining lower dielectric slab 1205 and the associated conductive surfaces 1209, 1224, and 1225 may be considered as an open EBG structure. This open EBG structure may guide surface waves at frequencies below the fundamental TM mode cutoff, and may exhibit a surface wave bandgap where the TM and the TE modes are evanescent in the lateral (x and y) directions. The surface wave bandgap for such an open EBG structure may be calculated with the same TRM as described above where the transmission line 303 becomes an infinitely long matched transmission line.

An EBG Structure after FIG. 2 with 3D Patches Having Sidewalls

Figure 15:
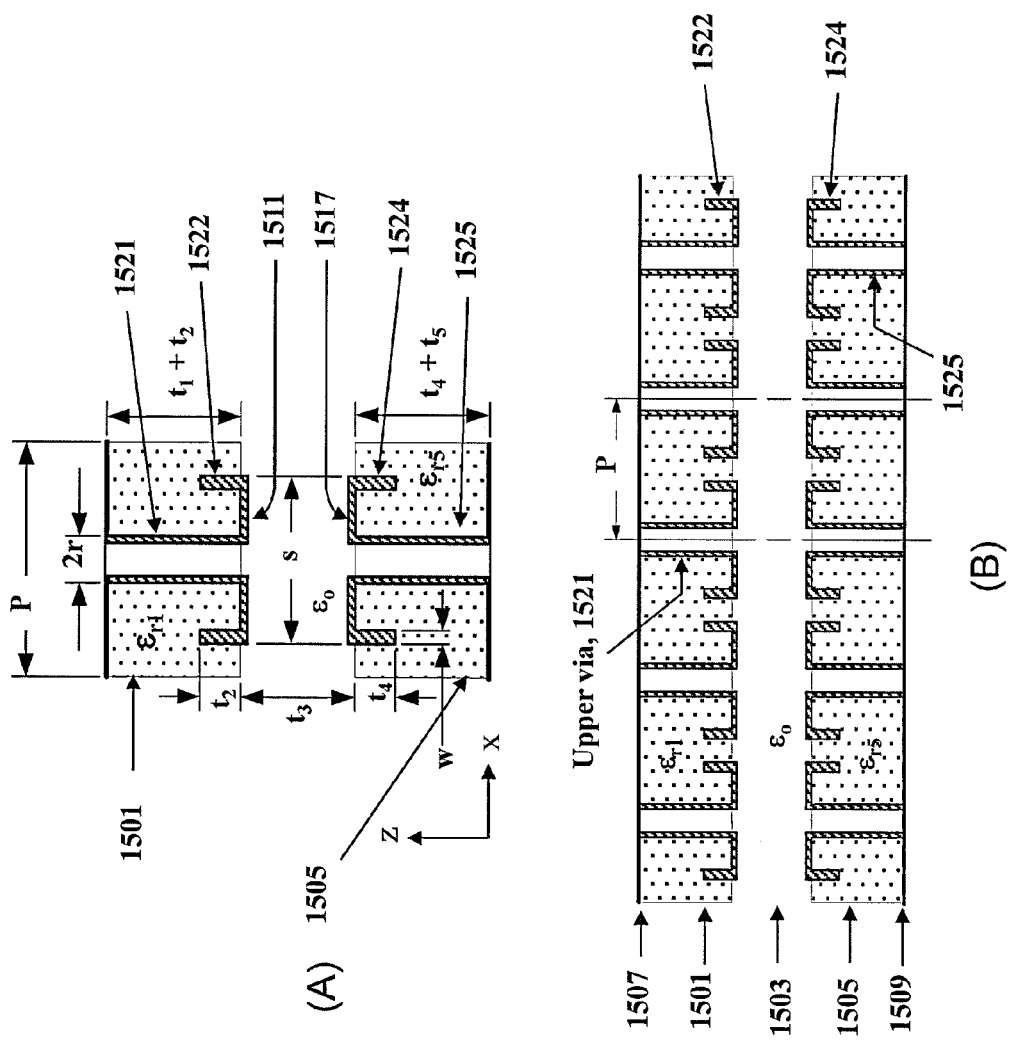
FIG. 15 shows an example after FIG. 2 as an EBG structure with 3D patches having vertical sidewalls.

The EBG structure of FIG. 10 may be modified to enhance the effective capacitance between coplanar single layer patches. An example is shown in FIG. 15 as an inhomogeneous WG, where the conductive patches have essentially vertically oriented conductive sidewalls 1522 and 1524. The relative close proximity of sidewalls between adjacent unit cells may result in a parallel plate capacitance which is greater than the edge capacitance of the same size coplanar patches. Furthermore, the sidewalls 1522 and 1524 may be buried in the upper or lower dielectric layers 1501 and 1505, which may also enhance the capacitive coupling due to the relatively high dielectric constant of these dielectric layers compared to the air gap 1503.

The example of FIG. 15(b) is an inhomogeneous WG formed by upper and lower conducting planes 1507 and 1509. The periodic structure contained within has a square lattice of period P. In this example there is an air gap 1503 between dielectric layers 1501 and 1505. The thicknesses of the three dielectric layers 1501, 1503, and 1505 are denoted as $t_1+t_2$, $t_3$, $t_4+t_5$, respectively, and the relative dielectric constants of these layers are denoted as $\in_{r1}$, 1, and $\in_{r5}$, respectively.

FIG. 15(a) illustrates a detail of the unit cell in which an upper conductive via 1521 of length $t_1+t_2$ connects the upper conductor 1507 to an upper patch 1511. Via 1521 may have a circular cylindrical shape with a diameter of 2r. The upper patch 1511 is connected to a conductive upper sidewall 1522 that attaches to perimeter of the patch 1511. In this example, the upper patch 1511 is square with side length s and the upper sidewall has a vertical height of $t_2$ buried in the upper dielectric layer 1501. The upper sidewall 1522 is uniform in height around the perimeter of the patch 1511, and the width of the upper and lower sidewalls 1522 and 1524 is denoted as w.

Similarly, in the unit cell of FIG. 15(a), a lower conductive via 1525 of length $t_4+t_5$ connects the lower conductor 1509 to a lower patch 1517. Via 1525 may have a circular cylindrical shape with a diameter of 2r. The lower patch 1517 is connected to a conductive lower sidewall 1524 that attaches to perimeter of the patch 1517. In this example the lower patch 1517 is square with side length s and the lower sidewall has a vertical height of $t_4$ in which it is buried in the lower dielectric layer 1505.

The patches 1511 and 1517 are square in the example of FIG. 15, but that is not a limitation. Any polygonal patch shape may be used, including an inter-digital shape. To enhance the effective capacitance, conductive fingers of an inter-digital patch may extend into the upper (or lower) dielectric layer 1501 (or 1505) to have a vertical dimension $t_2$ (or $t_4$) similar to the sidewalls.

The upper and lower patches, sidewalls, and vias need not be mirror images of each other as they are shown in FIG. 15 since, in general, they may have, for example, different diameters, different side lengths, and different cross-sectional shapes.

The upper vias 1521 form a rodded medium in the upper dielectric layer 1501 which may be mapped into magneto-dielectric layer 201 in the effective medium model. Similarly, the array of lower vias 1525 form a rodded medium in the lower dielectric layer 1505 which may be mapped into magneto-dielectric layer 205 in the effective medium model. These two rodded mediums in host dielectric layers 1501 and 1505 may have a negative z-axis permittivity in the fundamental stopband as previously described. The permeability tensor and permittivity tensor for each rodded media may be calculated using equations (24) through (27).

The array of upper patches 1511 and sidewalls 1522 result in an effective capacitance $C_2$ in the upper dielectric layer 1501 which may be mapped into magneto-dielectric layer 202 in the effective medium model. Similarly, the array of lower patches 1517 and sidewalls 1524 result in an effective capacitance $C_4$ in the lower dielectric layer 1505 which may be mapped into magneto-dielectric layer 204 in the effective medium model. The permeability tensor and permittivity tensor for layers 202 and 204 may be calculated using equations (4) and (5). The value of $\in_{avg}$ in (5) is the host permittivity of the background dielectric, namely $\in_{r1}$ or $\in_{r5}$. To estimate the effective capacitance $C_i$ one may use the parallel-plate capacitor formula (28) to obtain a lower bound. A more accurate estimate of $C_i$ may be found using the procedure described in FIG. 8 and equation (30). The conductive portions of the sidewalls and patches should be included in the simulation to calculate $f_{3dB}$.

The sidewalls 1522 and 1524 may be fabricated in a semiconductor wafer by using reactive ion etching (RIE) to cut trenches. Then the trenches may be plated with a metal to create conductive sidewalls. FIG. 15 shows essentially vertical sidewalls, but the sidewalls may be tapered in fabrication by simultaneously using RIE and a chemical etching processes. An advantage of using both RIE and chemical etching may be to speed up the processing steps.

Figure 16:
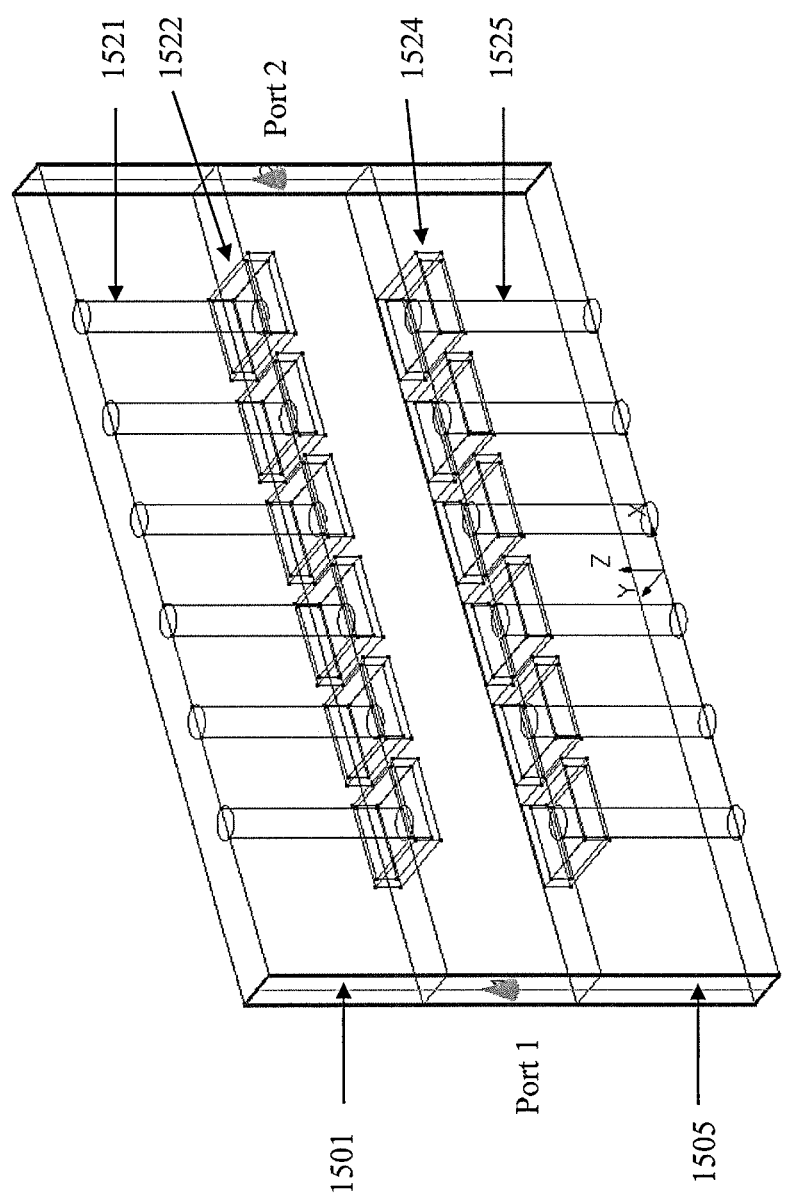
FIG. 16 shows a 3D wire frame model used in a full-wave electromagnetic simulation of the EBG structure of FIG. 15.
Figure 17:
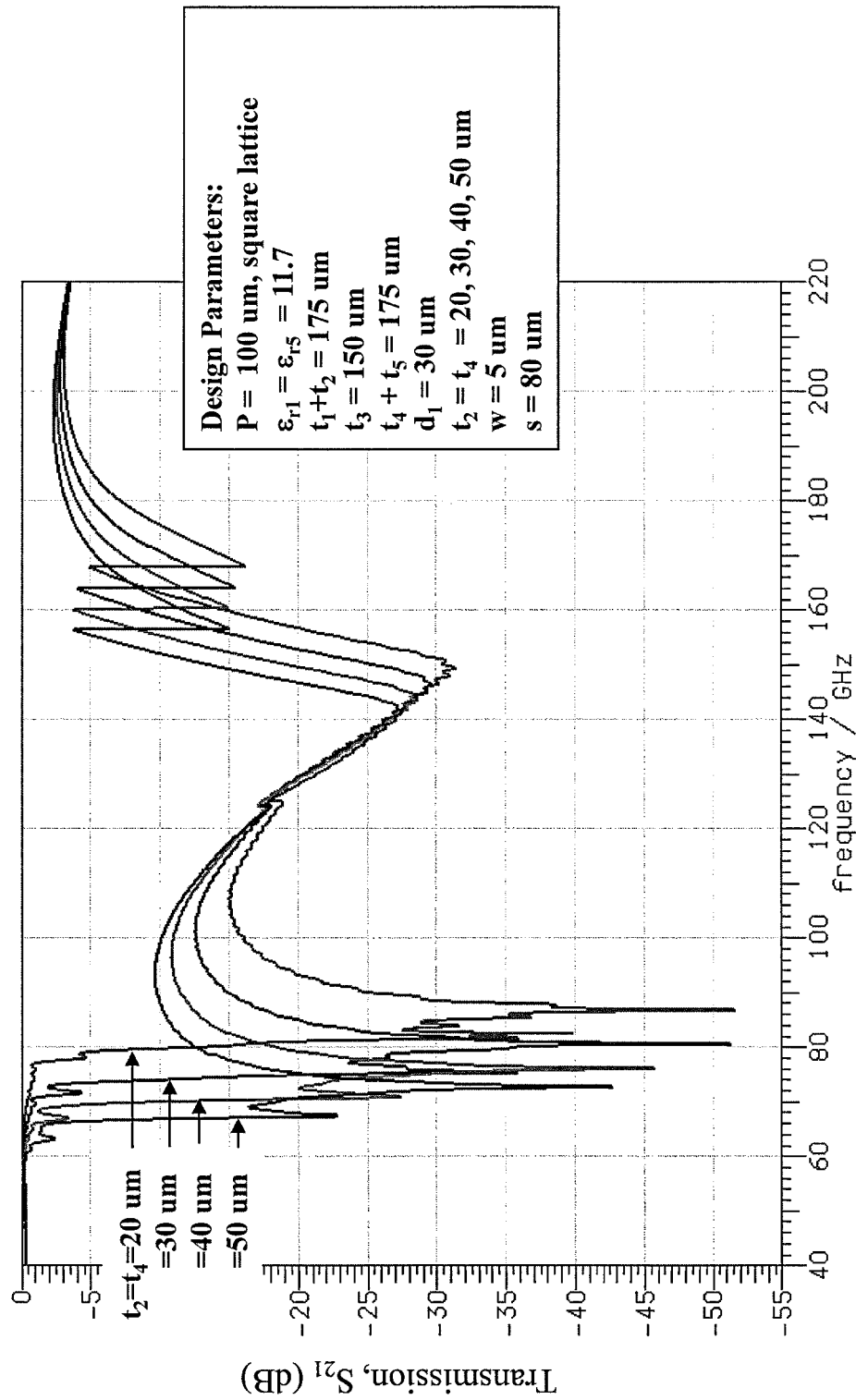
FIG. 17 shows a full-wave simulation of transmitted power through the finite length model of the EBG structure shown in FIG. 16.

The example shown in FIG. 15, may be fabricated with silicon semiconductor wafers such that $\in_{r1}=\in_{r5}=11.7$, P=100 um, all vias have diameters 2r=30 um, the patches are square with size s=80 um, and $t_1+t_2=t_4+t_5=175$ um. The air gap $t_3=150$ um. The calculated transmission response $S_{21}$ through six unit cells is shown in FIG. 17 where the heights $t_2$ and $t_4$ of the sidewalls 1522 and 1524 are varied parametrically from 20 um to 50 um. This MMW EBG structure exhibits a stopband near 80 GHz. The MICROSTRIPES solid model used for simulation is shown in FIG. 16. Again, only one half of a unit cell in the transverse direction is simulated since magnetic walls are the boundary condition for the sides of the WG. The parametric results of FIG. 17 show that, as the height of the sidewalls increase, so do the effective capacitances $C_2$ and $C_4$, which lowers the frequency of the fundamental stopband.

In the example shown in FIG. 15 the upper and lower sidewalls are solid conducting walls. However, the sidewalls may be, for example, a linear array of smaller diameter vias. This is may be a suitable manufacturing technique if the EBG structure is built using LTCC technology or organic laminates.

An EBG Structure after FIG. 2 with Pyramidal Vias

Figure 18:
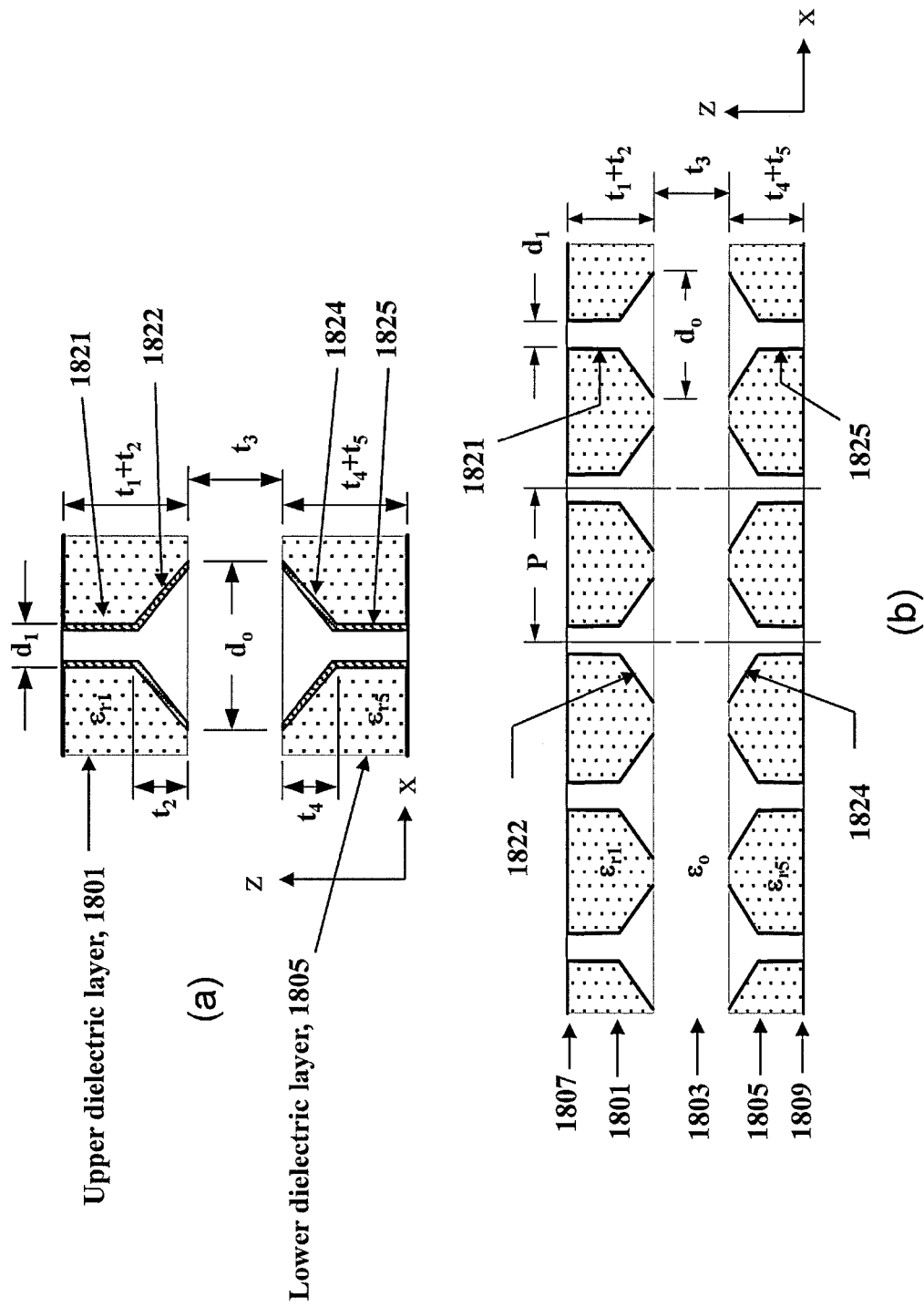
FIG. 18 shows an example after FIG. 2 as an EBG structure with pyramidal vias.

An EBG structure that uses an alternative shape of lower-aspect-ratio conductive vias is shown in FIG. 18. This example is similar to the example of FIG. 12 except that the lower-aspect-ratio vias are square pyramids instead of square columns. All other features of the example of FIG. 18 are consistent with features of the example of FIG. 12.

If the example of FIG. 18 is fabricated using silicon wafers for dielectric layers 1801 and 1805, then anisotropic etching may be used to form the pyramidal vias 1822 and 1824. A unit cell is shown of FIG. 18(a). The base of the pyramids has a length $d_0$. The square pyramids 1822 and 1824 taper down in size to meet the higher-aspect-ratio vias 1821 and 1825, which are cylindrical vias of diameter $d_1$. The height of the square pyramids may be determined from the relationship $$d_0 = d_1 + 2h\tan(\theta) \quad (35)$$

where $h=t_2=t_4$ and $\theta$ is the half angle of the pyramid. For anisotropically etched silicon, $\theta \cong 54"$. The higher-aspect-ratio vias 1821 and 1825 may be formed, for example, using reactive ion etching (RIE). The entire non-uniform via may then be plated. In an aspect, the height of the pyramidal via may approach the entire thickness of the host dielectric layer: $t_1+t_2$ or $t_4+t_5$.

In another aspect, the example shown in FIG. 18, may be fabricated from high-resistivity silicon semiconductor wafers such that $\in_{r1}=\in_{r5}=11.7$, P=100 um, the higher aspect ratio vias have diameters $d_1=30$ um, the pyramids have a base size $d_0=80$ um, and $t_1+t_2=t_4+t_5=150$ um. The air gap $t_3=150$ um.

Figure 19:
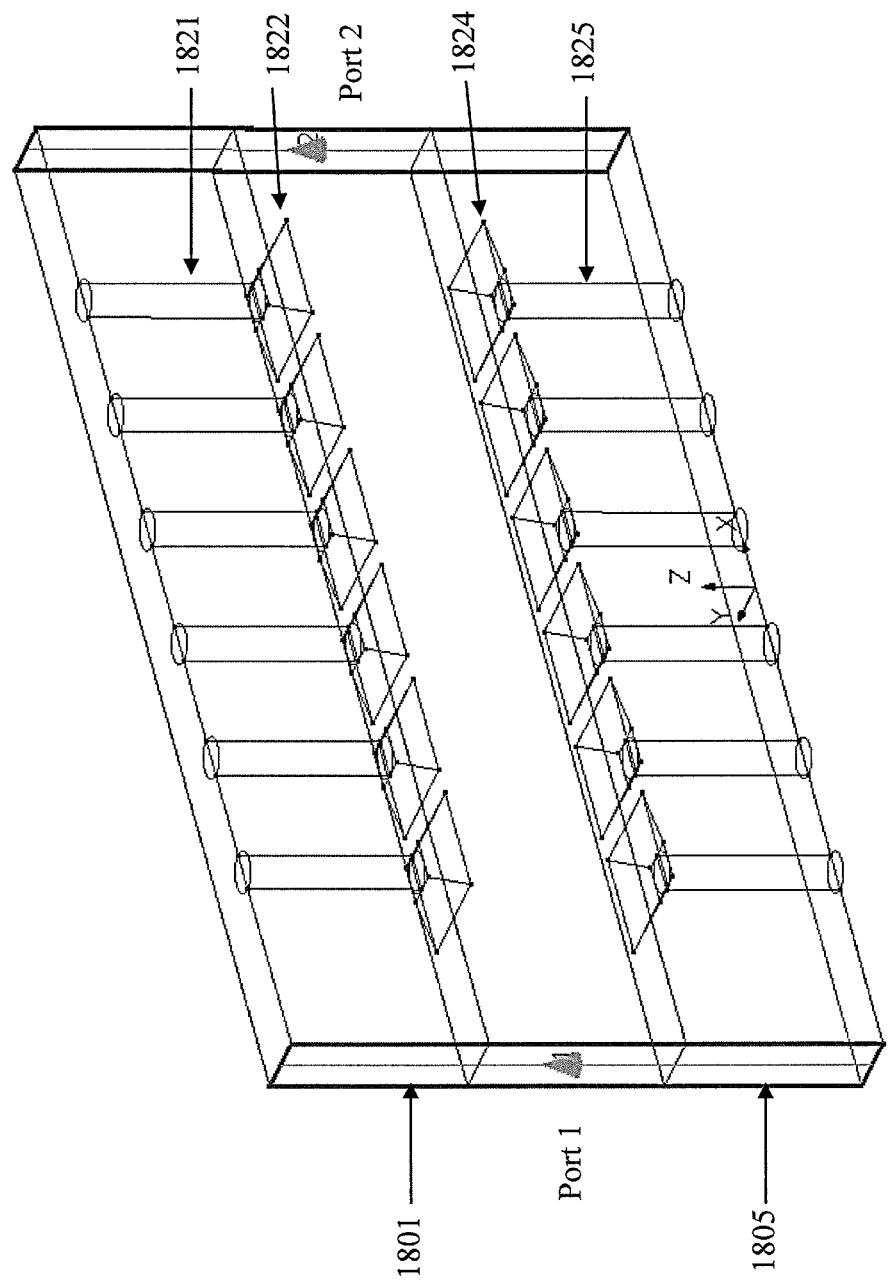
FIG. 19 shows a 3D wire solid model used in a full-wave electromagnetic simulation of the EBG structure of FIG. 18.
Figure 20:
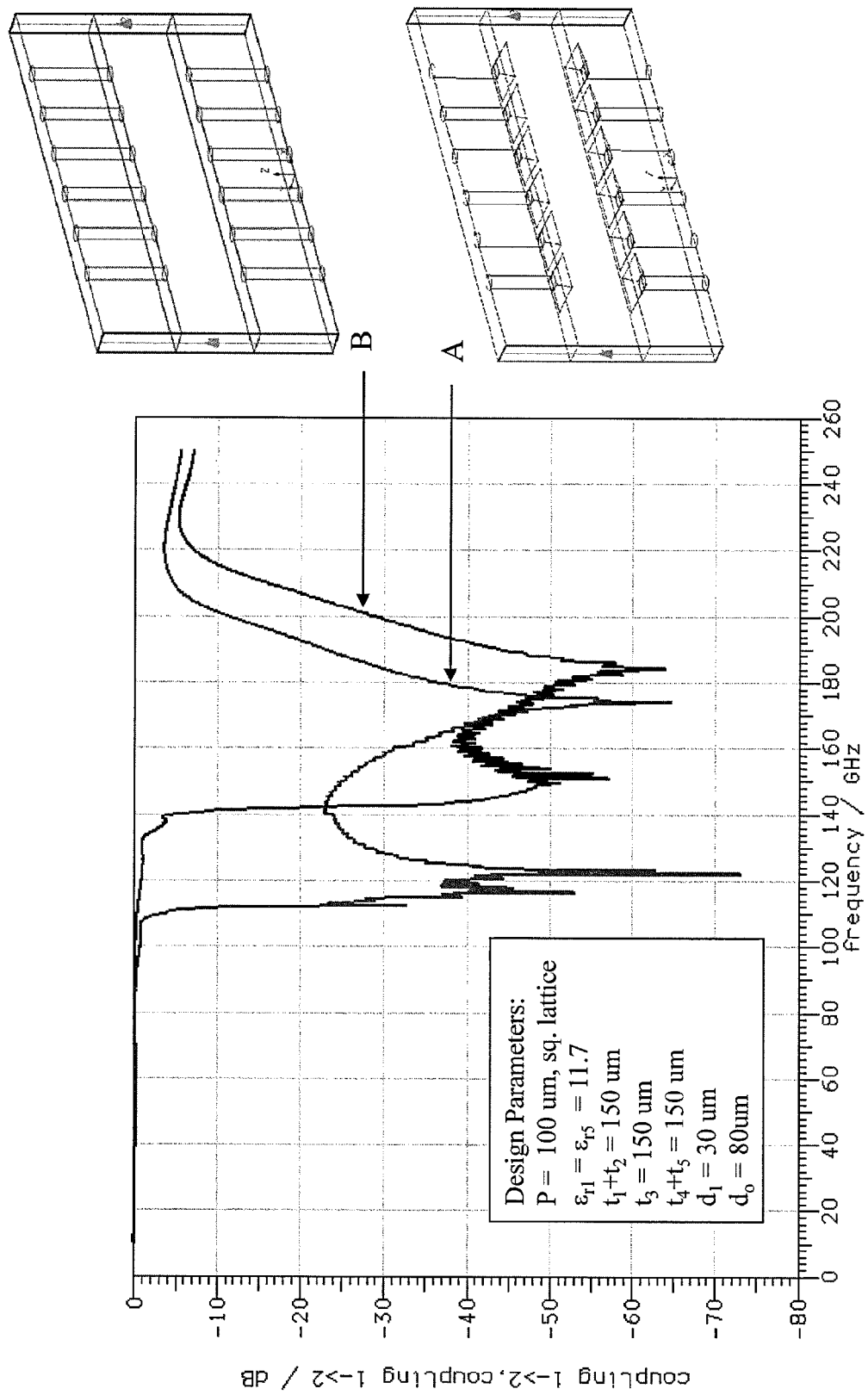
FIG. 20 shows a full-wave simulation of transmitted power through the finite length model of the EBG structure shown FIG. 19.

The transmission response $S_{21}$ through six unit cells of the EBG structure in FIG. 19 is shown in FIG. 20 where curve A is for the anisotropically etched vias. The TM mode stopband appears from about 110 GHz to near 200 GHz, assuming a −10 dB coupling specification. Again, only one half of a unit cell in the transverse direction is simulated since magnetic walls are the boundary condition for the sides of the WG. Also shown in FIG. 20 is a transmission curve B for the case where each via is a simple cylinder of diameter 30 um. The stopband extends from near 140 GHz to near 216 GHz, again assuming a −10 dB coupling specification. The pyramidal shape for the ends of the non-uniform vias appears to enhance the effective capacitance between vias, resulting in a lower frequency stopband.

Four Layer Effective Media Model

Figure 21:
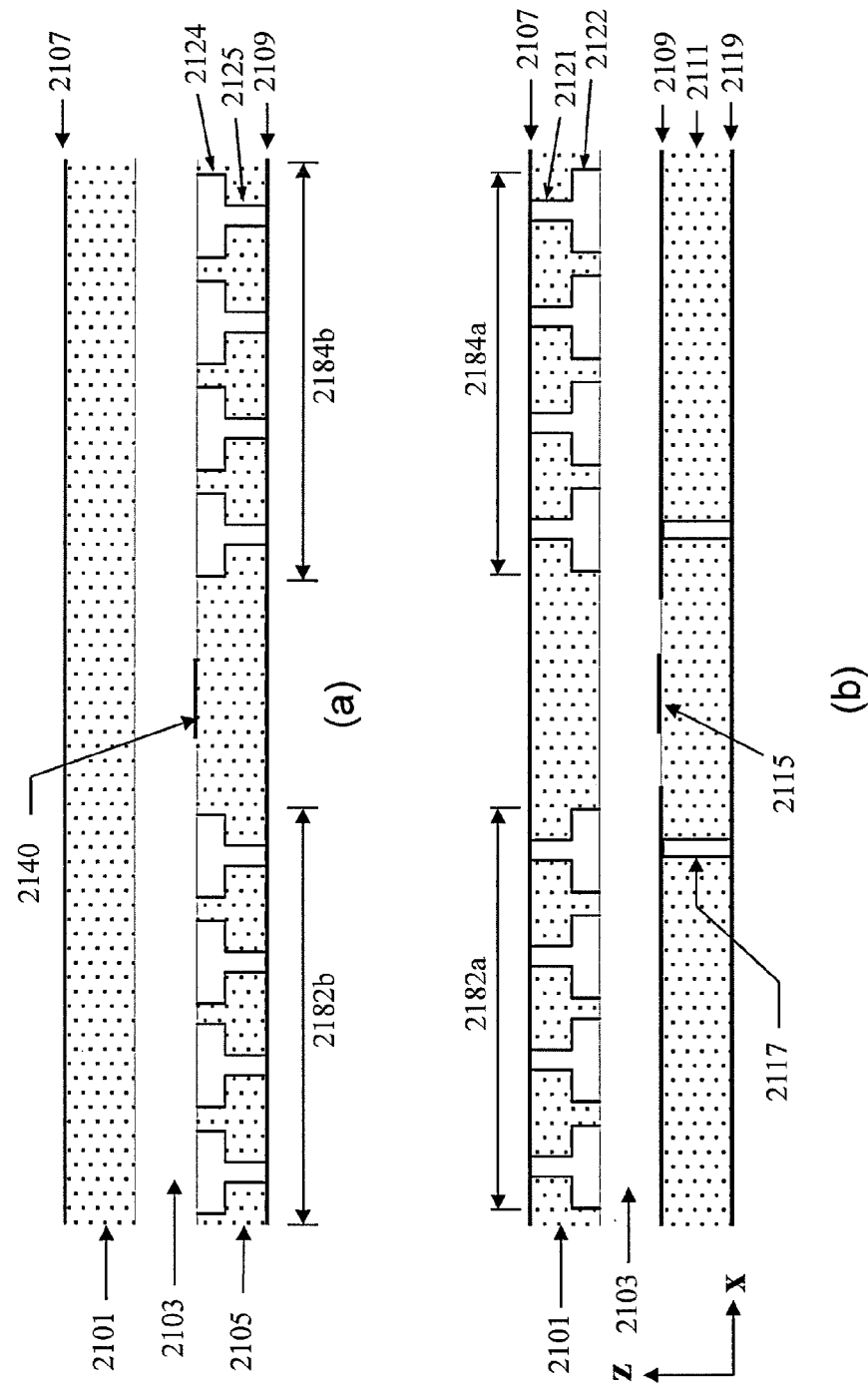
FIG. 21(a) shows an example using an EBG structure with non-uniform vias in proximity to a covered microstrip transmission line, (b) shows another example of an EBG structure using non-uniform vias and fabricated into the shielded cover of a CPW transmission line.

The package cover in FIG. 1(b) may not contain part of an EBG structure such as 184a; for instance, the length of the vias in the cover may cause the package height to be too tall. FIG. 21(a) illustrates the cross section of a shielded package containing a covered microstrip transmission line 2140 that is disposed below a dielectric layer 2103 (such as an air gap) and another dielectric layer 2101. It is surrounded on both sides by EBG structures 2182b and 2184b comprised of arrays of conductive vias of non-uniform cross sectional shape that are fabricated in the lower dielectric layer 2105 and electrically connected to the lower conducting plane 2109. Each non-uniform via is comprised of a lower-aspect-ratio via 2124 connected to a higher-aspect-ratio via 2125. The EBG structure may be used to suppress the propagation of parasitic modes in the inhomogeneous PPW that can cause crosstalk and package resonance. The inhomogeneous PPW of FIG. 21(a) may be modeled as a four-layer effective medium where the vias of the lower dielectric layer 2105 may be modeled using two magneto-dielectric layers, one characterized by high transverse permittivity whose thickness is the height of the lower-aspect-ratio vias 2124, and the second characterized by negative normal permittivity whose thickness is the height of the higher-aspect-ratio vias 2125. Such a four layer effective medium model is shown in FIG. 22 where the bottom two layers 2204, 2205 comprise the EBG structure responsible for mode suppression.

In other design situations, there may be a local ground plane from a coplanar waveguide (CPW) that is part of the cover or substrate. An example is shown in FIG. 21(b) where a CPW transmission line is shielded by a cover layer 2101 that contains EBG structures 2182a and 2184a. The CPW ground plane is the lower conducting plane 2109 of an inhomogeneous PPW. The purpose of the EBG structure is to prevent the CPW from coupling RF power into the PPW that contains the air gap 2103, and which is bounded by conductive planes 2107 and 2109. Each EBG structure 2182a and 2184a is comprised of a two-dimensional array of conductive vias of non-uniform cross sectional shape that are connected to the upper conductive plane 2107. The inhomogenous PPW may be modeled as a three-layer effective medium model comprised of two magneto-dielectric layers, and one isotropic layer for the air gap. It may be considered to be the limiting case of a four-layer effective medium model, such as shown in FIG. 22, where the height of one of the isotropic dielectric layers, such as 2201, has gone to zero. The example of FIG. 21(b) is a conductor-backed coplanar waveguide (CB-CPW) since conductive plane 2119 shields the backside or lower side of the CPW transmission line. In this example, shorting vias 2117 are fabricated in the dielectric layer 2111 upon which the CPW center conductor 2115 is printed. The shorting vias 2117 connect the coplanar ground plane 2109 to the backside ground plane 2119 thus preventing RF power from being coupled from the CPW into the PPW formed by conductive planes 2109 and 2111. However, in other examples the CPW may not be shielded on the bottom side, in which case the conductive plane 2119 and shorting vias 2117 would be omitted.

Figure 22:
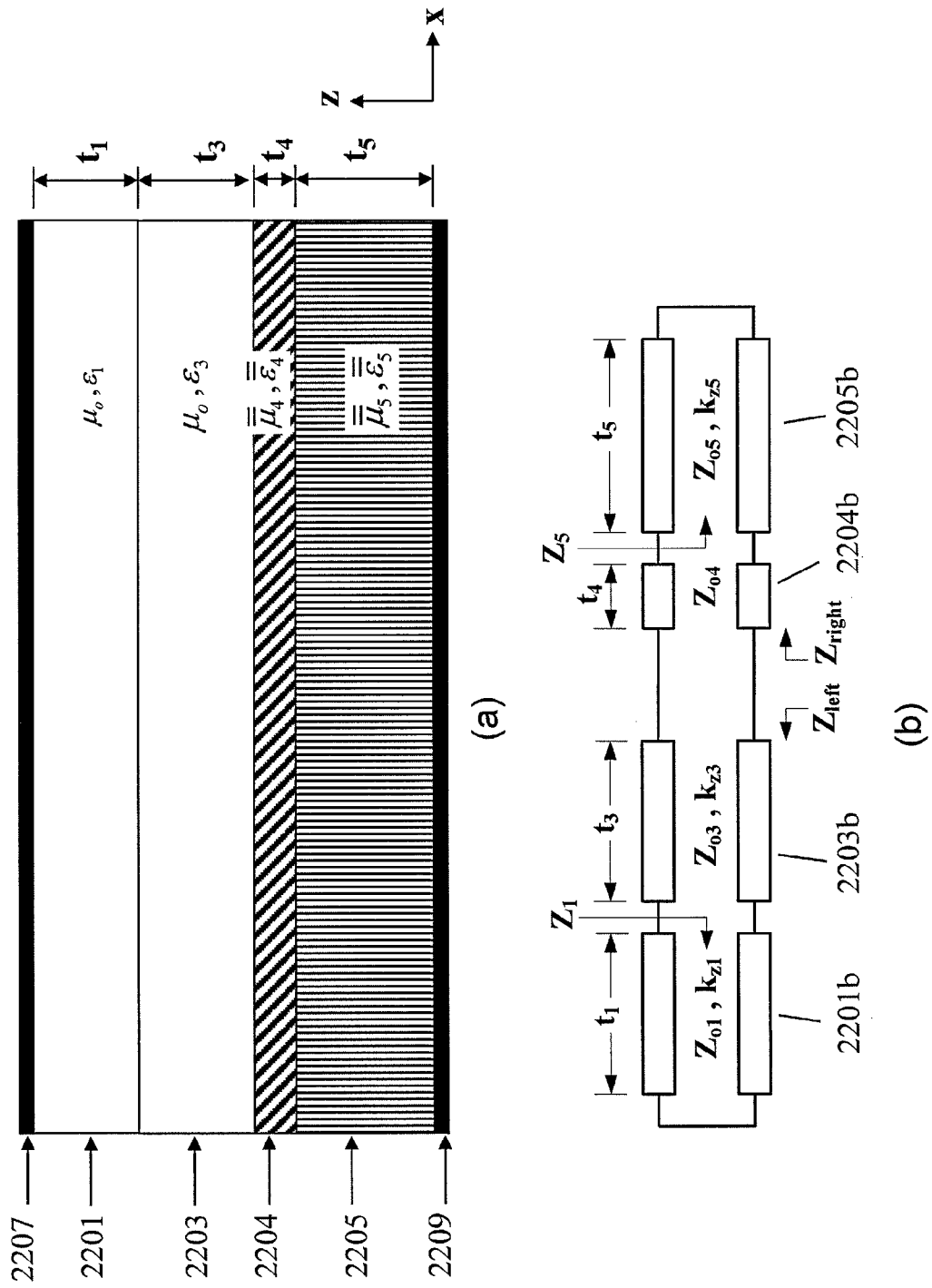
FIG. 22 (a) shows an effective medium model for another example; and, (b) shows the corresponding equivalent transmission line model.

FIG. 22 shows a four-layer effective medium model. The inhomogeneous PPW contains anisotropic magneto-dielectric layers 2204, and 2205. These may be planar layers in which the permittivity tensor and permeability tensor may be described using equations (2) through (5). Layers 2201 and 2203 are isotropic dielectric layers of relative permittivity $\epsilon_{r1}$ and $\epsilon_{r3}$. In some examples, layer 2203 may be an air gap where $\epsilon_{r3}=1$, or an isotropic dielectric having a higher relative permittivity. The layers may be contained between the upper conductor 2207 and the lower conductor 2209 such that electromagnetic fields are effectively confined between upper and lower conductors. Layers 2204 and 2205 may be considered a bi-uniaxial media where the tensor components of the main diagonals are equal in the transverse directions: the x and y directions.

An equivalent TL representation for the inhomogeneous PPW of FIG. 22(a) is shown in FIG. 22(b). This equivalent circuit is comprised of four cascaded TLs, one for each layer shown in FIG. 22(a). Short circuits are used on both ends (left and right) of the transmission lines to represent the upper and lower conductors 2207 and 2209 respectively. Equivalent transmission lines 2201b, 2203b, 2204b, and 2205b are used to model transverse electric field $E_x$ and the transverse magnetic field $H_y$ in layers 2201, 2203, 2204, and 2205 respectively.

The TM mode propagation constants may be calculated using the TRM described above by solving equation (6). However, the equations for impedances $Z_{left}$ and $Z_{right}$ in FIG. 22(b) are given as:

$$Z_{left}(\omega) = Z_{o3} \frac{Z_1 \cos(k_{z3}t_3) + jZ_{o3}\sin(k_{z3}t_3)}{Z_{o3}\cos(k_{z3}t_3) + jZ_1\sin(k_{z3}t_3)} \quad (36)$$

$$Z_1(\omega) = jZ_{o1}\tan(k_{z1}t_1) \quad (37)$$

$$Z_{right}(\omega) = Z_{o4} \frac{Z_5 \cos(k_{z4}t_4) + jZ_{o4}\sin(k_{z4}t_4)}{Z_{o4}\cos(k_{z4}t_4) + jZ_5\sin(k_{z4}t_4)} \quad (38)$$

$$Z_5(\omega) = jZ_{o5}\tan(k_{z5}t_5) \quad (39)$$

For TM-to-x modes, the characteristic impedance $E_x/H_y$ may be written as:

$$Z_{oi} = \frac{k_{zi}}{\omega \epsilon_o \epsilon_{xi}}, \text{ for } i = 1, 3, 4 \text{ and } 5. \quad (40)$$

where $k_{zi}$ is the frequency dependent propagation constant in the normal or z direction:

$$k_{zi}(\omega, k_x) = \sqrt{\left(\frac{\omega}{c}\right)^2 \epsilon_{xi}\mu_{yi} - k_x^2 \frac{\epsilon_{xi}}{\epsilon_{zi}}}, \text{ for } i = 4 \text{ and } 5. \quad (41)$$

For the isotropic dielectric layer 2201 and 2203, the z directed propagation constant reduces to:

$$k_{zi}(\omega, k_x) = \sqrt{\left(\frac{\omega}{c}\right)^2 \epsilon_{xi} - k_x^2}, \text{ for } i = 1 \text{ and } 3. \quad (42)$$

The TE mode propagation constants may also be calculated using the TRM by solving equation (18). However, the equations for admittances $Y_{left}=1/Z_{left}$ and $Y_{right}=1/Z_{right}$ in FIG. 22(b) are given as:

$$Y_{left}(\omega) = Y_{o3} \frac{Y_1 \cos(k_{z3}t_3) + jY_{o3}\sin(k_{z3}t_3)}{Y_{o3}\cos(k_{z3}t_3) + jY_1\sin(k_{z3}t_3)} \quad (43)$$

$$Y_1(\omega) = jY_{o1}\cot(k_{z1}t_1) \quad (44)$$

$$Y_{right}(\omega) = Y_{o4} \frac{Y_5 \cos(k_{z4}t_4) + jY_{o4}\sin(k_{z4}t_4)}{Y_{o4}\cos(k_{z4}t_4) + jY_5\sin(k_{z4}t_4)} \quad (45)$$

$$Y_5(\omega) = jY_{o5}\cot(k_{z5}t_5) \quad (46)$$

For TE-to-x modes, the admittance $H_x/E_y$ may be written as:

$$Y_{oi} = \frac{k_{zi}}{\omega \mu_o \mu_{xi}} \text{ for } i = 1, 3, 4 \text{ and } 5. \quad (47)$$

For TE waves, the z-directed propagation constants are:

$$k_{zi}(\omega, k_x) = \begin{cases} \sqrt{\left(\frac{\omega}{c}\right)^2 \epsilon_{yi}\mu_{xi} - k_x^2 \frac{\mu_{xi}}{\mu_{zi}}} & \text{if } \text{Re}\left\{k_x \frac{\mu_{xi}}{\mu_{zi}}\right\} < \frac{\omega}{c}\sqrt{\epsilon_{yi}\mu_{xi}} \\ -j\sqrt{k_x^2 \frac{\mu_{xi}}{\mu_{zi}} - \left(\frac{\omega}{c}\right)^2 \epsilon_{yi}\mu_{xi}} & \text{otherwise} \end{cases} \quad (48)$$

for $i = 4$ and 5.
and $$k_{zi}(\omega, k_x) = \begin{cases} \sqrt{\left(\frac{\omega}{c}\right)^2 \varepsilon_{yi} - k_x^2} & \text{if } \text{Re}\{k_x\} < \frac{\omega}{c}\sqrt{\varepsilon_{yi}} \\ -j\sqrt{k_x^2 - \left(\frac{\omega}{c}\right)^2 \varepsilon_{yi}} & \text{otherwise} \end{cases} \quad (49)$$

for $l = 1$ and 3.

The effective medium model of FIG. 22(a) may exhibit a stopband for TM modes when layers 2204 and 2205 have similar tensor properties as described above for layers 204 and 205 respectively in FIG. 2. Layer 2204 may have a relatively high transverse permittivity, much greater than unity. Layer 2205 may have a negative normal permittivity, such that a TM mode stopband may be formed in the inhomogenous PPW of FIG. 22(a).

Examples of structures whose electromagnetic properties map into the effective medium model of FIG. 22(a) are presented in FIGS. 23, 24, 25, and 26. They are each a version of examples introduced in FIGS. 4, 12, 15, and 18 respectively where the upper periodic array of conductors has been removed.

Figure 23:
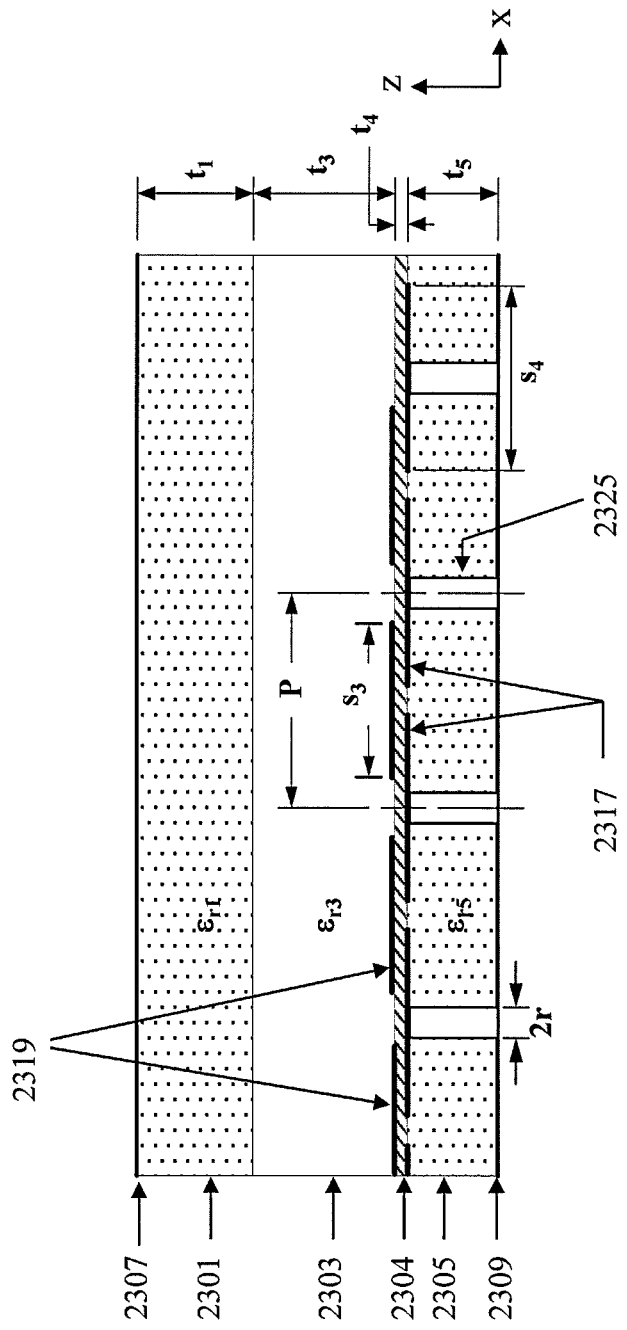
FIG. 23 shows an example that may be modeled by the effective medium model of FIG. 22 and is an EBG structure with overlay patches.
Figure 26:
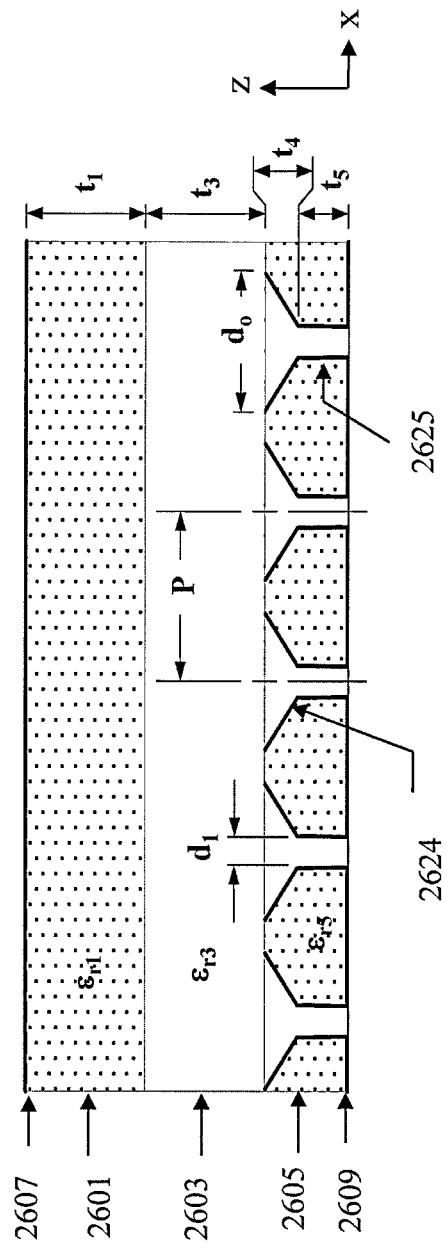
FIG. 26 shows an example that may be modeled by the effective medium model of FIG. 22 and is an EBG structure with pyramidal vias.

The 4-layer examples shown in FIGS. 23, through 26 may be simpler to manufacture than the 5-layer examples shown in FIGS. 4, 12, 15, and 18. However, in the 5-layer examples, the thickness $t_3$ of layer 3, which may be an air gap, can be approximately twice as large for the same bandwidth and depth of the fundamental TM mode stopband. This added height may be a usable in an MMIC package that contains a die with thick substrates, or stacked dies. Another consideration for the package designer is that for a fixed height of $t_3$, the 5-layer examples may have a wider fundamental TM mode stopband than the corresponding 4-layer examples.

In some examples, the dielectric layer 2201 of FIG. 22 may be omitted to create a three-layer inhomogenous PPW. This may be considered the as a limiting case where thickness $t_1$ goes to zero. The analysis is the same as described above except that $Z_1$ reduces to zero, or a short circuit. Structurally the examples are the same as shown in FIGS. 23, 24, 25, and 26 except that the dielectric layers 2301, 2401, 2501, and 2601 are omitted.

TE Mode Suppression Structures with 2 Dielectric Regions

Inside practical shielded microwave and millimeterwave packages, there are often horizontal metal layers upon which RF currents flow, such as the front or back side of an integrated circuit die, RF transmission lines, bias circuit lines, power circuit lines, or other conductive traces. RF currents flowing on these conductors may couple to TE modes inside the PPW formed by a shielded package, such as the package illustrated in FIG. 1(a). It may be desirable to suppress the TE mode over a relatively broad range of frequencies.

Figure 27:
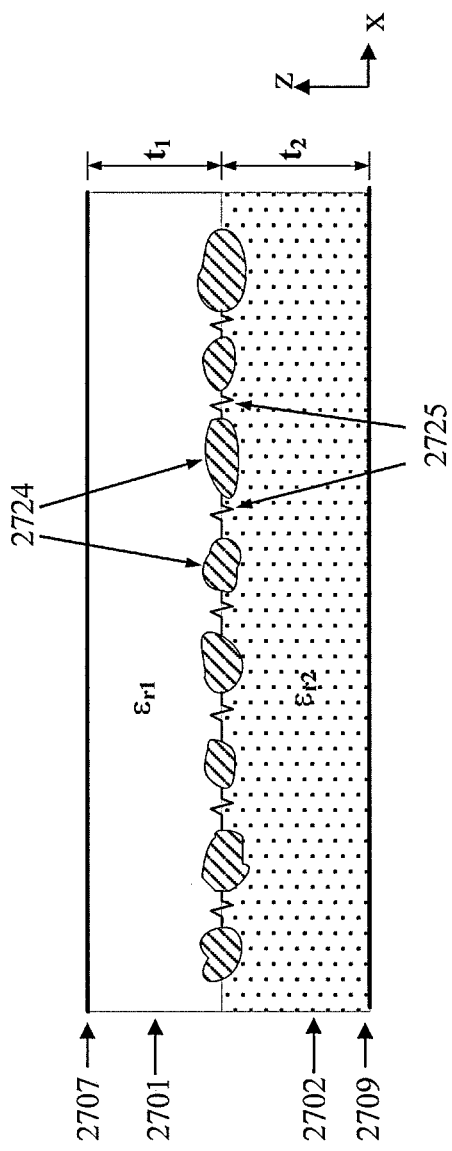
FIG. 27 shows an example of a TE mode suppression structure within an inhomogeneous parallel-plate waveguide that includes 3D conductive inclusions.

An example is shown in FIG. 27 where an inhomogeneous PPW may be formed by planar conductive surfaces 2707 and 2709. It contains at least two dielectric regions 2701 and 2702 which may have dissimilar relative dielectric constants $\in_{r1}$ and $\in_{r2}$, which may be isotropic. The PPW also contains a plurality of conductive inclusions 2724, some of which are interconnected by a plurality of resistances 2725. The conductive inclusions 2724 are located on the surface of, or buried within, dielectric region 2. The volume of these inclusions may also extend up into dielectric region 1.

Figure 24:
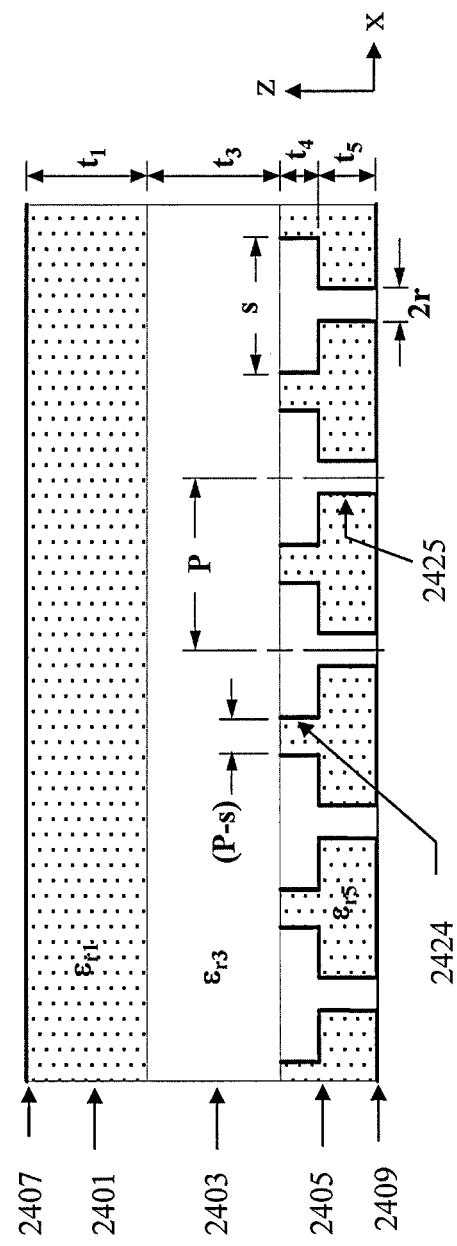
FIG. 24 shows an example that may be modeled by the effective medium model of FIG. 22 and is an EBG structure with non-uniform vias.
Figure 25:
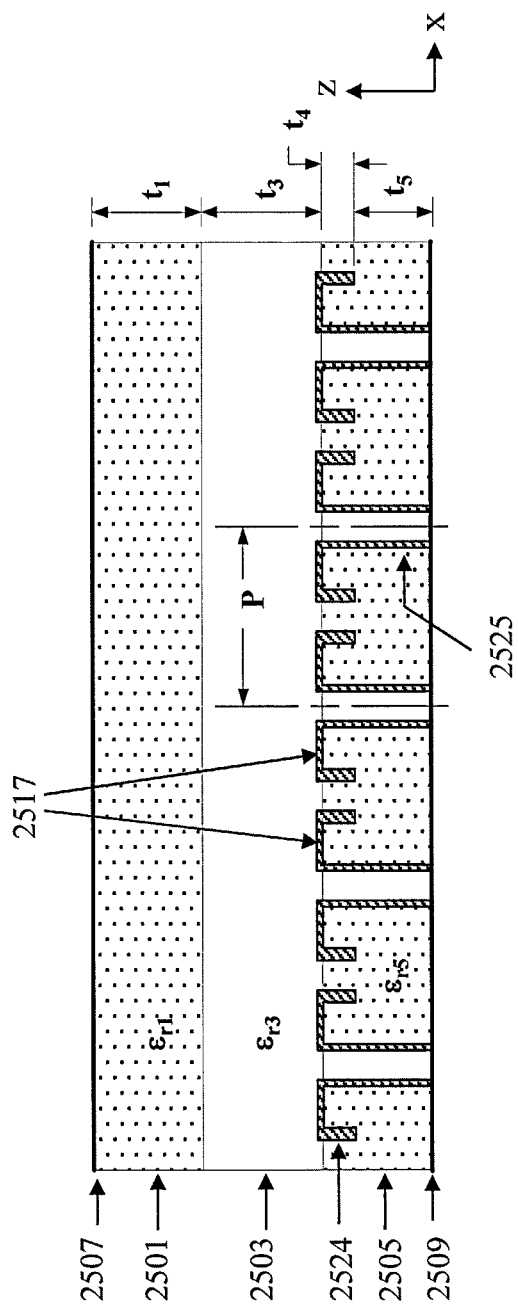
FIG. 25 shows an example that may be modeled by the effective medium model of FIG. 22 and is an EBG structure with 3D patches that have vertical sidewalls.

The conductive inclusions 2724 of FIG. 27 may be physically small with respect to a TE mode guide wavelength in the PPW. A typical maximum lateral dimension (in the x or y directions) may be about ⅙ of the guide wavelength. The conductive inclusions 2724 may have any arbitrary 3D shape including planar polygonal patches, rectangular bricks (as shown in FIG. 24), truncated pyramids (as shown in FIG. 26), circular cylinders, and many other shapes. The inclusions 2724 may be arrayed in a random pattern or may have regular periodic pattern. If periodic, they may exhibit multiple periods and they may have different periods in different principal axes (such as the Cartesian x and y axes). The purpose of the conductive inclusions 2724 is to concentrate the energy of the TE mode, in the form of its transverse electric field, in the generally locally planar region occupied by the array of conductive inclusions.

The resistances 2725 are used to absorb energy of the TE modes. As will be shown below, the TE mode most attenuated by the plurality of resistances 2725 is the fundamental mode, or lowest frequency mode, which is denoted as mode 1.

The random arrangement of conductive inclusions, and differing geometries of each inclusion, and the resistive connections therebetween emphasize that the metamaterial aspects of the structure may be represented by an effective medium model where, for example, a sheet resistance and sheet capacitance are determined by measurement or analysis, and the electromagnetic properties of the composite structure are then determined by electromagnetic analysis. Since the analysis is easier to perform and understand using regular shaped and spaced structures, analytic results and the discussion herein often uses the regular structures for quantitative analysis; however, it is emphasized that this is not meant to limit the techniques or structures for designing and forming an effective metamaterial EBG structure.

In addition, while the simulations are shown in many cases for what is an array of extent that may appear to fill the planar cross section of the package, this is for convenience in presentation only. As may be seen in FIG. 1(b), the EBG structures may occupy only a portion of the package. Moreover, the high attenuation per guide wavelength that may be achieved tends to result in a suppression of the fundamental mode throughout the package although only a portion of the package area may be occupied by the EBG structure. The EBG structure may be incorporated into the layer containing the circuitry, or be positioned on the plate of the PPW that opposes the layer containing the circuitry.

Figure 28:
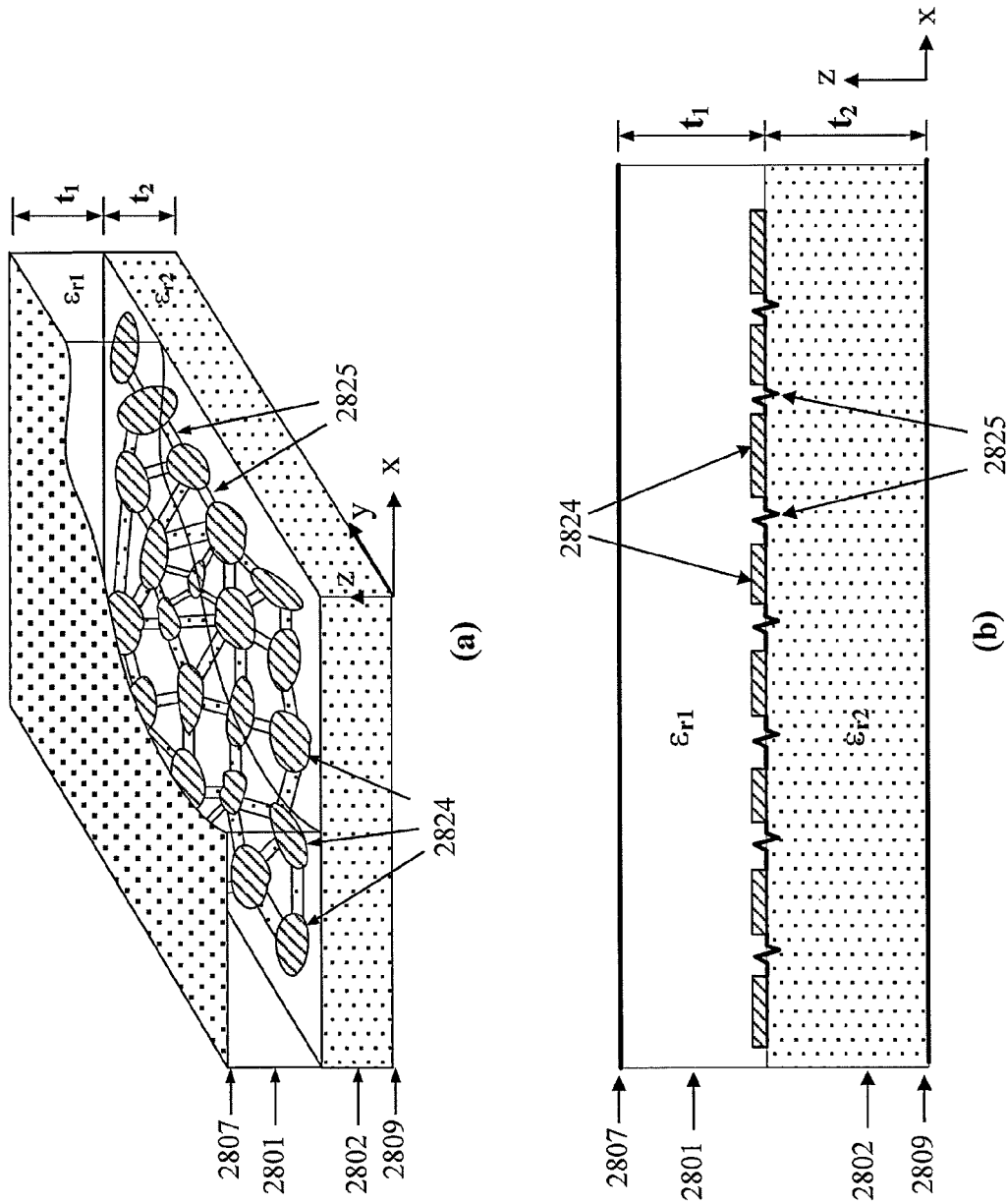
FIG. 28(a) shows a perspective view of an example of a TE mode suppression structure with planar conductive inclusions of arbitrary shape, (b) shows a representative profile view of the TE mode suppression structure.

FIG. 28(a) shows a perspective view an example where the PPW is formed by parallel conductive surfaces 2807 and 2809. To illustrate the features of FIG. 28, the upper dielectric region 2801 is shown as transparent in the figure while the lower dielectric region 2802 is drawn as opaque in the figure. The 3D conductive inclusions may be reduced to a special case of planar polygonal patches, 2824. In general, these patches 2824 may be non-identical in size and shape, and they may be randomly arranged on the surface of the lower dielectric region 2802. A plurality of discrete resistances 2825 is arranged to interconnect the conductive patches 2824. These resistances 2825 may not necessarily have the same value of resistance. Furthermore, their size and shape may differ. FIG. 28(b) shows a representative profile view of the same example where conductive patches 2824 are interconnected by resistances shown schematically as 2825.

The resistances 2825 of FIGS. 28(a) and 28(b) may be realized with a variety of technologies. For example, the resistances may be thin film resistors or thick film resistors depending on the preferred manufacturing method. The materials used to realize resistive films can include carbon, polysilicon, nickel chromium (NiCr), tantalum nitride (TaN), ruthenium dioxide ($RuO_2$), bismuth ruthenate ($Bi_2Ru_2O_7$), and bismuth iridate ($Bi_2Ir_2O_7$). Resistances 2825 can be realized with surface mounted technology (SMT), or as discrete resistors with wire leads. The physical size of the resistances 2825 is also small relative to a TE mode guide wavelength with maximum dimensions on the order of about ⅙ of a guide wavelength over the frequency range of interest where TE mode suppression is desired. Resistive sheets or patches may also be used.

Figure 29:
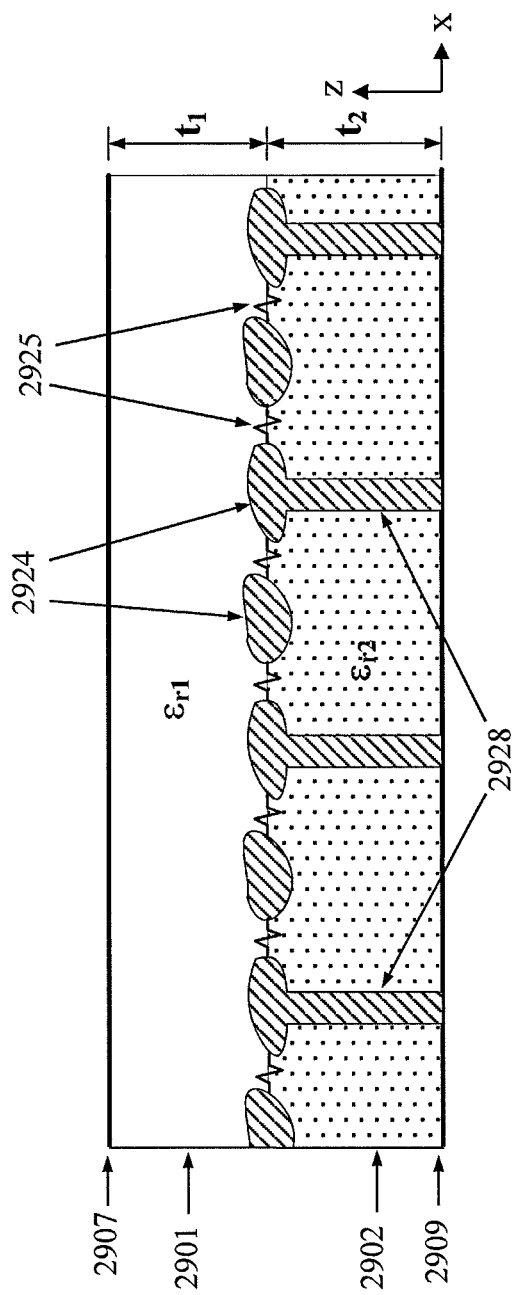
FIG. 29 shows a profile view of another example of a TE mode suppression structure including conductive vias in the lower dielectric region.

FIG. 29 shows another example of a TE mode suppression structure where conductive vias 2928 are added to the PPW of FIG. 27 to connect a subset of the conductive inclusions 2924 to one of the conductive plates 2909 of the PPW. The conductive vias may allow suppression of the TM mode over a desired stopband, as shown in previous examples. In general, the vias may not be identical in size or cross sectional shape, nor need they be periodic. The conductive vias 2928 may have only a weak interaction with the TE modes (which have modal fields of $E_y$, $H_x$, and $H_z$ assuming propagation in the x direction).

The reason for weak interaction can be understood as follows. If the average plan view area occupied by the vias is small with respect to the total plan view area of dielectric region 2, then the electric polarizability of the vias will be weak and the effective transverse permittivity of region 2 will be close to $\in_{r2}$, the host permittivity. Also, the magnetic polarizability of the vias will be weak, making the transverse permeability of region 2 close to the non-magnetic host permeability of $\mu_0$. Therefore $H_x$ will be essentially unaffected by the conductive vias 2928.

Figure 30:
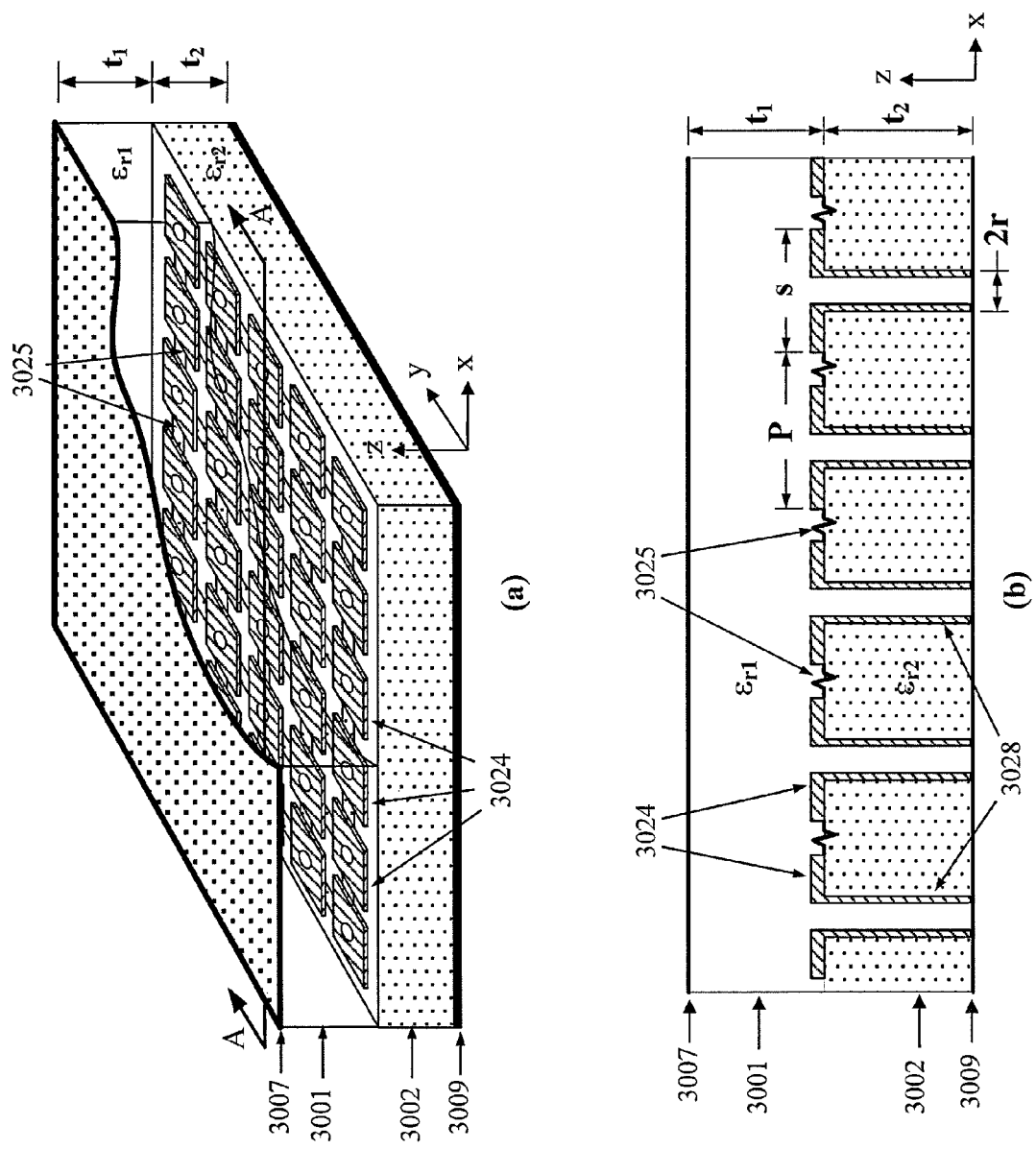
FIG. 30(a) shows a perspective view of an example of a TE mode suppression structure having a 2D periodic array of conductive inclusions, (b) shows a profile view of the same embodiment for section AA.

It may be more convenient to design and fabricate an ordered structure as opposed to a completely random structure that has a similar function. FIG. 30(*a*) shows a perspective view of another example of TE mode suppression where the conductive inclusions are implemented as a 2D periodic array of rectangular patches 3024 arranged in a rectangular lattice. FIG. 30(*b*) shows the cross sectional view at cut AA denoted in FIG. 30(*a*). Conductive vias 3028 connect each patch 3024 to the lower conductive plate 3009 of the PPW. Resistances 3025 interconnect adjacent patches 3024 in both the x and y directions. These resistances are responsible for absorption of the power in the fundamental TE mode.

Figure 31:
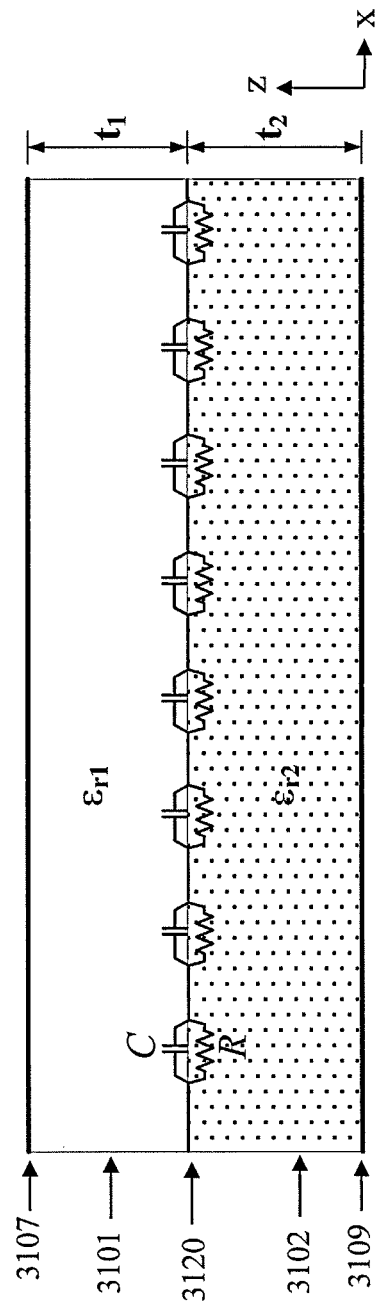
FIG. 31 shows a canonical parallel-plate waveguide (PPW) containing two dielectric layers with an impedance sheet located at the dielectric interface.

The operation of the previous four examples may be understood by analyzing the canonical inhomogeneous PPW shown in FIG. 31. Two non-magnetic, isotropic, dielectric regions 3101 and 3102 of different thickness and permittivity are used. This PPW has a thin isotropic impedance sheet 3120 located at the interface between the dielectric regions. For purposes of this analysis the sheet thickness is ignored. The impedance sheet 3120 is characterized by a distributed capacitance C in Farads/square and a distributed resistance R in Ohms/square. The impedance sheet of FIG. 31 is assumed to be isotropic; thus, the R and C values are independent of direction. However, this is not a limitation as it is possible to make a direction dependent TE mode suppression structure. That is, in the present example, the impedance sheet may be uniform such that impedance value is constant with varying position. However, this also is not a limitation as it is possible to design R=R(x,y) and C=C(x,y) where x and y specify the lateral position. Passing through the impedance sheet 3120, the tangential electric field is continuous, but the magnetic field is discontinuous by the amount of the induced current density on the sheet. The impedance sheet 3120 may be represented by a mathematical model that allows the physical complexity of the plurality of conductive inclusions and interconnecting resistances to be represented by a simple homogeneous model. Note that R and C are effective parameters that arise due to the aggregate E and H fields surrounding the plurality of conductive inclusions.

The effective resistance R in Ohms per square of the impedance sheet model, and $R_{film}$, the resistance in Ohms per square of a resistive film located between conductive patches may be different. The values are related through the geometry and the material properties. Consider the 2D periodic array of square conductive patches 3224 and resistors 3225 in FIG. 32(*a*). Because the periodic array in this example is a square lattice of square patches, the effective resistance R is the net resistance between two adjacent patches treated as an isolated pair.

$$R = R_{film}\frac{g}{w} = R_{film}\frac{P-s}{w} \quad (50)$$

Figure 32:
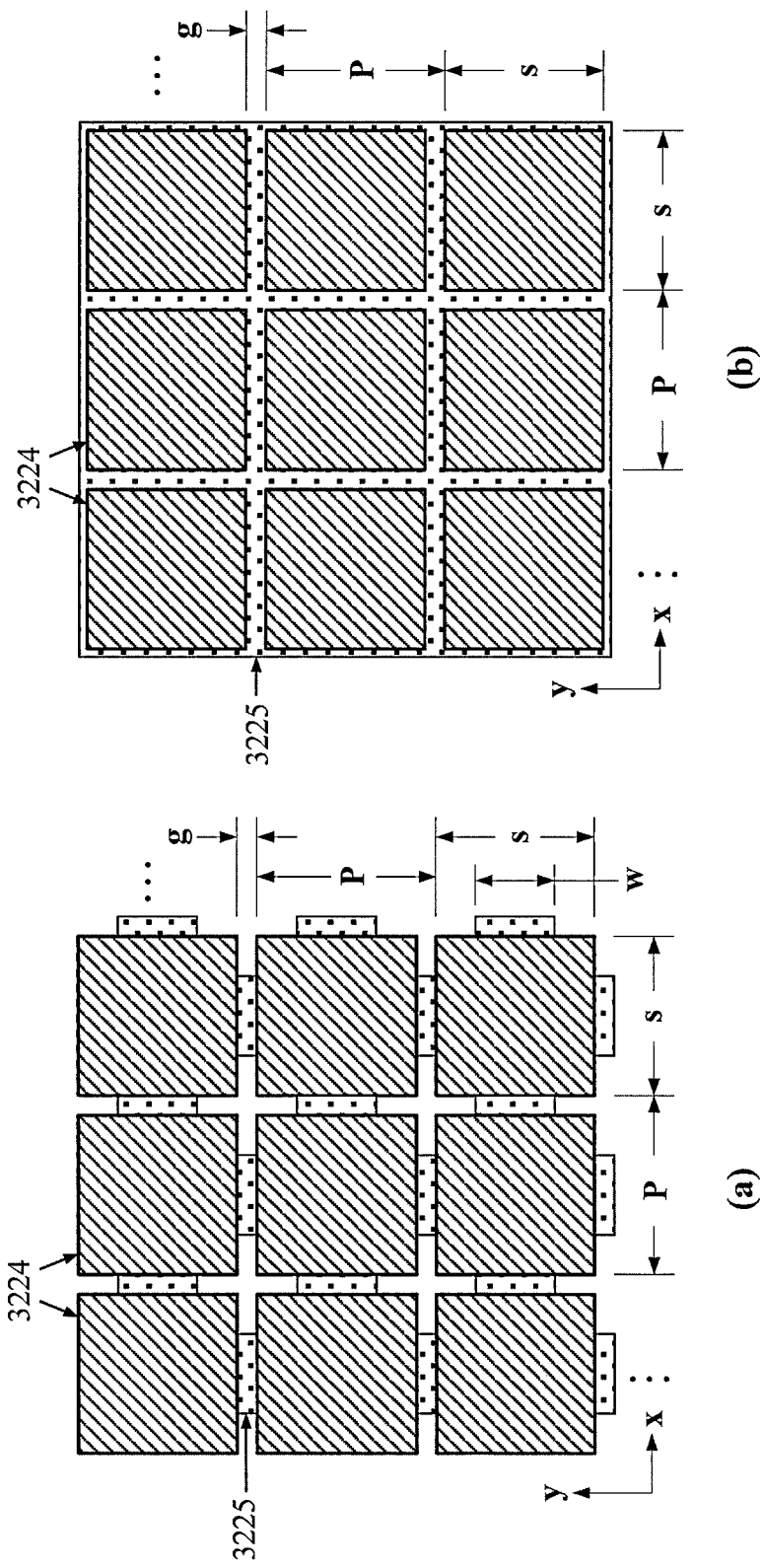
FIG. 32(a) shows a plan view of a periodic capacitive FSS comprised of conductive squares and isolated resistors in the gaps, (b) shows a plan view of a periodic capacitive FSS with a continuous resistive film between the patches.

FIG. 32(*b*) shows an alternative design for a lossy sheet impedance where the resistive film 3225 is a continuous film that fills all the area between isolated conductive patches. In this limiting case the sheet resistance is approximated by $$R \cong R_{film}\frac{g}{s} = R_{film}\frac{P-s}{s} \quad (51)$$

For example, assume a capacitive FSS that has a square lattice with a period P of 1 mm, a patch size s of 0.85 mm and a continuous film of value 4000 Ohms per square that fills all of the gap area. Using equation (51) the effective sheet resistance becomes approximately R=706 Ohms. To achieve a higher value of R the resistive film may be patterned in the gaps, with holes or slots, as shown in FIG. 32(*a*).

Assume the thickness of the resistive film is t and the bulk conductivity of the film is σ. If the RF skin depth δ of the film material is large compared to t, (for example δ>3t) then the value of the film resistance can be approximated as:

$$R_{film} = \frac{1}{\sigma t}. \quad (52)$$

Alternatively, the effective resistance R in Ohms per square may also be provided using discrete resistors such as surface mounted resistors or leaded resistors of value R connecting adjacent patches in the periodic square lattice.

In general, for a periodic lossy FSS arrayed as a square lattice, the sheet capacitance and sheet resistance can be calculated from equations (30b) and (30c) which requires one full-wave simulation of the FSS with the resistive losses modeled.

To analyze TE modes in the PPW of FIG. 31, assume wave propagation in the +x direction. One may solve for the TE mode complex propagation constant $k_x=\beta-j\alpha$ where physical solutions for $k_x$ lie only in the fourth quadrant of the complex $k_x$ plane. Again, the transverse resonance method can be used to solve for the TE mode dispersion equation. Assume the reference plane is the plane containing the impedance sheet, and set the total admittance at that reference plane to zero. This yields a dispersion equation of the form:

$$0 = \frac{1}{R} + j\omega C - jY_{o1}(\omega, k_{z1})\cot(k_{z1}t_1) - jY_{o2}(\omega, k_{z2})\cot(k_{z2}t_2) \quad (53)$$

where R and C are the per square resistance and capacitance of the impedance sheet. The TE mode wave admittances are given as:

$$Y_{o1,2}(\omega, k_{z1,2}) = \frac{k_{z1,2}(\omega, k_x)}{\omega\mu_o} \quad (54)$$

where the z directed propagation constants for regions 1 and 2 are given by:

$$k_{z1,2}(\omega, k_x) = \begin{cases} \sqrt{\left(\frac{\omega}{c}\right)^2 \varepsilon_{r1,2} - k_x^2} & \text{if } \operatorname{Re}(k_x) < \left(\frac{\omega}{c}\right)\sqrt{\varepsilon_{r1,2}} \\ -j\sqrt{k_x^2 - \left(\frac{\omega}{c}\right)^2 \varepsilon_{r1,2}} & \text{otherwise} \end{cases} \quad (55)$$

This definition for $k_{z1,2}$ forces the fields to be exponentially decaying when $$\operatorname{Re}(k_x) > \left(\frac{\omega}{c}\right)\sqrt{\varepsilon_{r1,2}}.$$

When equations (54) and (55) are substituted into the dispersion equation (53) then the remaining variables are the frequency ω and the complex propagation constant $k_x$. If frequency is held constant, then a numerical root finder can be used to solve for $k_x$. One computational approach that may works well is to begin near zero frequency and solve for the complex $k_x$. Then the frequency is incremented and the previous solution is used as an estimated value for the root finder. This process is repeated until the maximum frequency of interest is reached. Then the frequency versus the real and imaginary values of $k_x$ (β for α) may be plotted to graph the dispersion curves. This strategy requires a good initial estimate of the value for $k_x$ near zero frequency.

Fortunately, the required low frequency estimate has a closed form solution. The TE modes are all cut off at zero frequency, and the attenuation constant for the $n^{th}$ mode is given as:

$$\alpha = n\pi/(t_1+t_2) \text{ where } n=1,2,3,\ldots \text{ as } \omega \to 0 \quad (56)$$

Therefore a good initial estimate for the root finder is:

$k_x = -j\alpha = -jn\pi/(t_1+t_2)$ when seeking the $n^{th}$ TE mode.

Assuming the RC impedance sheet is capacitive (no resistive loss), then the cutoff frequencies can be calculated for all TE modes from the roots of the following equation $$\omega C\eta_o = \sqrt{\varepsilon_{r1}} \cot\left(\frac{\omega}{c}\sqrt{\varepsilon_{r1}} t_1\right) + \sqrt{\varepsilon_{r2}} \cot\left(\frac{\omega}{c}\sqrt{\varepsilon_{r2}} t_2\right) \quad (57)$$

which is derived from the dispersion equation (53) when $k_x=0$. Equations (53) and (57) are well behaved and may be solved with conventional root finders such as found in Mathcad, a general purpose computational tool available from Parametric Technology Corporation.

FIG. 33(a) shows the TE mode dispersion plot for an example of a lossless PPW of FIG. 31 where $\varepsilon_{r1}=\varepsilon_{r2}=6$, $t_1=2$ mm, $t_2=3$ mm, R is essentially infinite, and C takes on values of 0, 0.05 pF/sq., and 0.15 pF/sq. The dispersion plot includes six curves, three for mode 1 and three for mode 2. The straight diagonal line is the light line in the host dielectric of $\varepsilon_1=6$. Here, mode 1 becomes a slow wave in the host dielectric as C becomes nonzero. Slow waves (relative to the speed of light in the host dielectric) are distinguished by a locus that is found below the light line. Fast waves are found above the light line. Mode 2 remains a fast wave for all values of sheet capacitance. An important effect is shown in FIG. 33(b). The use of a capacitive FSS decreases the TE mode cutoff frequency for both modes 1 and 2. However, the fundamental mode is affected to a much greater degree. When changing from C=0 to C=0.15 pF/sq., mode 1 decreases 32.6% from 12.24 GHz to 8.25 GHz while mode 2 decreases only 10.1% from 24.48 GHz to 22.0 GHz. Note that a capacitive FSS may be used to realize an EBG structure that will suppress TM modes. However, this same capacitive FSS may degrade the stopband bandwidth for the fundamental TE mode. In an aspect, the degradation may be mitigated by incorporating resistive loss into the capacitive FSS.

Figure 34:
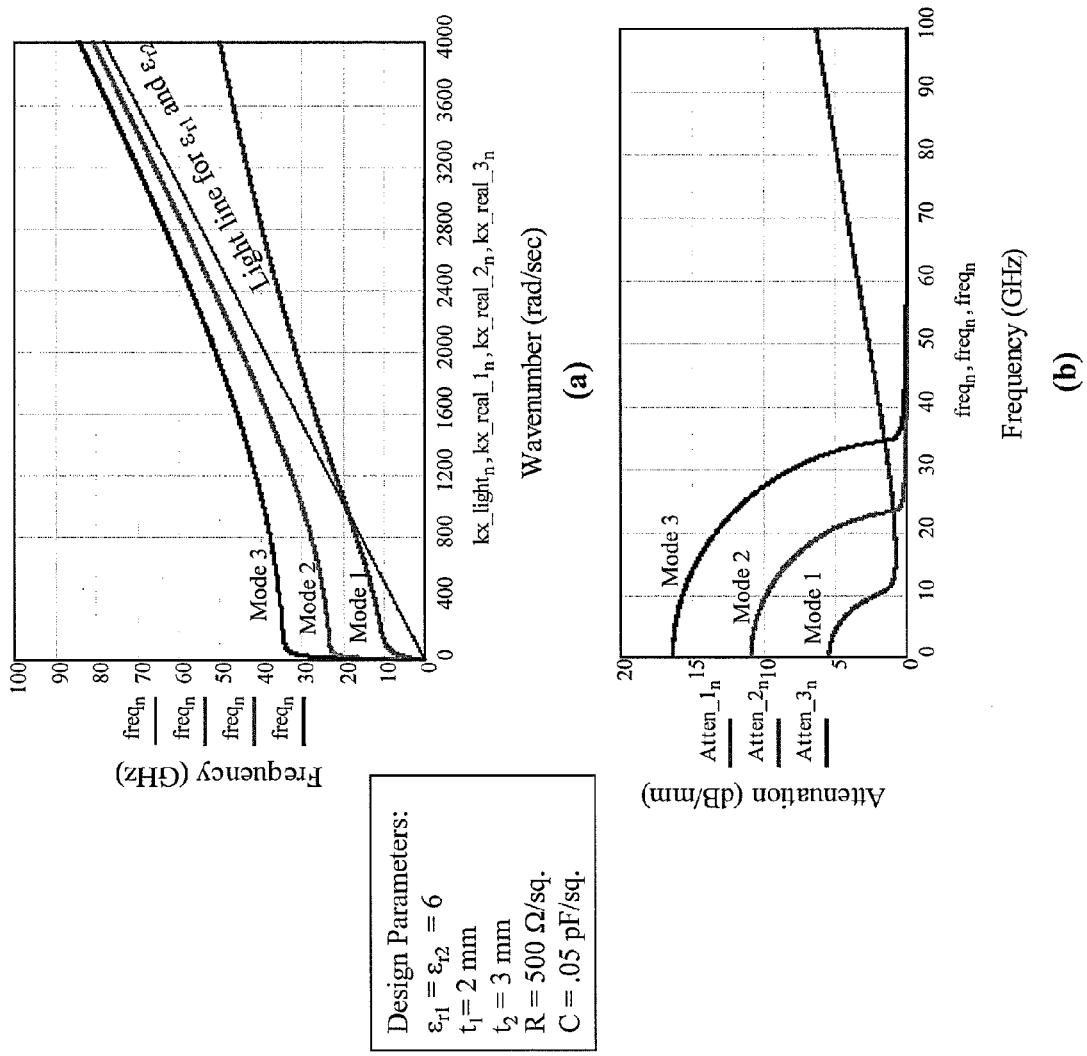
FIG. 34(a) shows a dispersion plot of the three lowest order TE modes in the PPW of FIG. 31 where $\in_{r1}=\in_{r2}=6$, $t_1=2$ mm, $t_2=3$ mm, R=500 Ω/sq., and C=0.05 pF/sq.; and, (b) shows the attenuation plot for these same modes.

FIG. 34 illustrates the effect of adding resistive loss to the previous example, where $\varepsilon_{r1}=\varepsilon_{r2}=6$, $t_1=2$ mm, $t_2=3$ mm. In FIG. 34, R=500 Ω/sq. and C=0.05 pF/sq. FIG. 34(a) shows the dispersion plot for the lowest three TE modes where only mode 1 becomes a slow wave, for frequencies above 20 GHz. FIG. 34(b) shows that the mode 1 attenuation may not go to zero as frequency increases. In contrast the attenuation functions for modes 2 and 3 do go to approximately zero above their respective cutoff frequencies. The mode 1 attenuation may be characterized as evanescent below approximately 10.45 GHz, which would be the cutoff frequency assuming no resistive losses and C=0.05 pF/sq., and the attenuation is characterized by absorptive loss above this frequency. FIG. 34(b) that all TE modes are suppressed to some degree up to the mode 2 cutoff frequency near 23 GHz.

Figure 35:
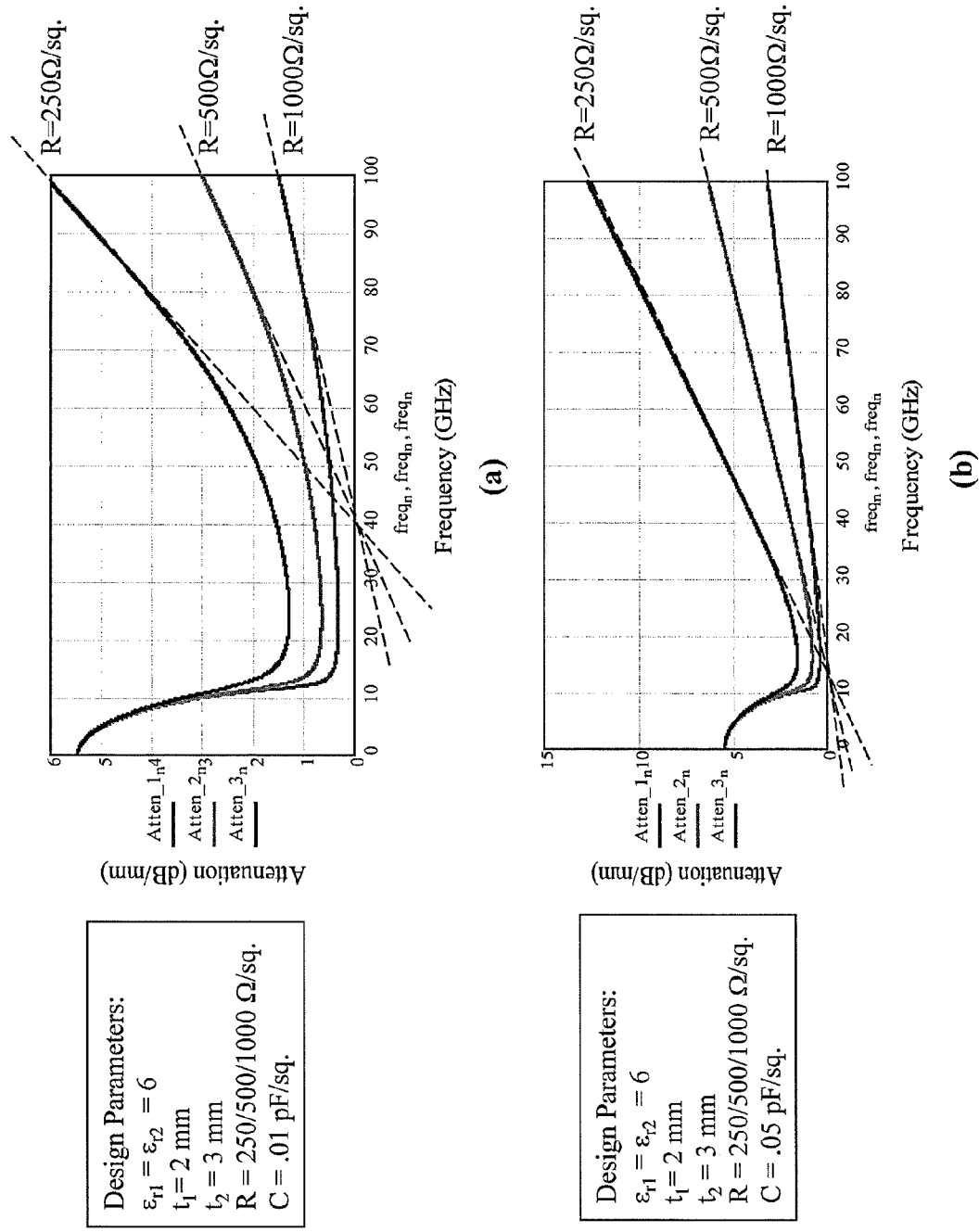
FIG. 35(a) shows the attenuation plot of the dominant TE mode in the PPW of FIG. 31 where $\in_{r1}=\in_{r2}=6$, $t_1=2$ mm, $t_2=3$ mm, C=0.01 pF/sq., and R=250 Ω/sq., 500 Ω/sq., and 1000 Ω/sq.; and, (b) shows the attenuation plot of the dominant TE mode in the PPW of FIG. 31, where $\in_{r1}=\in_{r2}=6$, $t_1=2$ mm, $t_2=3$ mm, C=0.05 pF/sq., and R=250 Ω/sq., 500 Ω/sq., and 1000 Ω/sq.

FIG. 35 show two plots of the fundamental mode (mode 1) attenuation function where R is varied from 250 Ω/sq. to 1000 Ω/sq. Again the dielectric regions are characterized as $\varepsilon_{r1}=\varepsilon_{r2}=6$, $t_1=2$ mm, $t_2=3$ mm. In FIG. 35(a) the sheet capacitance is 0.01 pF/sq., and in FIG. 35(b) it is 0.05 pF/sq. In both attenuation plots it may be seen that the attenuation level increases as the sheet resistance is decreased. Straight line asymptotes have been drawn on these plots to illustrate that the high frequency attenuation constant (in dB/mm) may be well predicted with a simple linear equation in frequency. The high frequency asymptotes appear to intersect at a fixed frequency. If one begins with the dispersion equation (53) and applies numerous numerical approximations, then at high frequency, the mode 1 attenuation function may be approximated as:

$$\alpha(\omega) = \frac{\omega\mu_o}{2R\left[1 + \frac{2\varepsilon_{avg}}{(\omega C\eta_o)^2}\right]} \text{(Nepers/m) as } \omega \to \infty \quad (58)$$

Note that α(ω) may be multiplied by 8.686 to convert from Nepers to dB and divided by 1000 to convert to dB per mm. Equation (35) shows that the mode 1 attenuation function increases linearly with frequency (well above the TE mode 1 cutoff frequency), and that both the sheet resistance and sheet capacitance play a role. The high frequency attenuation is inversely proportional to sheet resistance R, and it is seen to increase with increasing sheet capacitance C. Increasing C will increase the attenuation until the normalized susceptance $\omega C\eta_0$ reaches the value of about $\sqrt{2\varepsilon_{avg}}$ where the average dielectric constant is $\varepsilon_{avg}=(\varepsilon_{r1}+\varepsilon_{r2})/2$. Further increases in C will have a smaller effect on the fundamental mode attenuation. However, the attenuation constant can be increased by lowering the sheet resistance R.

The addition of the resistive sheet perturbs the TE mode 1 attenuation function for the otherwise lossless PPW. Below the fundamental mode cutoff, the attenuation is essentially evanescent. Above this cutoff frequency, attenuation will be absorptive. The absorptive attenuation increases monotonically as R is decreased. Furthermore, the absorptive attenuation increases as the value of the sheet capacitance is increased.

Figure 33:
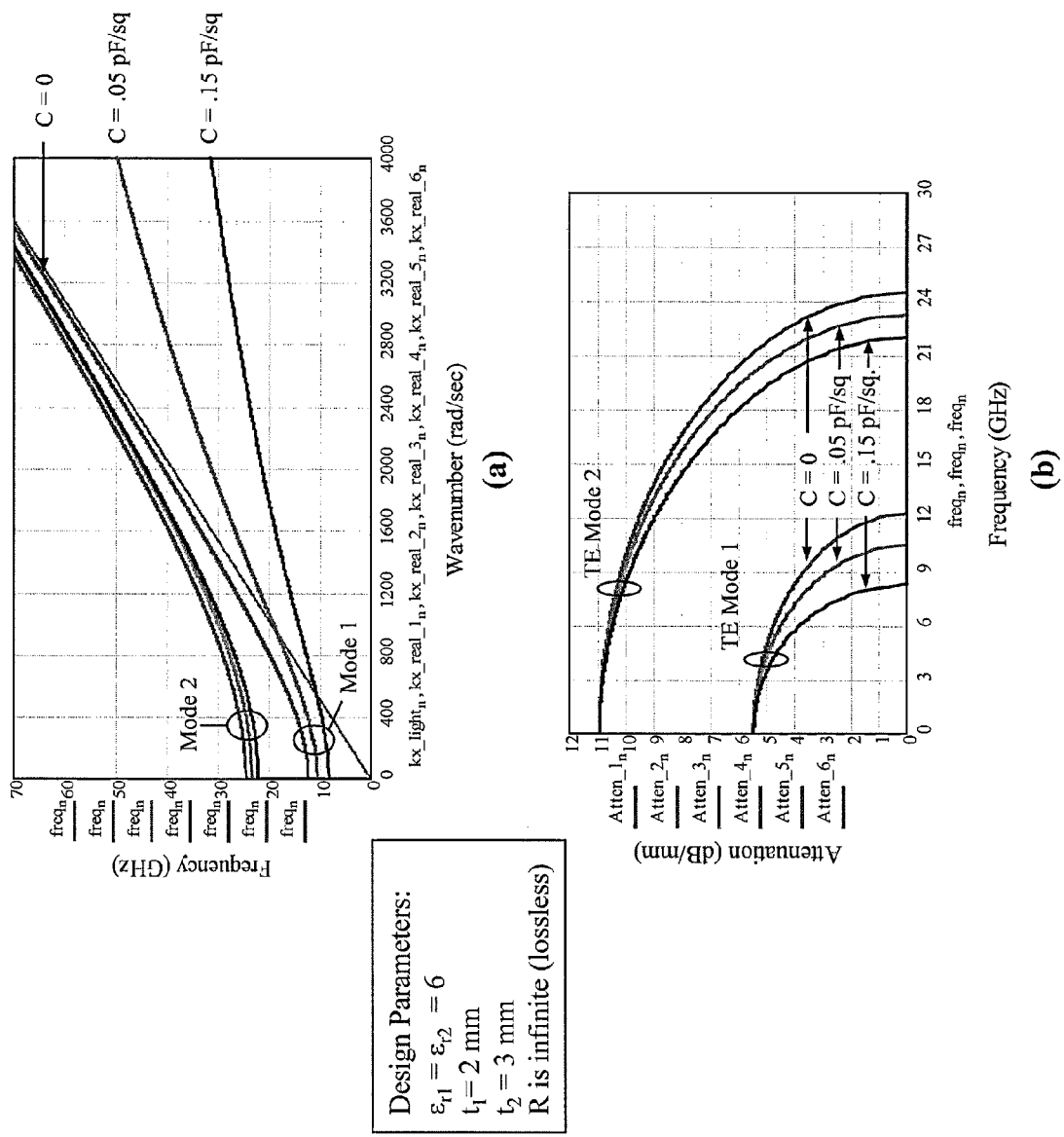
FIG. 33(a) shows a dispersion plot of the two lowest order TE modes in the PPW of FIG. 31 where $\in_{r1}=\in_{r2}=6$, $t_1=2$ mm, $t_2=3$ mm, no R and C=0, 0.05 pF/sq., and 0.015 pF/sq.; and, (b) shows the attenuation plot for these two modes.

FIGS. 33, 34, and 35 illustrated the effect on TE mode attenuation of adding resistive loss to a homogeneous PPW where $\in_{r1}=\in_{r2}$. However, there are many practical applications where the PPW is inhomogeneous ($\in_{r1}\neq\in_{r2}$) including important cases where the PPW comprises a shielded air-cavity RF package. To help understand the TE mode suppression which may obtain for this application, assume the package is 5 mm tall and filled with a 1 mm thick substrate such that that the dielectric regions have $\in_{r1}=1$, $\in_{r2}=6$, $t_1=4$ mm, $t_2=1$ mm. This will be the case for FIGS. 36-40.

Figure 36:
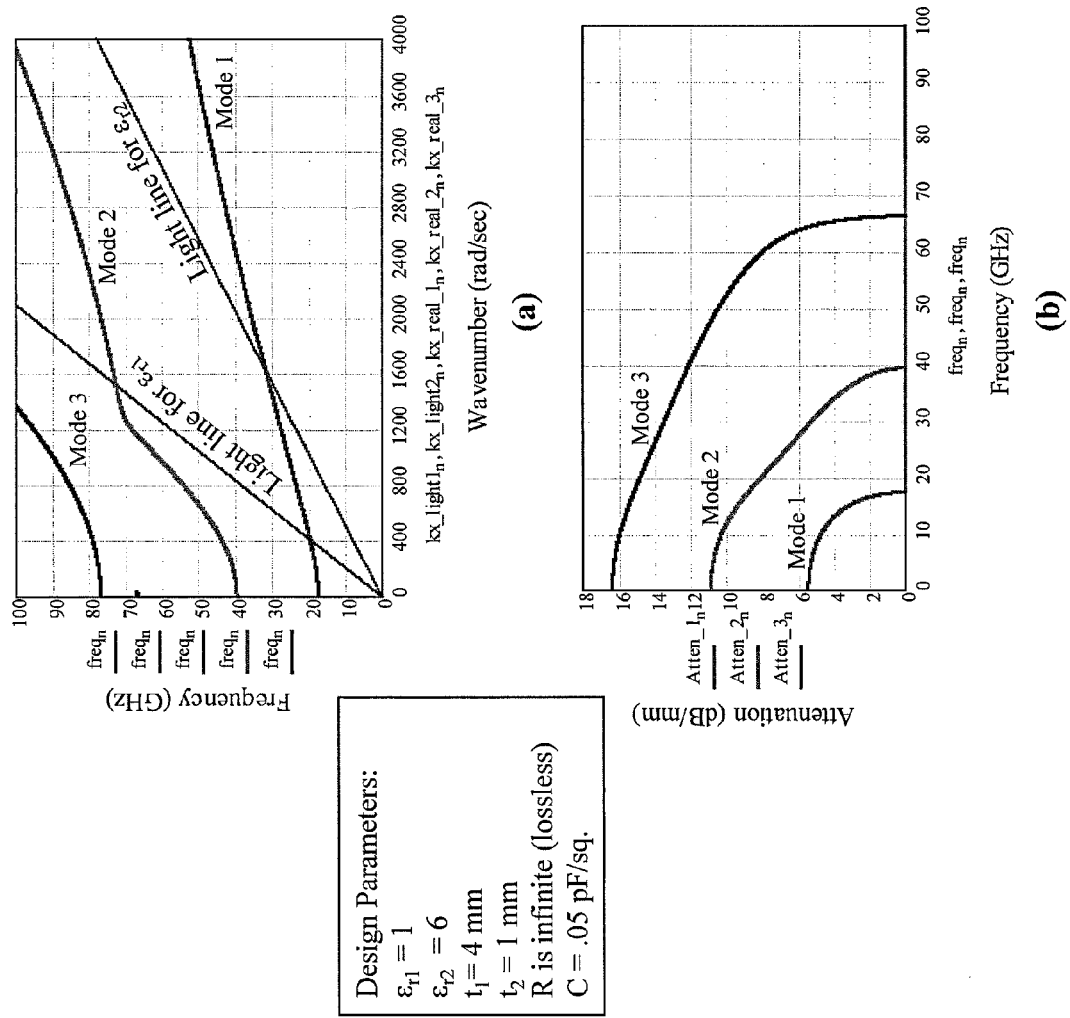
FIG. 36(a) shows a dispersion plot of the three lowest order TE modes in the PPW of FIG. 31 where $\in_{r1}=1$, $\in_{r2}=6$, $t_1=4$ mm, $t_2=1$ mm, no R but C=0.05 pF/sq.; and, (b) shows the attenuation plot for these same modes.

FIG. 36 shows the propagation constant for a lossless (R=∞) PPW where C=0.05 pF/sq. FIG. 36(*a*) shows the dispersion plot for the lowest three TE modes where all modes are cutoff below 17.5 GHz, the mode 1 cutoff frequency. In this dispersion plot, the fundamental mode becomes a slow wave relative to both dielectric regions as it crosses both light lines. Mode 2 is a fast wave in the air region for frequencies below about 70 GHz. Above this frequency it becomes more attached to the substrate as its locus becomes asymptotic to the light line for the substrate ($\in_{r2}$). Mode 3 is a fast wave in the air region as it becomes asymptotic to the light line in air ($\in_{r1}$). FIG. 36(*b*) shows the attenuation function for these modes.

Figure 37:
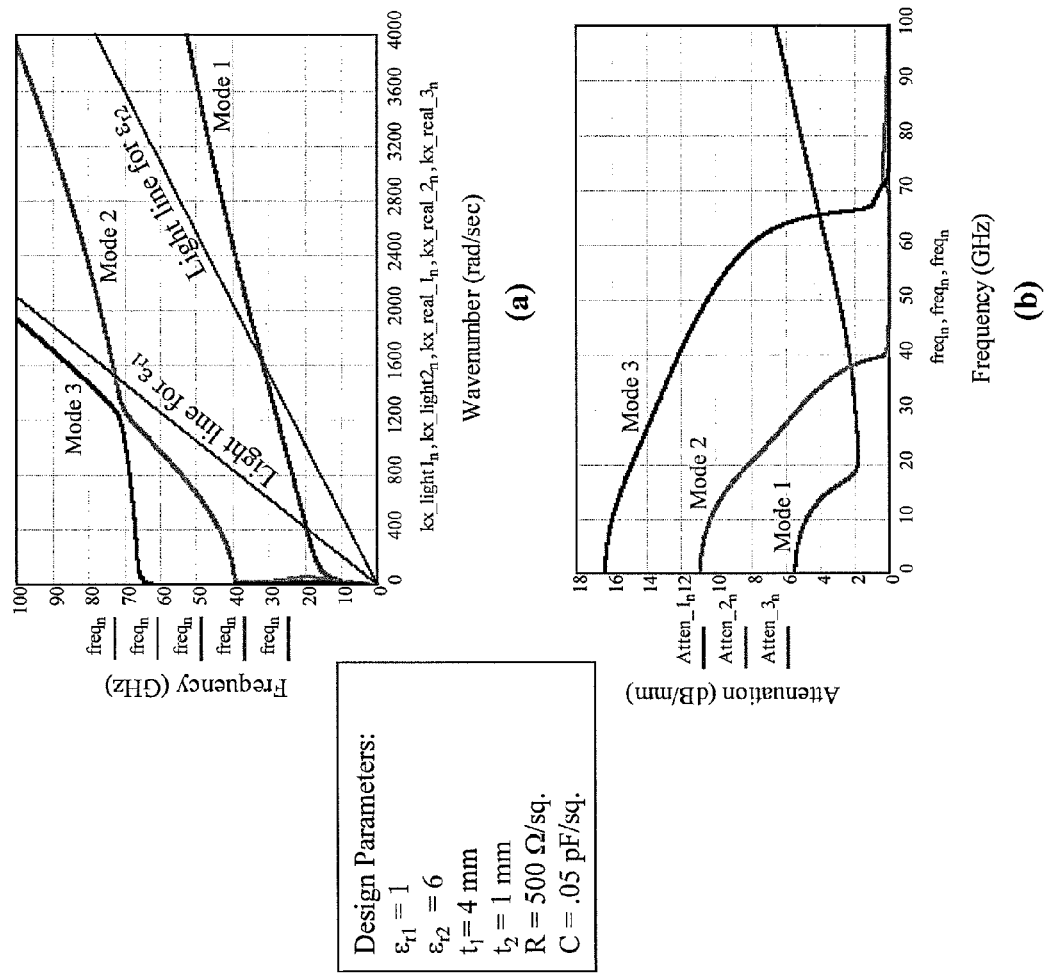
FIG. 37(a) shows a dispersion plot of the three lowest order TE modes in the PPW of FIG. 31 where $\in_{r1}=1$, $\in_{r2}=6$, $t_1=4$ mm, $t_2=1$ mm, R=500 Ω/sq., C=0.05 pF/sq.; and, (b) shows the attenuation plot for these same modes.

The results for a sheet resistance R of 500 Ω/sq. are plotted in FIG. 37. In the dispersion plot of FIG. 37(*a*), β, the real part of $k_x$, is essentially unchanged for modes 1 and 2. However, mode 3 becomes tightly coupled to mode 2 near 70 GHz. The attenuation plot of FIG. 37(*b*) reveals that modes 2 and 3 are cutoff until near 40 GHz and 66 GHz respectively. Above these frequencies these two modes will propagate with little attenuation. Mode 1 experiences evanescent mode attenuation up to about 17.5 GHz and then absorptive attenuation dominates above 20 GHz. The mode 1 attenuation exceeds about 1.9 dB/mm over a frequency range of at least 100 GHz. All TE modes are attenuated up to 40 GHz which is the TE mode 2 cutoff frequency.

Figure 38:
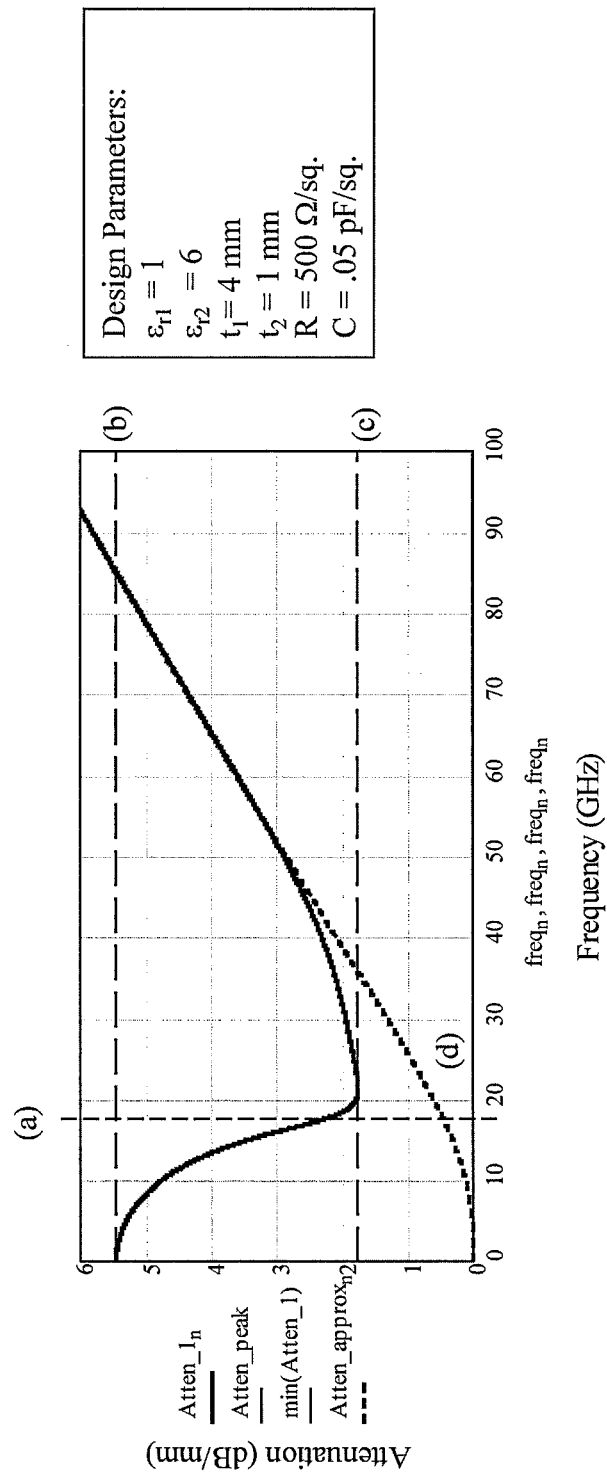
FIG. 38 shows the TE mode 1 attenuation plot from FIG. 37(b) along with limits and asymptotes.

A more detailed plot of the FIG. 37 (*b*) mode 1 attenuation function is shown in FIG. 38. The numerical solution of the dispersion equation (53) is the solid line. The dashed vertical line (a) denotes the fundamental mode cutoff frequency had there been no resistive component in the impedance sheet. It is found as the lowest root of equation (57). Note that this cutoff frequency of about 17.5 GHz is at the inflection point in the attenuation curve. Dashed line (b) is the zero frequency limit of 5.46 dB/mm as calculated from equation (56). The low frequency limit of the attenuation function, α(ω) as ω→0, is independent of the RC impedance sheet as well as the permittivity of the dielectric regions that fill the PPW. As shown in equation (56), it may be determined by the total height of the PPW.

Dashed line (c) is the minimum attenuation of 1.757 dB/mm calculated by sorting the numerical solutions of the dispersion equation (53), and the dotted line (d) is the high frequency approximation as given by equation (58). FIG. 38 shows that the above limits along with the high frequency approximation, equation (58), permits an estimate of the dominant mode attenuation function.

Figure 39:
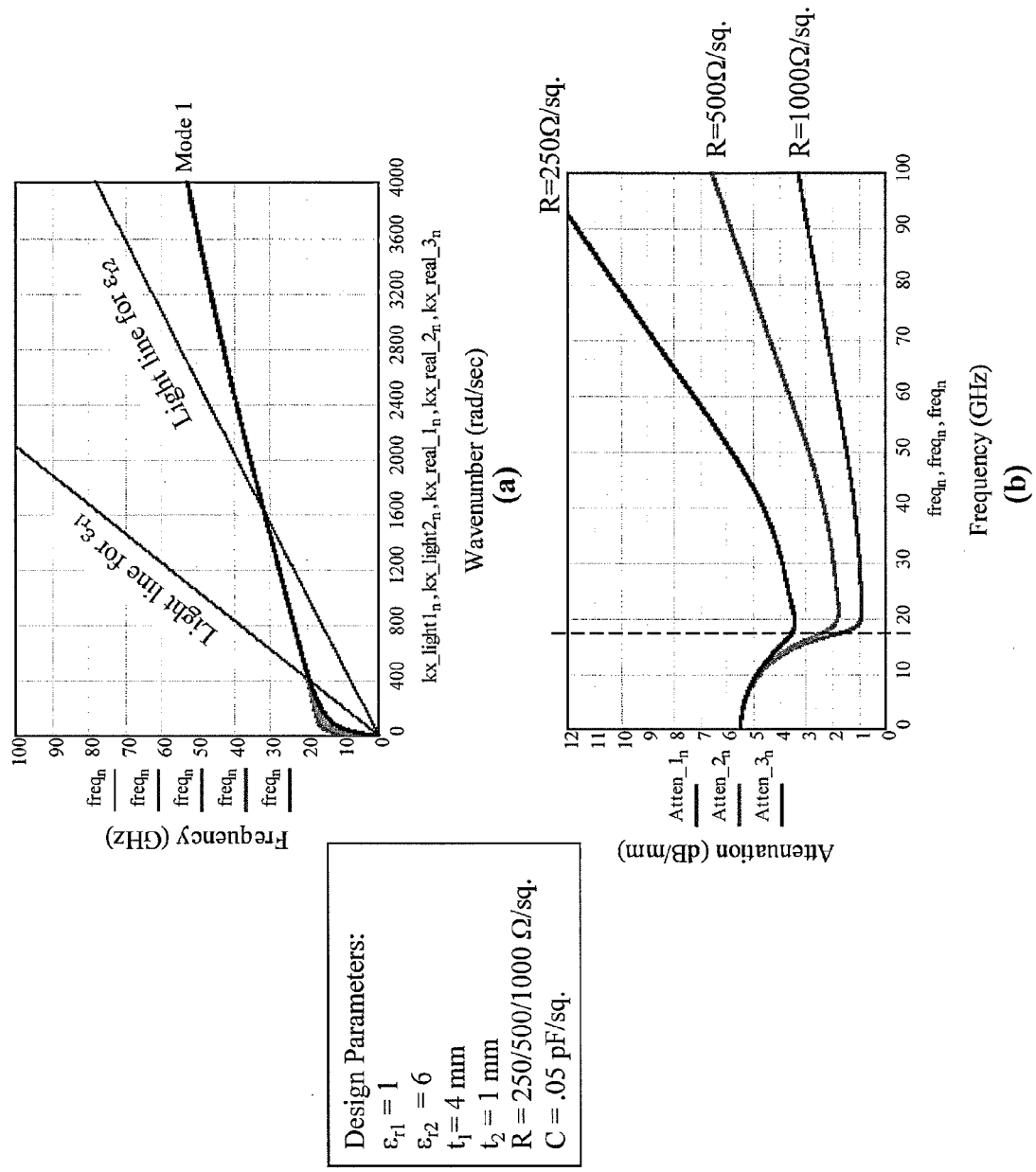
FIG. 39(a) shows the TE mode 1 dispersion plot for the PPW of FIG. 31 where $\in_{r1}=1$, $\in_{r2}=6$, $t_1=4$ mm, $t_2=1$ mm, R=250 Ω/sq., 500 Ω/sq., and 1000 Ω/sq., and C=0.05 pF/sq.; and, (b) shows the mode 1 attenuation plot for these same cases.

FIG. 39 shows a parametric study of the mode 1 propagation constant as a function of sheet resistance for R=250 Ω/sq., 500 Ω/sq., and 1000 Ω/sq. In the figure, C=0.05 pF/sq. In FIG. 39(*a*), the real part of $k_x$ is substantially unaffected by changes in sheet resistance and closely approximates the dispersion curve for a lossless PPW (see FIG. 36(*a*)). FIG. 39(*b*) shows a substantial increase in the TE mode attenuation (dB/mm) as the sheet resistance is decreased. This is very similar to the behavior of a homogeneous PPW as shown in FIG. 35. Covered EBG structures containing a resistive film coplanar with their patches will have enhanced attenuation of the TE mode because of the energy dissipated in this film. The dotted line in FIG. 39(*b*) is the mode 1 cutoff frequency assuming no losses. Note that that the dotted line appears to intersect the inflection points of each attenuation curve.

Figure 40:
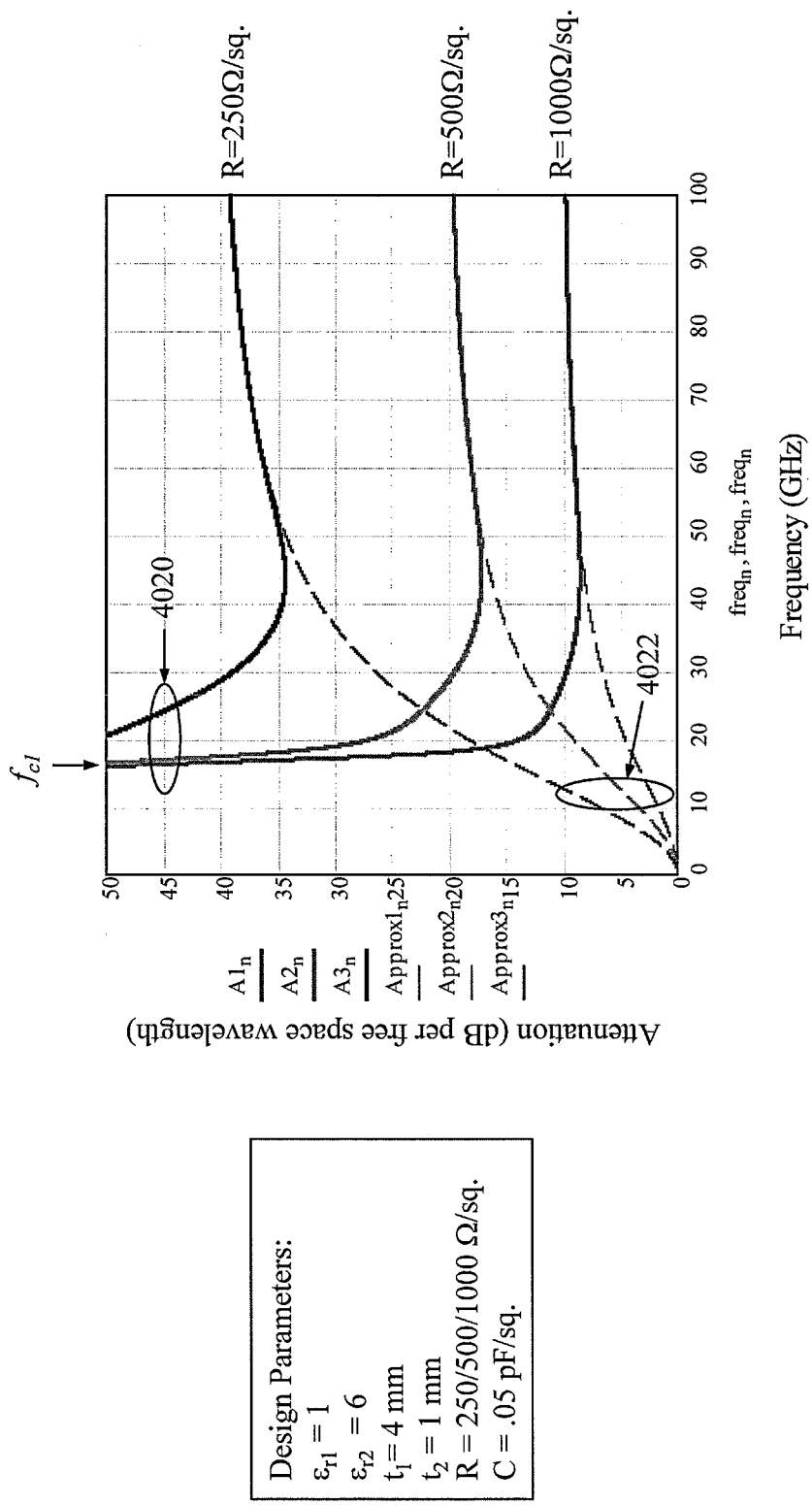
FIG. 40 shows the TE mode 1 attenuation in dB per free space wavelength for the PPW of FIG. 31, where $\in_{r1}=1$, $\in_{r2}=6$, $t_1=4$ mm, $t_2=1$ mm, R=250 Ω/sq., 500 Ω/sq., and 1000 Ω/sq., and C=0.05 pF/sq.

FIG. 40 shows the mode 1 attenuation function plotted in dB per free space wavelength for the three parametric cases of different sheet resistance of FIG. 39. The curves 4020 of FIG. 40 are the attenuation curves α(ω) of FIG. 39(*b*) multiplied by the free space wavelength $\lambda_0(\omega)$. These solid curves 4020 are the numerical solutions to the dispersion equation (53) for attenuation in dB per free space wavelength $\lambda_0$. Three different cases of sheet resistance are shown. The lighter dashed curves 4022 are the high frequency approximations to the attenuation function, equation (58), multiplied by the free space wavelength. Using equation (58) one can express the high frequency approximation for attenuation per free space wavelength as:

$$\alpha(\omega)\lambda_o = \frac{\omega\mu_o}{2R}\left[1+\frac{2\varepsilon_{avg}}{(\omega C\eta_o)^2}\right]^{-1}\frac{c}{f} = \pi\frac{\eta_o}{R}\left[1+\frac{2\varepsilon_{avg}}{(\omega C\eta_o)^2}\right]^{-1}. \quad (59)$$

Agreement is seen between the broadband numerical solution and the approximate expression for high frequencies above 3 times the dominant mode cutoff, $f_{c1}$~17.5 GHz. Furthermore, the attenuation per free space wavelength approaches a limit of $\pi\eta_0/R$ at infinite frequency. Equivalently, the attenuation in dB per free space wavelength approaches a constant limit of 8.686 $71\pi\eta_0/R$ at infinite frequency.

Figure 41:
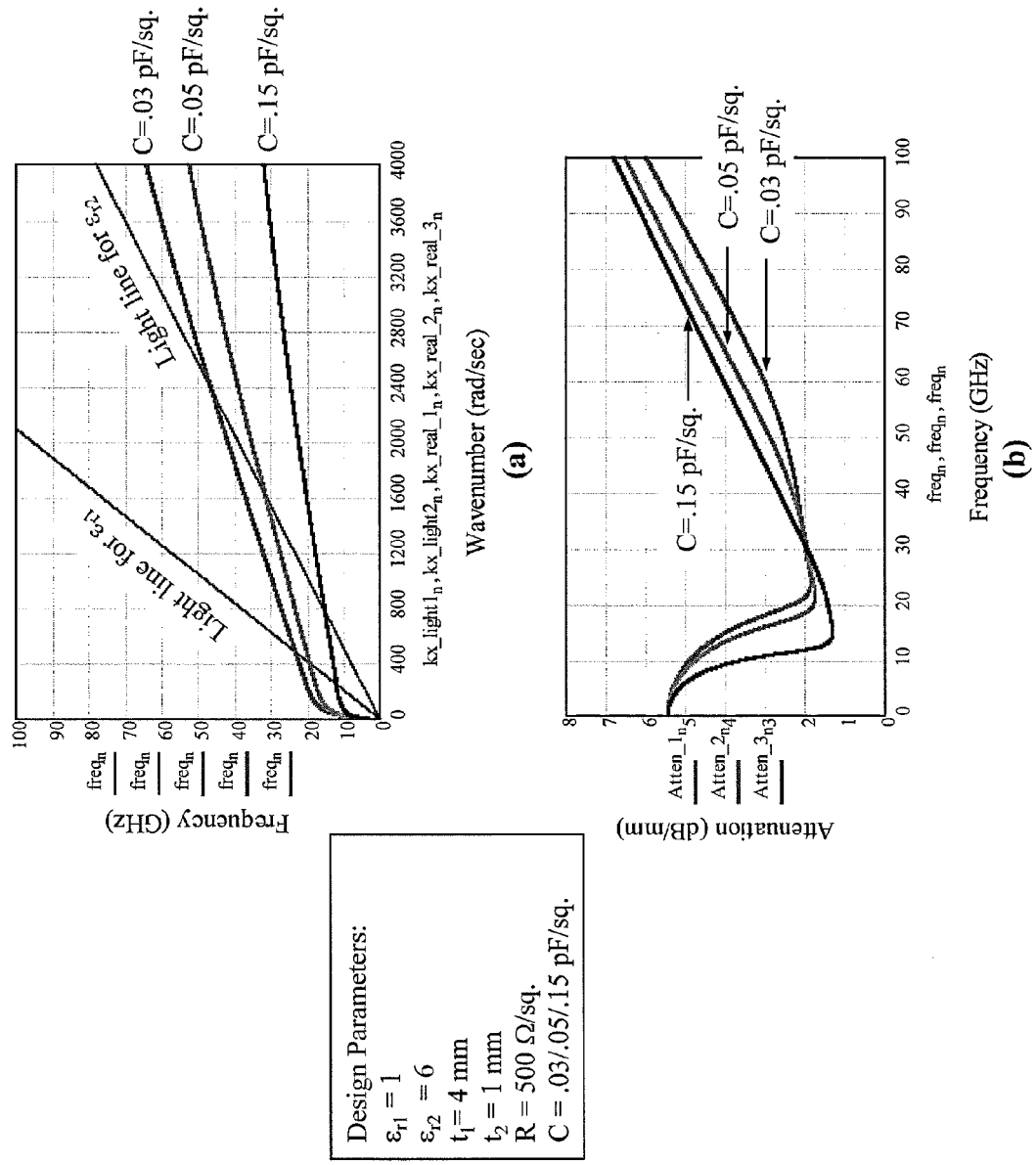
FIG. 41(a) shows the TE mode 1 dispersion plot for the PPW of FIG. 31 where $\in_{r1}=1$, $\in_{r2}=6$, $t_1=4$ mm, $t_2=1$ mm, R=500 Ω/sq., C=0.03 pF/sq., 0.05 pF/sq., and 0.015 pF/sq.; and (b) shows the mode 1 attenuation plot for these same cases.

FIG. 41 shows the fundamental TE mode and the effect of changing the effective sheet capacitance for a fixed value of sheet resistance. FIG. 41(*a*) shows that as the sheet capacitance is increased, mode 1 becomes a slower wave since β/ω increases. FIG. 41(*b*) shows that increasing the sheet capacitance will increase the attenuation level at high frequencies, but the attenuation may not always be monotonic near the mode 1 cutoff frequency.

Figure 42:
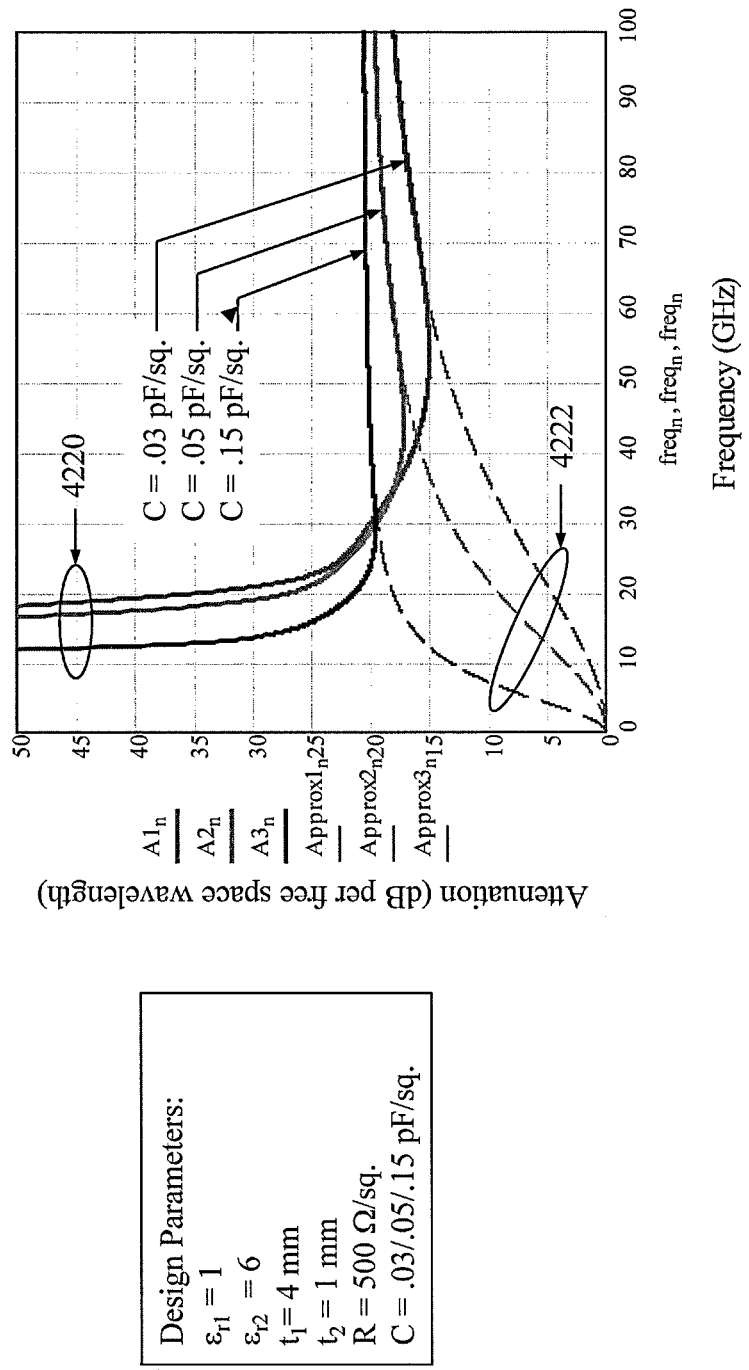
FIG. 42 shows the TE mode 1 attenuation in dB per free space wavelength for the PPW of FIG. 31, where $\in_{r1}=1$, $\in_{r2}=6$, $t_1=4$ mm, $t_2=1$ mm, R=500 Ω/sq., C=0.03 pF/sq., 0.05 pF/sq., and 0.015 pF/sq.

FIG. 42 shows the mode 1 attenuation function plotted in dB per free space wavelength for the three parametric cases of different sheet capacitance of FIG. 41. The curves 4220 of FIG. 42 are the attenuation curves α(ω) of FIG. 41(*b*) multiplied by the free-space wavelength $\lambda_0(\omega)$. These solid curves 4220 are the numerical solutions to the dispersion equation (53) for attenuation in dB per free space wavelength $\lambda_0$. Three different cases of sheet capacitance are shown. The lighter dashed curves 4222 are the high frequency approximations to the attenuation function, equation (58), multiplied by the free-space wavelength. This approximation is equation (59). Agreement is seen between the numerical solutions 4220 and the approximate expressions 4222 for frequencies above the relative minimum in the numerical solutions. Furthermore, the attenuation per wavelength approaches the constant limit of $\pi\eta_0/R$ or 20.56 dB at infinite frequency for all three curves. As the sheet capacitance is increased, the numerical solution relative minima approaches the high frequency limit of $\pi\eta_0/$ R. FIG. 40 shows that it is possible to achieve 20 dB of attenuation per free space wavelength for the fundamental TE mode over a frequency range of at least zero to about at least 100 GHz for the parameters of this example.

Design Method for TE Mode Suppression Structures with Two Dielectric Regions:

In an example, a method of designing a structure to suppress TE modes in a shielded RF package is described. The design objective is to calculate a suitable effective sheet impedance R and the value of the resistive film $R_{film}$. The design may be realized with the resistive film or discrete resistors. The design uses geometry of FIG. 31, and region 2 is a known substrate material. It is also assumed that the FSS has already been designed and that the FSS has at least one layer of square patches as illustrated in, for example, FIG. 32(a) or 32(b).

The following parametric values are used:
(a) the substrate dielectric constant $\in_{r2}$, and substrate thickness $t_2$,
(b) the effective sheet capacitance C,
(c) the highest frequency $f_{max}$ for desired TE mode suppression, and
(d) the desired minimum TE mode attenuation: $\alpha_{min}$.

The design approach may include the steps of:
selecting a dielectric constant for region 1: $\in_{r1}$; the TE mode 2 cutoff frequency is highest when region 1 is an air dielectric;
selecting the cover height (thickness $t_1$); the TE mode suppression bandwidth increases as the cover height decreases; the EBG stopband bandwidth for TM modes will also increase;
determining the TE mode cutoff frequency (2nd root) using equation (57) comparing the mode 2 cutoff frequency to $f_{max}$; if the cutoff frequency is too low, decrease $t_1$ or decrease $\in_{r1}$ and repeat the previous step;
selecting an initial value of sheet resistance, R, based on equation (50) and manufacturable values of $R_{film}$;
computing the complex propagation constant $k_x=\beta-j\alpha$ over the desired frequency range using the dispersion equation (53).
sorting the complex propagation constant data $\alpha(\omega)$ to find the minimum attenuation over a desired frequency range; if the desired $\alpha_{min}$ is not achieved, reduce R and repeat the computation; and,
calculating the value of resistive film $R_{film}$ to be used in the gaps between patches to realize the desired R for the dimensions of the patch array, using equation (50) or (51)

For designs where the capacitive FSS has inclusions that are not simple planar square patches, then equations (30a), (30b) and (30c) can be used with full wave simulations to calculate the effective sheet capacitance C and resistance R as function of arbitrary unit cell geometry, and the material properties such as $R_{film}$.

Figure 43:
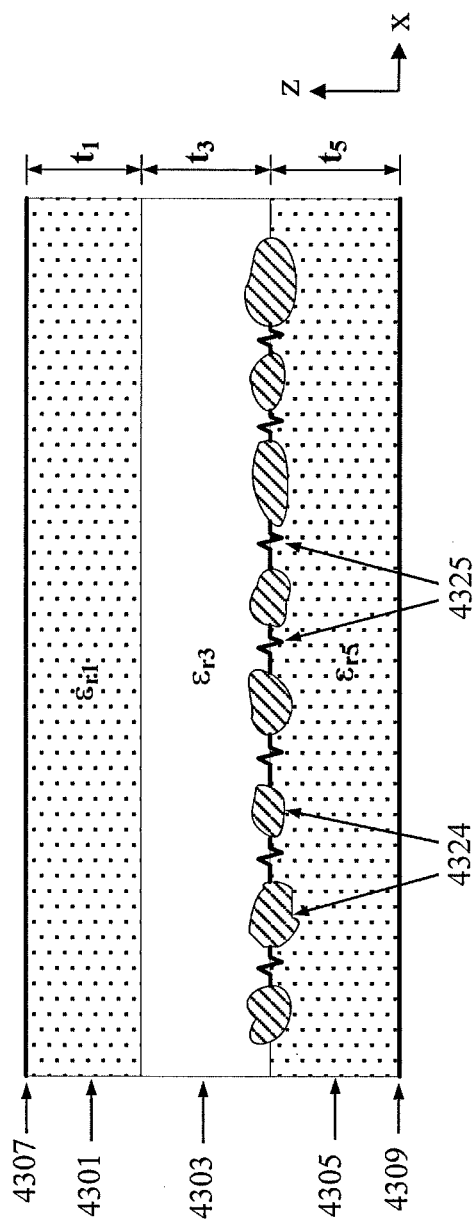
FIG. 43 shows a parallel-plate waveguide (PPW) containing three dielectric layers with a TE mode suppression structure located at the lower dielectric interface where the structure contains 3D conductive inclusions.

TE Mode Suppression Structures with 3 Dielectric Regions:

FIG. 43 shows another embodiment of the invention for suppression of TE modes. It is characterized by three distinct dielectric regions denoted as 4301, 4303, and 4305. Region 4303 may be an air region in a microwave of millimeterwave package. A PPW is formed by conductive plates 4307 and 4309. The PPW also contains a plurality of isolated conductive inclusions 4324, some of which are interconnected by a plurality of resistances 4325. The conductive inclusions 4324 are located on the surface of, or buried within, dielectric region 4305. The volume of these inclusions may also extend up into dielectric region 4303. The previous description about the 3D conductive inclusions and resistances for FIG. 27 applies to FIG. 43.

The TE mode suppression structure shown in FIG. 43 may also be analyzed using the transverse resonance method applied to the multilayer effective medium model as shown in FIG. 22(a). However, in this example, only layer 2204 is an anisotropic magneto-dielectric media. The equivalent transmission line is shown in FIG. 22(b). If we assume that the array of conductive inclusions 4324 and resistances 4325 are a periodic array, then commercial full-wave electromagnetic simulators that support periodic boundary conditions and arbitrary geometries can be employed to calculate the normal incidence transmission response through this lossy capacitive FSS structure. Equations (30b) and 30c) can then be used to calculate the effective resistance R and capacitance C of an impedance sheet model for the lossy FSS structure. The effective transverse permittivity of the FSS layer, denoted as layer 4, becomes complex as a result of the resistive loss:

$$\varepsilon_{y4} = \frac{C}{\varepsilon_o t_4} - j \frac{1}{\omega \varepsilon_o R t_4} \tag{60}$$

The thickness of layer 4, denoted as $t_4$, can be defined to be any convenient value as long as it does not exceed the nominal thickness of the FSS layer. In practice, one can assume $t_4$ to be arbitrarily small since the effective media parameters scale with thickness. The remaining effective media parameters for layer 2204 are $\mu_{z4} \cong \mu_0$ and $\mu_{x4} = 2\in_{avg}/\in_{y4} = (\in_{r3}+\in_{r5})/\in_{y4}$. Note that the effective permeability tensor for layer 2204 has only real entries because we have assumed no magnetic losses in this example. All of the loss associated with resistances 4325 is accounted for in the complex value of the transverse permittivity $\in_{y4}$. Also note that dielectric region 4305 has $\mu_{r5}=\mu_{z5}=\mu_0$.

Figure 44:
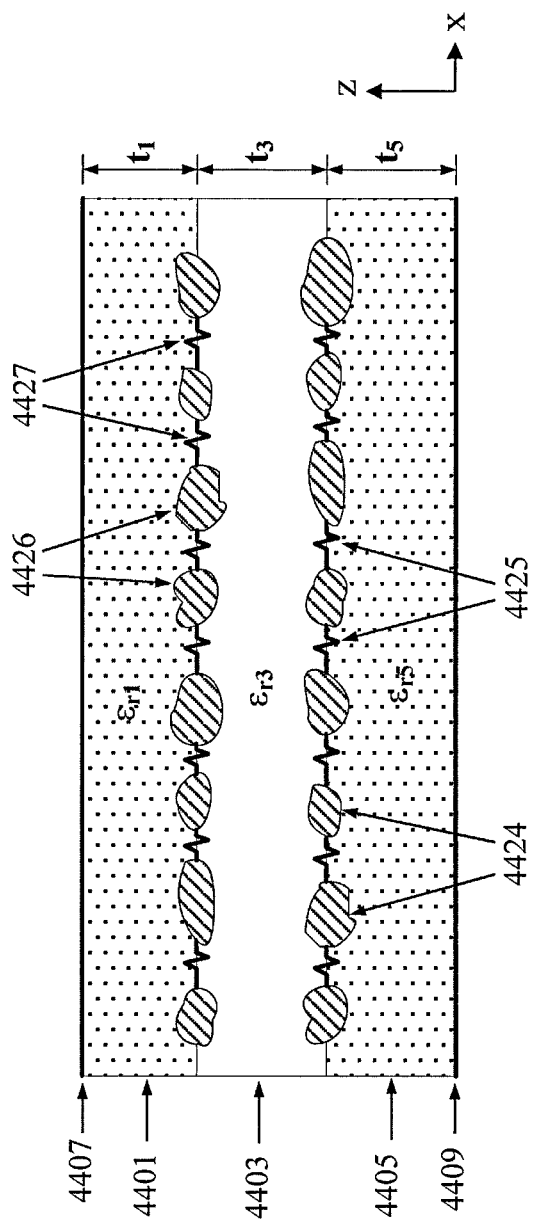
FIG. 44 shows a parallel-plate waveguide (PPW) containing three dielectric layers with TE mode suppression structures located at both of the dielectric interfaces where the structures contains 3D conductive inclusions.

FIG. 44 shows yet another design example for TE mode suppression. The design is also characterized by three distinct dielectric regions denoted as 4401, 4403, and 4405. Region 4403 may be an air region in a microwave or millimeterwave package. A PPW is formed by conductive plates 4407 and 4409. This example has two dielectric interfaces that each support an array of 3D conductive inclusions. The essentially planar interface between dielectric regions 4401 and 4403 supports a first array of conductive inclusions 4426 with interconnecting resistances 4427. The essentially planar interface between dielectric regions 4403 and 4405 supports a second array of conductive inclusions 4424 interconnected by resistances 4425. The conductive inclusions 4424 are located on the surface of or buried within dielectric region 4405. The volume of these inclusions may also extend up into dielectric region 4403. The conductive inclusions 4426 are located on the surface of or buried within dielectric region 4401. The volume of these inclusions may also extend down into dielectric region 4403. The previous description of the 3D conductive inclusions and resistances for FIG. 27 applies to FIG. 44.

Figure 45:
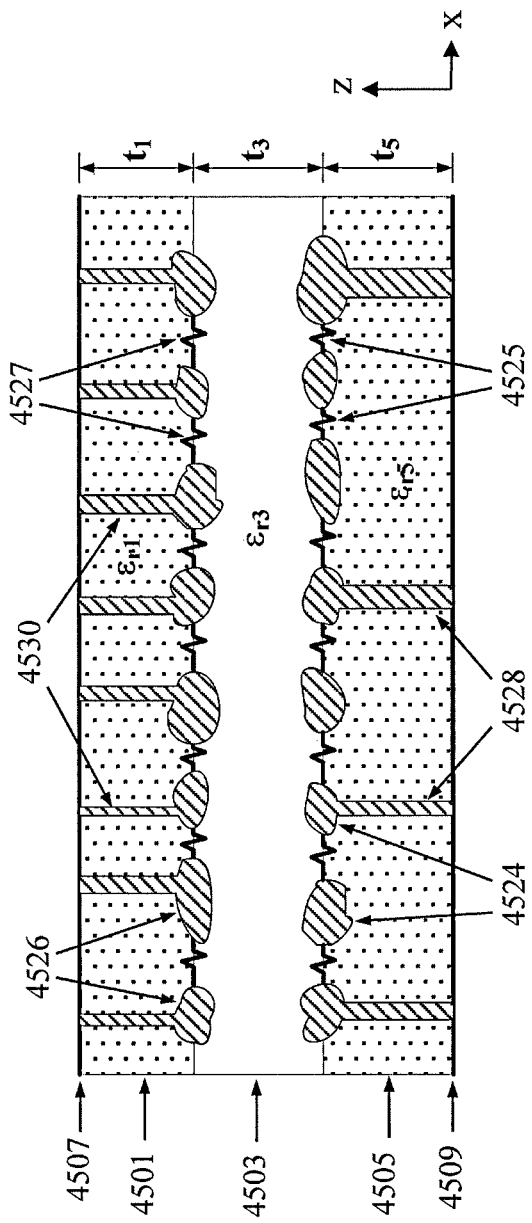
FIG. 45 shows a parallel-plate waveguide (PPW) containing three dielectric layers with TE mode suppression structures located at both of the dielectric interfaces where the structures contain 3D conductive inclusions and conductive vias in each of the upper and lower dielectric regions.

FIG. 45 shows yet another example of TE mode suppression. The example includes an essentially planar interface between dielectric regions 4501 and 4503. This interface supports a first array of conductive inclusions 4526 interconnected by resistances 4527. A second effectively planar interface exists between dielectric regions 4503 and 4505. This interface supports a second array of conductive inclusions 4524 interconnected by resistances 4525. FIG. 45 also shows conductive vias 4528 and 4530 that may be used to connect a subset of the conductive inclusions 4524 to the conductive surface 4509, and to connect a subset of the conductive inclusions 4526 to the conductive surface 4507. The two arrays of conductive vias, 4528 and 4530, form two different rodded media. The conductive vias allow suppression of the TM modes over a desired stopband, as shown in examples above. In general, the arrays of vias may not be identical in size or cross sectional shape, nor must they be periodic. Vias 4528 and 4530 may be randomly or periodically arrayed. The conductive vias 4528 and 4530 can be made to interact very little with the TE modes (which have modal fields of $\in_y$, $H_x$, and $H_z$ assuming propagation in the x direction) if the plan view cross sectional area occupied by the conductive vias is a small fraction of the total plan view area of the waveguide.

Figure 46:
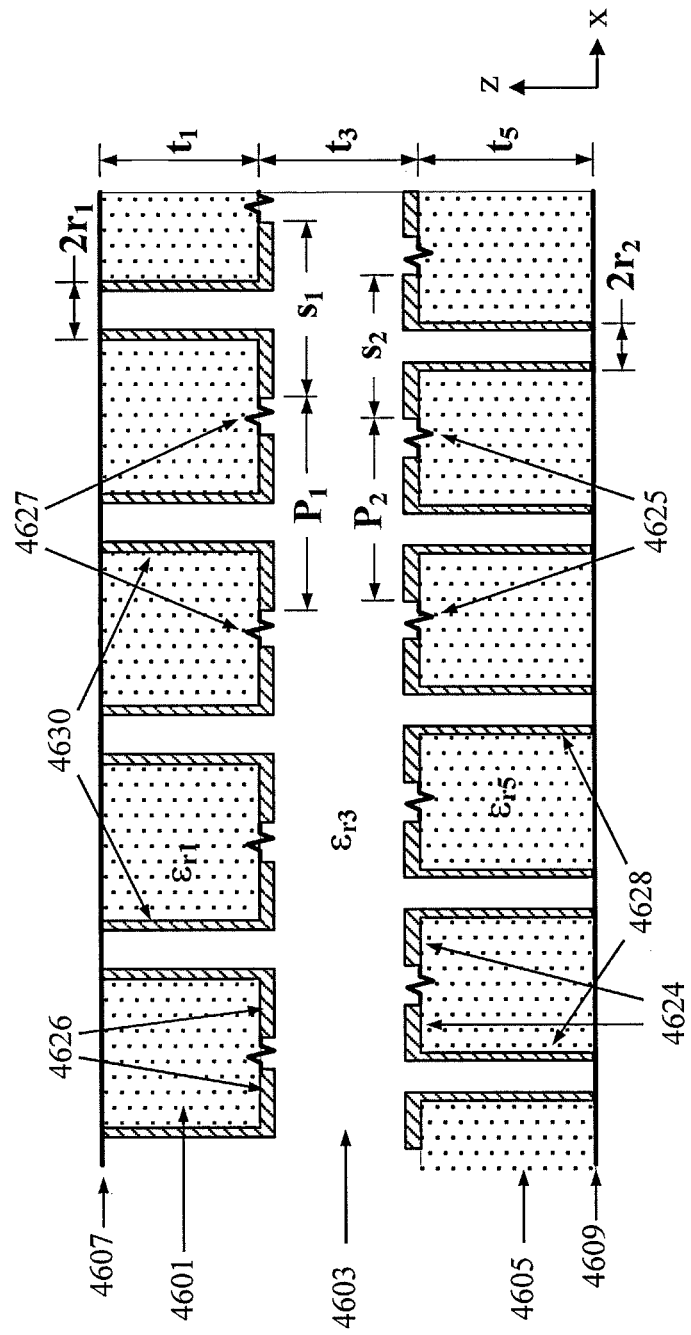
FIG. 46 shows a parallel-plate waveguide (PPW) containing three dielectric layers with periodic TE mode suppression structures located at both of the dielectric interfaces comprising printed patches at each interface and cylindrical conductive vias in each of the upper and lower dielectric regions.

As a special case of FIG. 45, assume that the 3D conductive bodies 4524 and 4526 are planar square patches. Assume also that the conductive vias 4528 and 4530 each form a periodic array with a square lattice. This case is shown in FIG. 46 where the inhomogeneous PPW has three distinct dielectric regions of 4601, 4603, and 4605 of relative dielectric constant $\in_{r1}$, $\in_{r3}$, and $\in_{r5}$ respectively. The period of the upper array is $P_1$ and the period of the lower array is $P_2$. In general, these periods may be different values. The patch sizes $s_1$ and $s_2$ may have different values, and the via radii $r_1$ and $r_2$ may be different between the upper and lower arrays. However, both upper and lower periodic structures contain resistances 4627 and 4625 which interconnect the conductive patches of 4626 and 4624 respectively. These resistances of the upper array 4627 may not be the same value as the resistances of the lower array 4625.

The EBG structure shown in FIG. 46 can exhibit stopbands for both TM and TE modes. To calculate the TM and TE mode complex propagation constants, the PPW of FIG. 46 may be first transformed into the effective medium model of FIG. 2 and then analyzed using the TRM applied to the equivalent transmission line models of FIG. 3. The same method described above for analyzing the lossy FSS in FIG. 43 can be used to calculate complex effective dielectric constants for regions 202 and 204 of FIG. 2. Specifically, the upper lossy FSS comprised of patches 4626 and resistances 4627 can be represented by an impedance sheet whose admittance is $(1/R_2)+j\omega C_2$ where $R_2$ and $C_2$ are the distributed resistance and capacitance of the FSS. This impedance sheet may be mapped into layer 202 of the effective medium model using the relationships:

$$\varepsilon_{y2} = \frac{C_2}{\varepsilon_o t_2} - j\frac{1}{\omega \varepsilon_o R_2 t_2} \quad (61)$$

and $$\mu_{z2} = 2\varepsilon_{avg}/\varepsilon_{y2} = (\varepsilon_{r1} + \varepsilon_{r3})/\varepsilon_{y2} \quad (62)$$

where $t_2$ is selected to be a convenient value that is much smaller than $t_1$ and $t_3$. Similarly, the lower lossy FSS comprised of conductive patches 4624 and resistances 4625 can be represented by an impedance sheet whose admittance is $(1/R_4)+j\omega C_4$. This impedance sheet may be mapped into layer 204 of the effective medium model using the relationships:

$$\varepsilon_{y4} = \frac{C_4}{\varepsilon_o t_4} - j\frac{1}{\omega \varepsilon_o R_4 t_4} \quad (63)$$

and $$\mu_{z4} = 2\varepsilon_{avg}/\varepsilon_{y4} = (\varepsilon_{r3} + \varepsilon_{r5})/\varepsilon_{y4} \quad (64)$$

where $t_4$ is selected to be a convenient value that is much smaller than $t_3$ and $t_5$. The change to the effective media model when resistances are added to the FSS structures is to model the transverse permittivity of the FSS layers as a complex value. All other parts of the effective media model and the TRM are consistent with description given between equations (6) and (23) inclusive.

It should be understood by persons of ordinary skill in the art that the mode suppression structures of FIGS. 29, 30, 45, and 46 are capable of (1) suppressing TM modes over a certain bandwidth, and (2) suppressing TE modes up to the cutoff frequency of the second TE mode. Both functions can occur simultaneously in the same structure. These structures are considered to be lossy EBG structures, having a lossy FSS. Suppression of both types of modes is improved (with greater suppression) as the total height of the PPW is reduced. This relationship may be helpful since low profile RF packages may be desirable for electronic assemblies. The size and density of the conductive vias plays a role in setting the frequency range of the TM mode stopband, while the TE modes are substantially unaffected by the vias. Conversely, the TE mode 1 absorptive attenuation is dominated by the value of the resistances used to interconnect conductive inclusions. These resistances have a smaller effect on the fundamental TM mode suppression band. Therefore, it may be possible to tailor the TM and TE mode suppression bands to be somewhat independent of each other. It may also be possible to design the TM and TE mode suppression bands to overlap each other. Usually the bandwidth of the TM mode stopband is smaller than the TE mode suppression bandwidth, and the TM mode suppression band lies below the frequency of the TE mode 2 cutoff.

The TE mode suppression structures and methods described herein may be considered to be a parallel plate waveguide (PPW) having a lossy capacitive frequency selective surface (FSS) internal thereto. Previous examples illustrate the lossy capacitive FSS as an array of isolated conductive inclusions that are interconnected by resistances. However, that is not the only approach to realizing a lossy capacitive FSS. Additional examples of a lossy capacitive FSS are illustrated in FIGS. 47 and 48.

Figure 47:
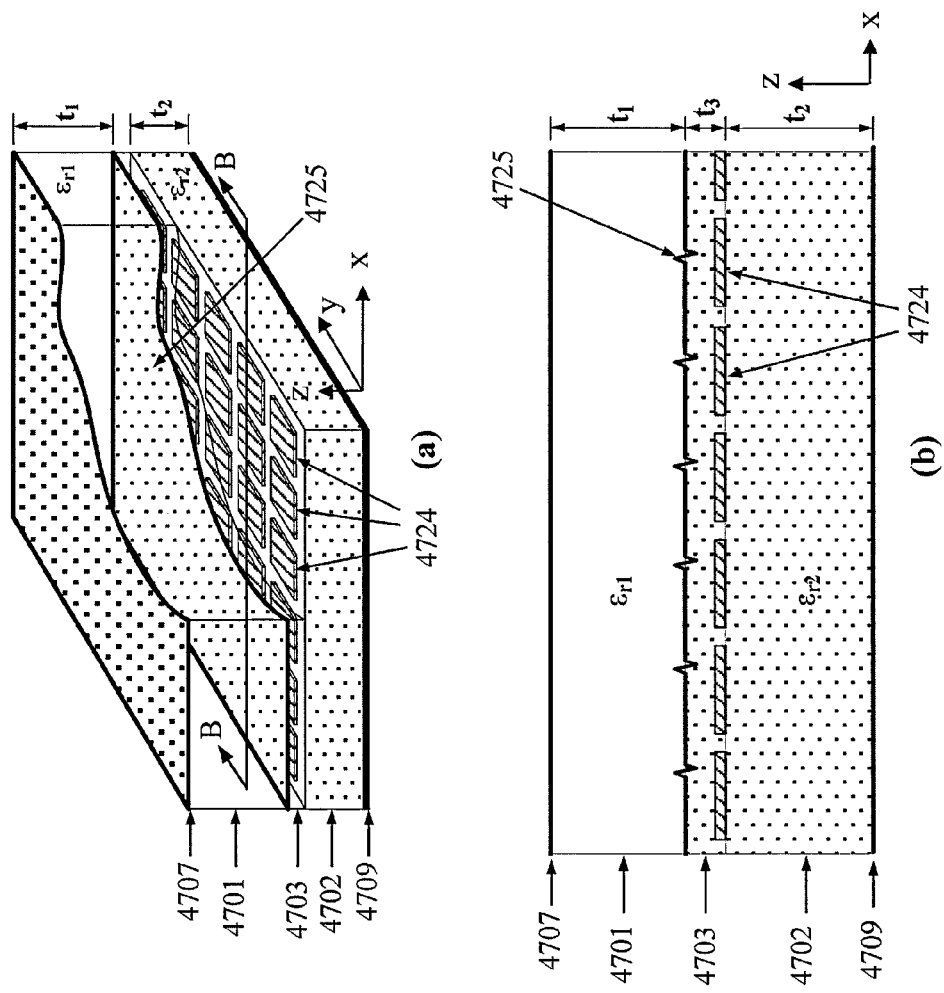
FIG. 47(a) shows a perspective view of an embodiment of a TE mode suppression structure comprising a planar array of isolated conductive patches and a continuous resistive sheet in an adjacent plane; and, (b) shows a representative profile view of the TE mode suppression structure.

FIG. 47(*a*) shows a perspective view of another example of a TE mode suppression structure in a PPW where the lossy capacitive FSS is realized by a combination of isolated conductive patches 4724, the relatively thin dielectric region 4703, and a continuous resistive sheet 4725. This resistive sheet may be a film. The resistive sheet 4725 may not electrically connect to the conductive patches 4724. However the resistive sheet is disposed in close proximity to the patches, and is electromagnetically coupled thereto. The conductive inclusions of the FSS are shown here as a 2D periodic array of planar rectangular patches 4724 arranged in a rectangular lattice. The array of patches 4724 may be formed at the planar interface between two dielectric regions 4702 and 4703. In this example the patches 4724 are rectangular, but in general they may have any polygonal shape. The dielectric region 4703 may be a thin insulating film whose maximum thickness $t_3$ is much less than $t_1$ and much less than $t_2$. Thickness $t_3$ may also be much less than a TE mode guide wavelength, and may typically be less than about 1/50 of the fundamental mode guide wavelength at the maximum frequency where TE mode suppression is desired.

The dielectric region 4703 may be, for example, an oxide layer or a passivation layer on a semiconductor wafer, or it may be a thin core layer in a printed wiring board stackup such as in an LTCC package or in an organic printed circuit board. The resistive sheet 4725 may be a continuous sheet of resistive film, or it may be a substantially continuous with an array of patterned slots or holes (not shown in FIG. 47) so as to increase the effective sheet resistance. The thickness of resistive film 4725 may be less than the thickness $t_3$, and it is illustrated in FIG. 47 as being infinitesimally thin. The thickness of the various layers may be determined by fabrication considerations.

FIG. 47(b) shows a profile view of FIG. 47(a) representative of the cross section BB in FIG. 47(a). In this profile view, the PPW is formed by conductive planes 4707 and 4709. Dielectric regions 4701 and 4702 are separated by a lossy FSS comprised of the conductive patch array 4724, the thin dielectric layer 4703, and the resistive sheet 4725. The overall thickness of the lossy FSS is small with respect the total height of the PWW, and it is small with respect to the TE mode guide wavelength. The example of FIG. 47 can be modeled mathematically with an RC impedance sheet as shown in FIG. 31. The effective sheet resistance R of the lossy FSS in FIG. 47 may be calculated by using a full-wave simulation of the FSS transmission response at normal incidence and equations (29), (30b) and (30c).

The dielectric region 4702 may be a part of a substrate in a printed circuit board, or in a chip package, or in a semiconductor chip. FIG. 47 shows the conductive patches 4724 disposed at the interface of the substrate 4702 and the thin insulating dielectric layer 4703. Alternatively, for example, the resistive film may be formed directly on the substrate 4702 as opposed to on dielectric layer 4703. In another aspect, the lossy FSS may be realized by reversing the locations of the patches and the resistive film such that the array of conductive patches 4724 is located at the interface of dielectric regions 4701 and 4703, and the resistive film 4725 is located at the interface of dielectric regions 4702 and 4703.

Figure 48:
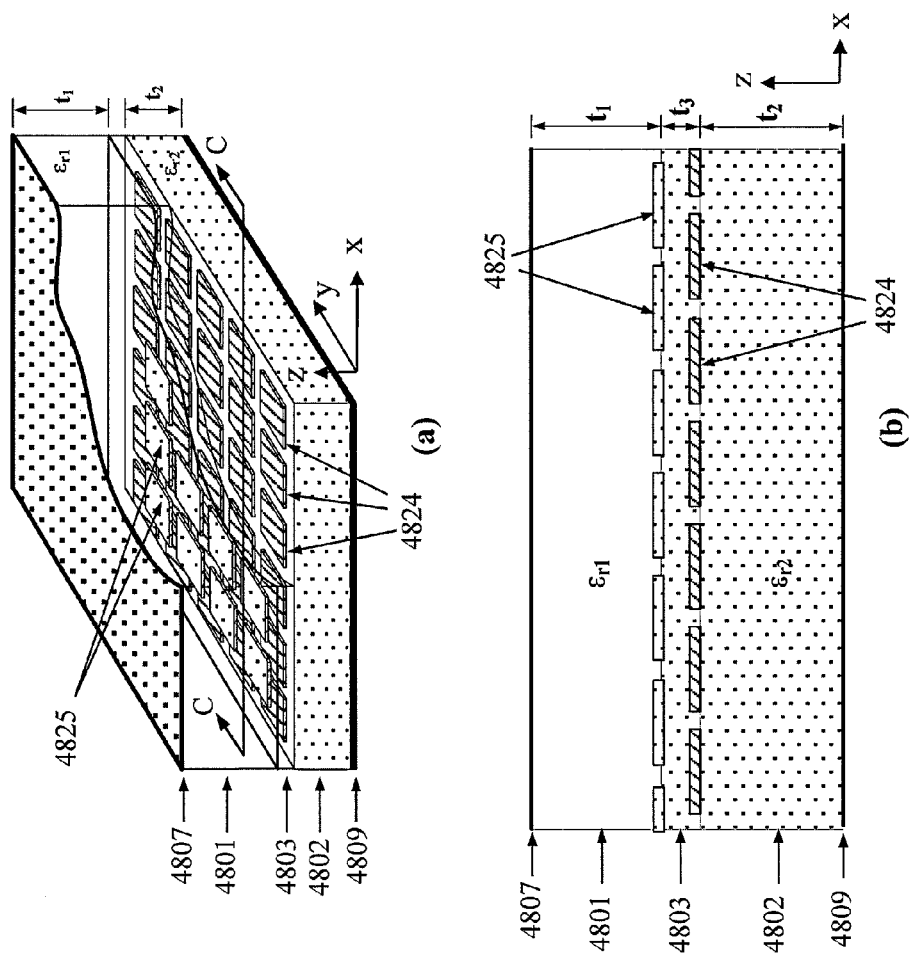
FIG. 48(a) shows a perspective view of an embodiment of a TE mode suppression structure comprising a planar array of isolated conductive patches and a coplanar array overlapping resistive patches in an adjacent plane; and, (b) shows a representative profile view of the TE mode suppression structure.

FIG. 48(a) shows a perspective view of another example of TE mode suppression in a PPW wherein the lossy capacitive FSS is realized by the combination of isolated conductive patches 4824, the relatively thin dielectric region 4803, and an array of isolated resistive patches 4825. The resistive patches 4825 are an example of a lossy inclusion which is a conductive body or a semi-conductor body that results in RF loss in electric currents induced on a surface thereof. FIG. 48(b) shows a profile view of FIG. 48(a) representative of the cross section CC in FIG. 48(a). The structure of FIG. 48 is similar to the structure of FIG. 47 differing in that the continuous planar resistive sheet 4725 is replaced with a planar array of resistive patches 4825. The resistive patches 4825 straddle the gaps between the conductive patches 4824 to couple with the transverse electric field in these gaps. The value of the effective sheet resistance can be engineered by adjusting the length, width, and thickness of the resistive patches 4825, and the thickness $t_3$ of dielectric layer 4803.

As an alternative, in a lossy FSS structure, the conductive patches 4824 of FIG. 48 can be resistive patches such that both arrays of patches 4824 and 4825 are made of resistive materials. In an aspect, the resistive patches can be linked using resistive connections 2335 that bridge the gap between adjacent resistive patches, such as was shown for the patches 3224 in FIG. 32(a) Alternatively, the patches may be connected by a conductive trace. The layer may be fabricated from a resistive film having a uniform effective sheet resistance, so as to result in a layer having both resistive properties and also having capacitive properties. That is, the area of the resistive patches contributes an effective capacitance per unit area that is approximately the same as that of highly conductive patches, and the effect of the resistive sheet results in an overall sheet resistance equivalent to that of the discrete resistors or resistive connections such as have been described. A FSS constructed in this manner may have comparable performance to previously described, while reducing the complexity of the fabrication thereof.

An example of a lossy EBG structure used for TE and TM mode suppression is shown in FIG. 49(a) which shows a plan view of a resistive film 4903. This resistive film 4903 may be patterned by, for example, selectively removing areas 4911. In this example, the removed areas 4911 form the shape of a Jerusalem cross. The remaining resistive film has the pattern of a uniplanar-compact photonic bandgap (UC-PBG) layer. The term UC-PBG adopts the nomenclature of, for example, of R. Coccioli et al. "UC_PBG Substrate for Planar Antennas", $29^{th}$ European Microwave Conference, Munich 1999 while using this shape in a different application and formed of a resistive film, rather than of a highly conductive material as would be desirable in an antenna.

In present example, the resistive film is patterned as a periodic two-dimensional array as shown in FIG. 49(a). However, any of the patterning shapes that could be used in a device with conductive patches could also be used. In this example the periodicity of the pattern is a square lattice of period P and with unit cell dimensions g1, g2, w and L. The patterned resistive film of FIG. 49(a) may also be described as a periodic array of resistive patches 4903a that are interconnected by a periodic array of resistive bridges 4903b.

The intrinsic resistance of the resistive film 4903 is denoted $R_{film}$. Typical resistive films that may be appropriate for millimeterwave applications have values of in the range from about 30 Ω/sq to about 300 Ω/sq.

FIG. 49(a) has a section line BB that cuts through a subset of an array of conductive posts 4928. The section view is shown in FIG. 49(b) which illustrates the profile view of a lossy EBG structure. Conductive surfaces 4907 and 4909 form a PPW. Dielectric layers 4901 and 4902 of thickness t1 and t2, respectively, separate the resistive film 4903 from conductive surfaces 4907 and 4909, respectively. An array of conductive posts 4928 is located in dielectric region 4902, and each conductive post electrically interconnects the resistive film 4903 with the conductive surface 4909. The thickness t3 of the resistive film 4903 may be much less than t2: typically 10 to 1000 times less.

Where a resistive film is used for the patches and for the connections between patches, the pattern of FIG. 49(a) may be formed using a blanket deposition process such as metal vapor deposition for tantalum nitride (TaN) or nickel chromium (NiCr) thin film resistors, spin coating, or screen printing for thick film resistors. The resistive film may be formed over at least an area where the FSS of the EGB structure is to be located and may be deposited as a continuous sheet. A subtractive manufacturing process may remove selected areas 4911 of the deposited resistive film. This step of the manufacturing process may be a laser ablation process or a chemical etching process or other equivalent process that is known or may subsequently be developed that can remove a portion of a previously deposited layer. Alternatively, the patterned resistive film may be formed using a screening process.

In an aspect, a thin film resistive sheet, such as one made from TaN or other can be laser ablated so as to achieve feature sizes as small as, for example, 25 μm, using existing manufacturing technology, and such small feature sizes are useful in millimeterwave structures.

The use of a laser ablation process, such as is used in trimming the values of a resistor, when forming the lossy FSS permits the construction of devices having spacings between the patches that are appropriate for millimeterwave structures. Such spacings are currently not achievable with screen printing techniques, which are presently limited to dimensions greater than about 0.003 inch.

Figure 49:
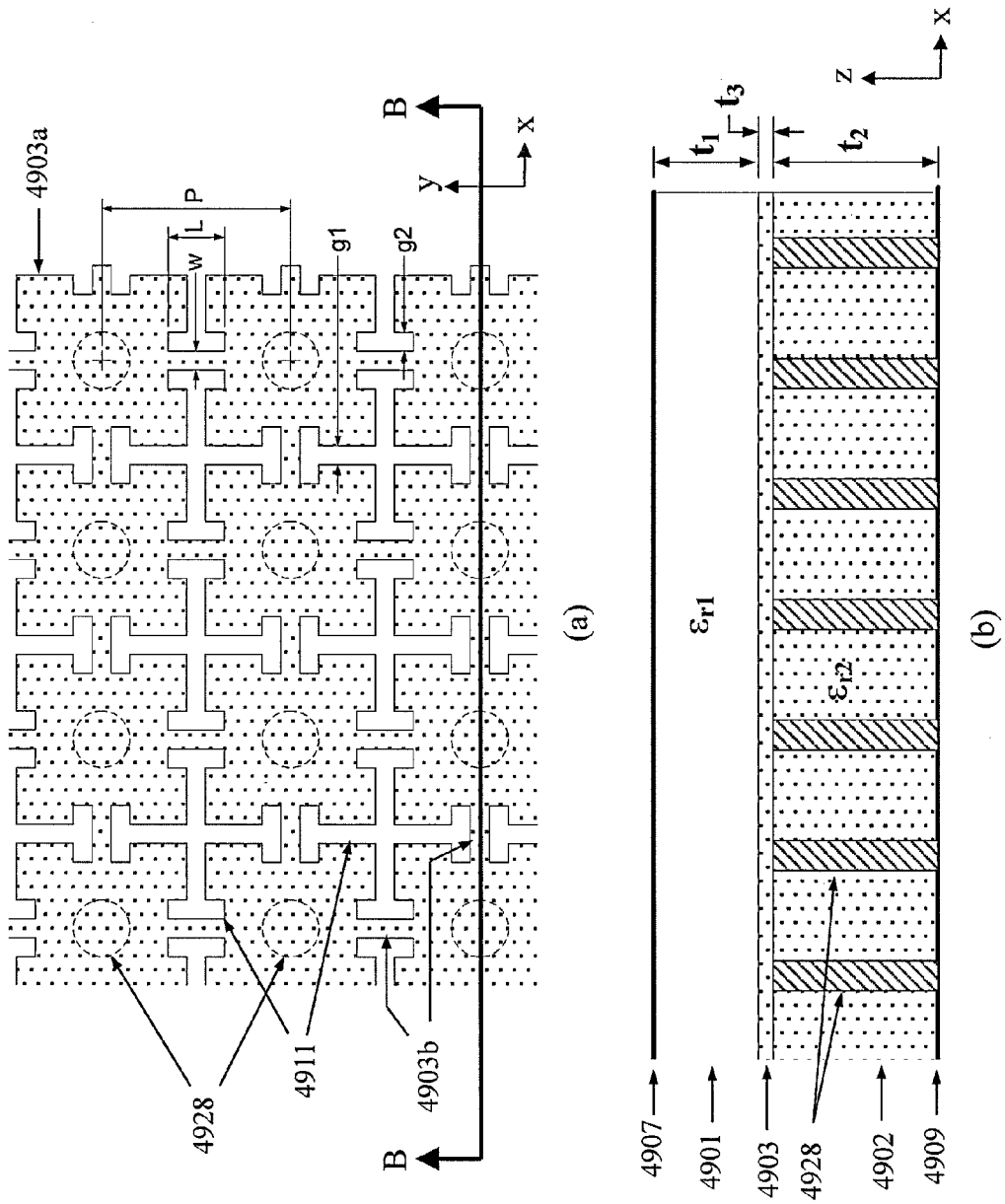
FIG. 49(a) shows a plan view of an embodiment of a mode suppression structure comprising a patterned planar resistive film; and, (b) shows a representative profile view of the mode suppression structure.

The lossy EBG structure of FIG. 49 may be employed, for example, under a flip chip circuit to suppress parasitic TM and TE modes in the region under the chip. The conductive surface 4907 may be a metal layer such as a ground layer of the active surface of a semiconductor die. Dielectric region 4901 may be an air region or underfill, which may be a dielectric material used to promote mechanical integrity of the chip attachment to the package.

The dimension t1 may be in the range of, for example, about 5 um to about 200 um. The dielectric region 4902 may be a substrate selected to approximately match the semiconductor chip thermal properties in expansion coefficient, such as selected ceramic composite materials or another semiconductor material. The conductive posts 4928 may be Ag or Au vias (single or stacked) formed in a low temperature co-fired ceramic (LTCC) substrate, or the vias may be through silicon vias (TSV) in a semiconductor substrate.

The vias may be constructed of materials having resistive properties. Lossy EBG structures such as those shown in FIG. 29, 30, 46 or 49 may exhibit a TM mode stopband: a range of frequencies where propagation of the TM mode in the PPW is significantly suppressed. The in-plane resistances of the lossy FSS inside the PPW may broaden the TM mode suppression bandwidth by lowering the TM cutoff frequency. However, a similar effect may be achieved by placing a resistance in series with the conductive vias that connect to either the lower or upper plate of the PPW, or forming the vias of a resistive material. Relatively low values of series resistance may be effective, typically less than 20 Ohms. Significantly higher values of series resistance (>200 Ohms) can isolate the vias from the conductive inclusions resulting in elimination of the TM mode stopband or shifting the TM mode stopband to a much higher frequency range. The use of resistance in series with the vias may not affect the propagation of TE modes within the PPW as, in general, TE modes have horizontal E fields which will not excite significant currents in the vias, whose axial dimension is oriented in the vertical or normal direction to the PPW.

In an aspect, a relieved via may be used so that the resistive patch is connected to the via by a resistive element. This element may be a discrete resistive element, or be formed by ablating the resistive patch in the vicinity of the connection to the via so as to increase the series resistance of the resultant connection.

In an aspect, dimension t2 of FIG. 49 may be in the range of approximately 150 um to approximately 500 um. The conductive surface 4909 which forms the lower plate of the PPW may be one or more conductive layers in an LTCC package, or the conductive surface may be a metalized layer in a semiconductor package. In an under-chip application, the lossy EBG structure of FIG. 49 may be effective for parasitic mode suppression over a broad bandwidth from at least about 50 GHz to about 140 GHz.

Figure 50:
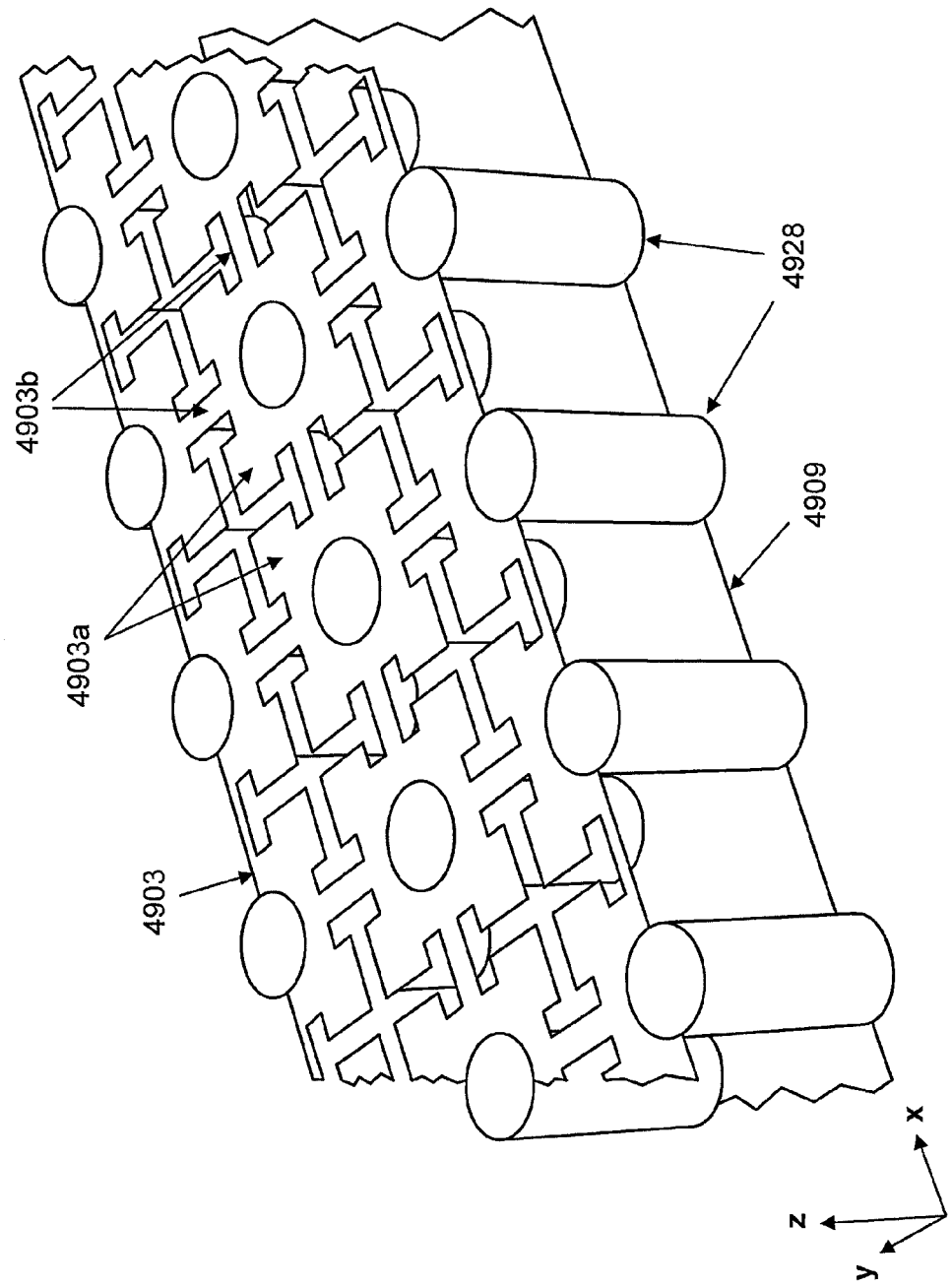
FIG. 50 shows a perspective view of the mode suppression structure described in FIG. 49 where dielectric layers are hidden.

FIG. 50 shows a 3D perspective view of a portion of the mode suppression structure of FIG. 49. The upper conductive surface 4907 of the PPW is not shown. Also, the dielectric regions 4901 and 4902 are hidden in these illustrations so as to allow the array of vias 4928 and the lower conductive surface 4909 of the PPW to be clearly visible. The patterned resistive film 4903 is illustrated in FIG. 50 as having zero thickness for simulation purposes (t3=0). Note that, in this example, the patterned resistive film 4903 is coplanar with the top ends of the array of conductive posts 4928, and the resistive film 4903 electrically interconnects the conductive posts 4928.

Figure 51:
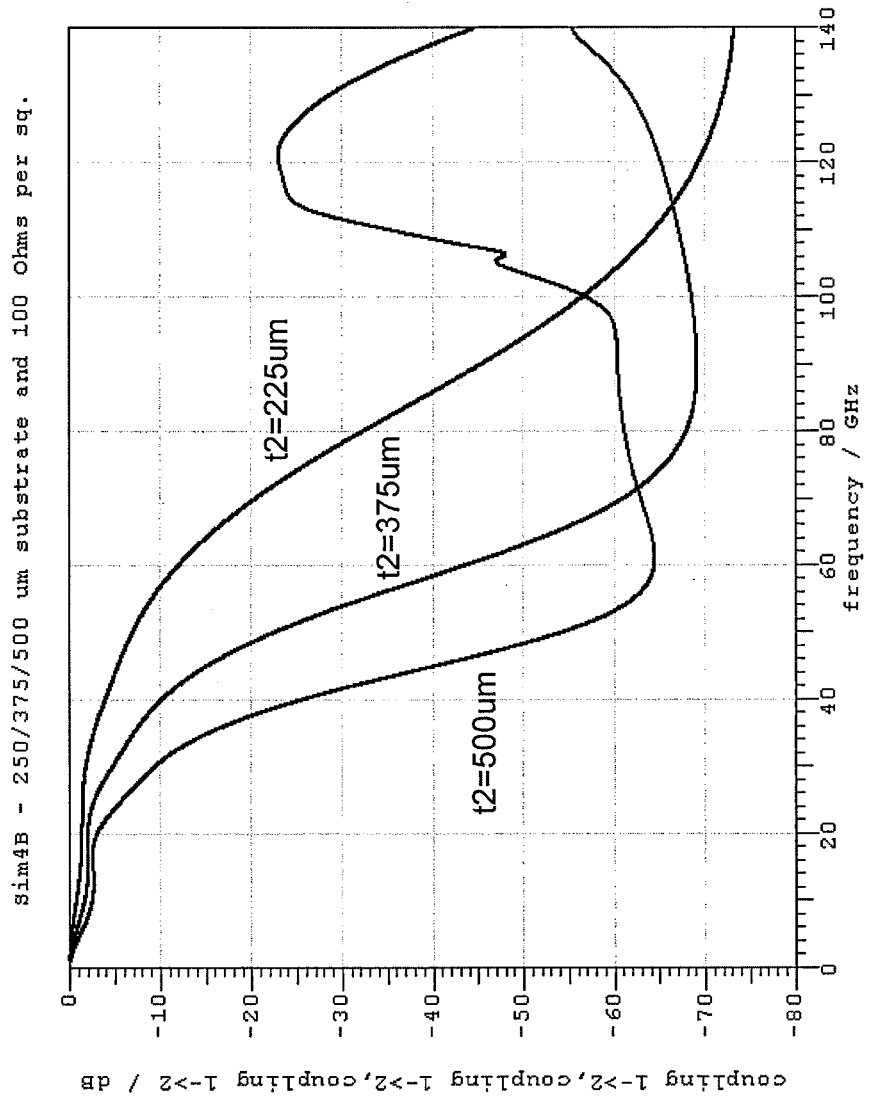
FIG. 51 shows a representative plot of the TM mode transmission response through seven unit cells of the mode suppression structure of FIG. 49.

FIG. 51 shows a simulated plot of the TM mode transmission response through seven unit cells of the mode suppression structure of FIG. 49. The TM mode has a z-directed electric field component, and these simulated results are from a finite length waveguide using magnetic side walls and lossless conductive top and bottom walls (PPW surfaces 4907 and 4909). The waveguide simulation includes seven contiguous unit cells. The design parameters are listed on the left side of FIG. 51, and were selected to represent a typical under-chip mode suppression application. Parameters of the dielectric region 4902 and the conductive posts 4928 are selected to represent an LTCC substrate. The three curves represent different thickness t2 of dielectric region 4902. As the thickness t2 increases, the TM mode stopband shifts to lower frequencies. For the simulated curves of FIG. 51, the intrinsic resistance of the resistive film is $R_{film}=100$ Ω/sq. Patterning the resistive film increases the effective sheet resistance. Equations (30a), (30b) and (30c) can be used with full wave simulations to calculate the effective resistance R and the effective sheet capacitance C of the patterned resistive film in the presence of its adjacent dielectric layers.

Figure 52:
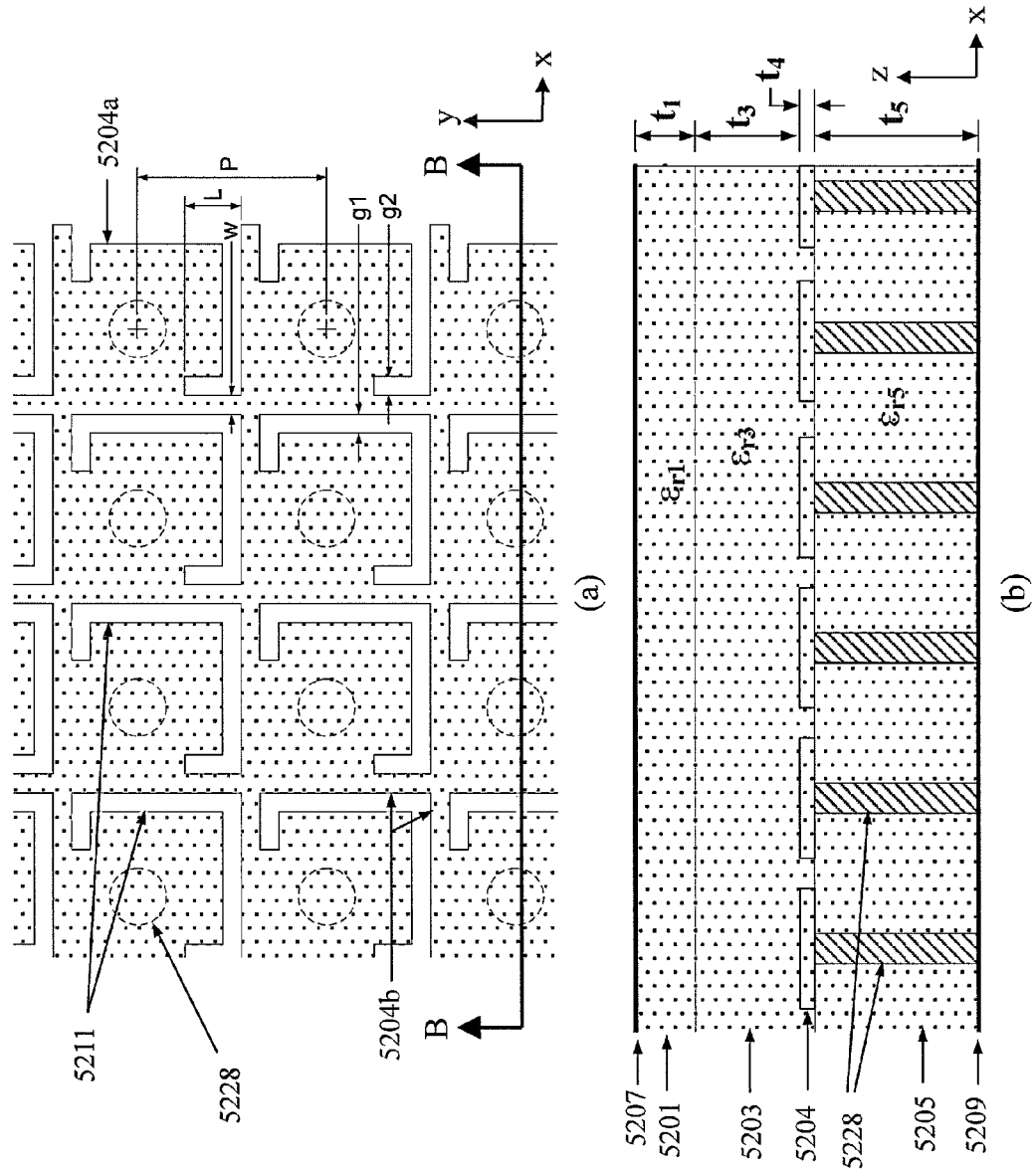
FIG. 52(a) shows a plan view of another embodiment of a mode suppression structure comprising a patterned planar resistive film; and, (b) shows a representative profile view of the mode suppression structure.

FIG. 52 shows another example of a lossy EBG structure used for both TE and TM mode suppression. FIG. 52(a) shows the plan view of a patterned resistive film 5204 formed by selectively removing areas 5211 of the film.

The patterned resistive film 5204 shown in FIG. 52 has a geometric shape resembling the alternating-impedance EBG structure disclosed by Jinwoo Choi et. al. in "A Novel Electromagnetic Bandgap (EBG) Structure for Mixed-Signal System Applications," 2004 IEEE Radio and Wireless Conference, pp. 243-246. Often the choice of a shape corresponding to a conductive shape used for another purpose may simplify the detailed electromagnetic analysis as some of the modeling methods may be similar. However, the actual use of the shape in the present examples is to achieve quite a different result than reported in the literature.

The patterned resistive film 5204 is comprised of an array of patches 5204a interconnected by an array of bridges 5204b. The example of FIG. 52(a) shows the patterned film as a periodic two-dimensional array with a square lattice of period P. However, this is not a limitation as the periodic lattice need not be square but may be, for example, rectangular, hexagonal, or triangular. FIG. 52(a) has a section line BB that cuts through a subset of an array of conductive posts 5228. The corresponding section view is shown in FIG. 52(b) which illustrates the profile view of this lossy EBG structure. Conductive surfaces 5207 and 5209 form a PPW. Dielectric layers 5201, 5203, and 5205 have thickness t1, t3, and t5, respectively. The resistive film 5204 is located at the interface between dielectric layers 5203 and 5205. An array of conductive posts 5228 is located in dielectric region 5205, and each conductive post electrically interconnects the resistive film 5204 with the conductive surface 5209. The thickness t3 of the resistive film 5204 may be much less than t5, typically 10 to 1000 times less.

In another example, dielectric layer 5203 may be an air region or air cavity in a shielded microwave or millimeterwave package containing electronic circuits. The dielectric layer 5201 may be part of a cover or lid for the package. In an under-chip application, dielectric layer 5201 may be part of a semiconductor chip such as bulk silicon or GaAs, and the conductive surface 5207 may be the die backside metallization. Alternatively, dielectric layer 5203 may be a protective film or a structural component of the substrate comprising dielectric layer 5205. Where dielectric layer 5203 is a physical material rather than air, the effective sheet capacitance of the patterned resistive film will be greater, which lowers the frequency of the TM mode stopband.

Figure 53:
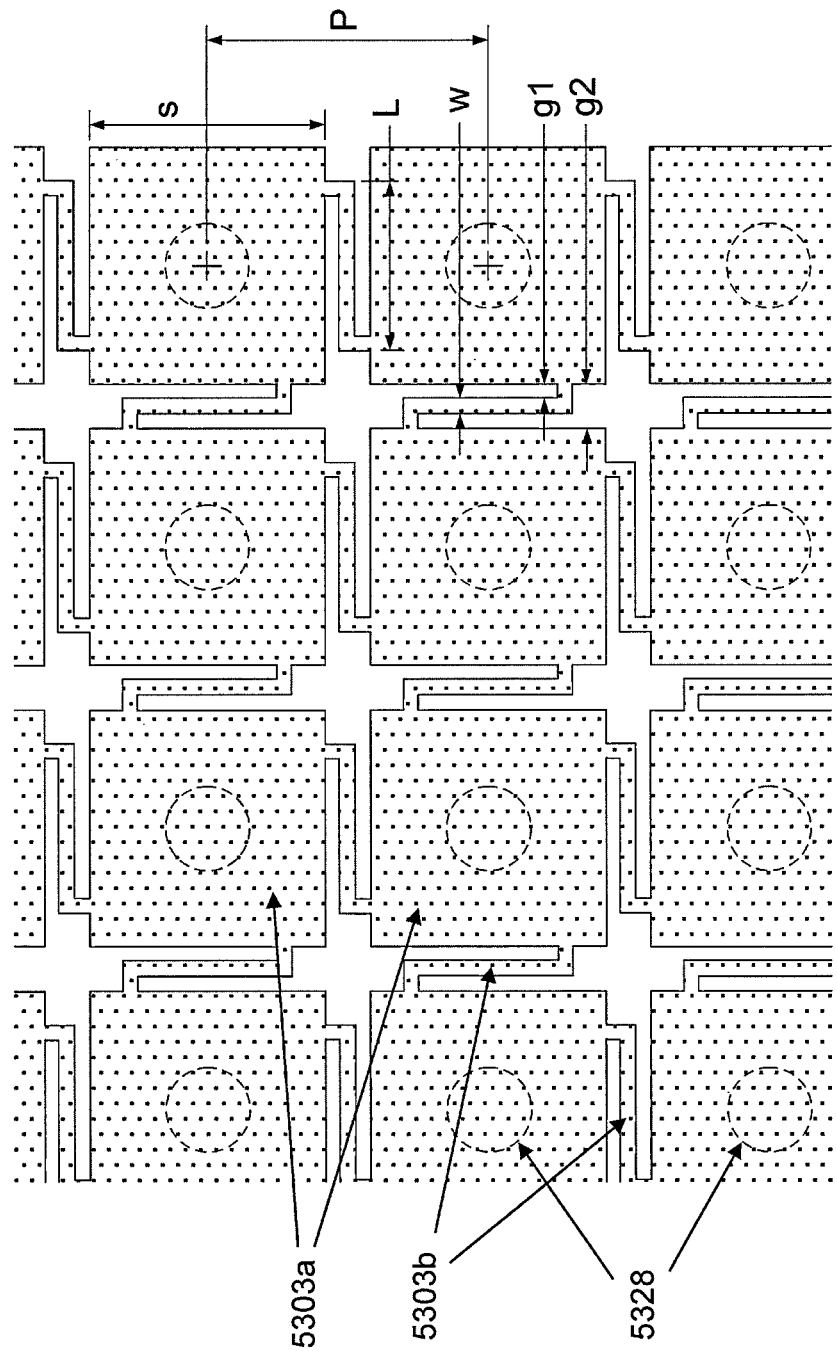
FIG. 53 shows a plan view of another embodiment of a mode suppression structure comprising a patterned planar resistive film.

FIG. 53 shows another example of a patterned resistive film 5303 which may be used as layer 4903 or layer 5204 in the mode suppression structures of FIGS. 49 and 52. In FIG. 53, the patterned resistive film is comprised of resistive patches 5303*a* interconnected by resistive bridges 5303*b*. The resistive bridges are shaped in the form of an "S" which allows the layout of the bridges to be relatively long and narrow. When used with resistive film materials which may have very low values of intrinsic sheet resistance $R_{film}$ a number of squares in series may be used to interconnect the patches. In FIG. 53 the resistive film is patterned in a periodic array with a square lattice of period P. The hidden lines in this plan view show an array of conductive posts 5328 which connect the resistive film to one of the conductive plates or conductive surfaces of the PPW.

Alternatively, in the examples of FIGS. 49-53 the resistive film may be a continuous sheet. However, the effective sheet capacitance is then essentially zero which raises the stopband frequency range. Using a non-patterned resistive film requires fewer manufacturing steps implying, lower cost, but thicker substrates 4902 or 5205 may be needed to achieve a desired stopband frequency range. A thicker substrate increases the RF losses for RF transitions which route signals through the substrates.

In another example, the lossy FSS may be used without the PPW. An example such as shown in FIG. 49 with the conductive surface 4907 absent permitting the fields and waves propagating along this periodic structure to extend in the +z direction into free space above dielectric layer 4901 (z>t1+t2+t3). FIG. 50 shows conductive bodies in this open, lossy, EBG structure. This uncovered version of the EBG structure of FIG. 49 will suppress TE and TM mode surface waves. The TM mode has a z component of electric field which will excite currents in the conductive posts that also circulate through the resistive film. The TE modes have a transverse (in-plane) component of electric field which will directly excite currents in the resistive film. The power in the guided TE and TM surface wave modes will be absorbed in the resistive film 4903 and be dissipated as heat. The resistive film in a surface wave absorber need not be patterned and the patterned resistive film in a surface wave absorber need not be periodic. If the patterned resistive film is periodic, the pattern need not be the same as the array of conductive posts, although the periods should be commensurate.

The conductive posts in the examples shown above are shaped as circular cylinders. Alternate post cross sectional shapes may be used such as square, hexagonal, or cross shapes or any polygonal shape. The examples shown above employ conductive posts of uniform shape, but that is not a limitation as posts of graded size or non-uniform size may be used for applications were the stopband for mode suppression is intended to be position dependent. The examples of patterned resistive films shown above have uniform periodic patterns. However, this is not a limitation as the patterns may vary with position to exhibit an effective sheet resistance R=R(x,y) and an effective sheet capacitance C=C(x,y) such that these electrical properties are position dependent.

It would be understood by a person of ordinary skill in the art that the term "lossy FSS" as used herein refers to an effectively planar structure capable of being analytically modeled over a frequency range by an RC impedance sheet. The lossy FSS, as used herein, has a distributed capacitance C and a distributed resistance R. The maximum dimension of a physical feature of a component in the lossy FSS is of the order of about ⅙ of a guide wavelength at the highest frequency where all of the TE modes are suppressed: that is, approximately the TE mode 2 cutoff frequency.

The dielectric and conducting materials described in the above examples are representative of some typical applications in MMIC packages. Many other material choices are possible, and the selection of materials is not considered a limitation, as each material may be characterized and analyzed to provide design parameters. Dielectric layers may include semiconductors (Si, SiGe, GaAs, InP), ceramics (Al2O3, AlN, SiC, BeO) or ceramic composite materials including low temperature co-fired ceramic (LTCC) materials, and plastic materials such as liquid crystal polymer. Dielectric layers may also include organic laminates and laminates made from organic composites which may include ceramic particles, glass particles, and fiberglass. Metals may include (Al, Cu, Au, W, Mo), and metal alloys (FeNiCo (Kovar), FeNiAg (SILVAR), CuW, CuMo, Al/SiC) and many others. The substrate and cover (or upper and lower dielectric layers) need not be made of the same materials. The examples described in this application can be implemented using printed wiring boards at the printed circuit board level, the package level, or at the die level. This means that the dielectric regions or magneto-dielectric regions described in, for example, FIGS. 2, 4, 5, 10, 12, 13, 15, 16, 18, 19, 21-31, 43-50 and 52-53 may represent laminates or substrates that are (a) used as printed circuit board materials, (b) used in electronic packages, or (c) used in semiconductor chips or semiconductor die. Furthermore, the surfaces used to form the parallel-plate waveguides may not both reside entirely inside a printed circuit board, or entirely inside an electronic package, or entirely inside a semiconductor die. For a given PPW, one of the surfaces may be realized as part of a printed circuit board, and the second surface may be realized as part of a microwave or millimeterwave package. Alternatively, one surface of the PPW may be part of a microwave or millimeterwave package and the second surface may be part of a semiconductor chip.

In an aspect, the different dielectric layers used in a given EBG structure can have different electrical or mechanical properties. The patch layers may contain patterns more elaborate than simple square patches, such as circular, polygonal, or inter-digital patches. Some of the patches of the capacitive layers may be left floating rather than being connected to conductive vias. Ratios of key dimensions may differ from illustrations presented.

Furthermore, the EBG structures of the examples may use additional layers to make a manufacturable product or for other purposes, some of which may be functional. For instance, thin adhesion layers of TiW may be used between a silicon wafer and deposited metal such as Au, Cu, or Al. Insulating buffer layers may be added for planarization. Passivation layers or conformal coatings such as solder mask may be added to protect metal layers from oxidizing. All of these additional manufacturing-process related layers are typically thin with respect to the thicknesses of $t_1$ through $t_5$, and their effect may be viewed as a perturbation to the stopband performance predicted by the above analytic methods.

In the preceding figures only a finite number of unit cells are illustrated: fewer than 20 per figure. However EBG structures may contain hundreds or even thousands of unit cells within a particular package. Yet, not all of the available area within the package may be utilized for EBG structures. A structure having the equivalent of three cells in a direction may have effective performance in many applications. So, a wide range of structure overall dimensions may be used in a design. Furthermore, it should be understood that all of the unit cells need not be identical in a particular package. The EBG or stopband may be designed to have differing properties in various portions of the package so as to create, for example, a broader band for the mode suppression structure. There may also be EBG designs that are tuned to different stopband frequencies. A particular package design may be used where there are multiple frequency bands in an electrical circuit and, hence, may employ EBG structures tuned to different stopbands in different physical locations.

In some of the examples illustrated, the EBG structures are shown as located adjacent to RF transmission lines. However, the EBG structures may also be fabricated over the microstrip, CPW, or other transmission lines, such as in a cover, and the transmission lines may be fabricated into the opposing base. EBG structures may also be fabricated into the package to reside over or under an integrated circuit.

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention as defined in the following claims.

What is claimed is:

1. A package for an electrical circuit, comprising:
   a first conductive surface;
   a second conductive surface;
   a resistive layer disposed at a first fixed distance from the first conductive surface and a second fixed distance from the second conductive surface;
   a first dielectric material, having a relative dielectric constant greater than unity, disposed between the resistive layer and the first conductive surface; and
   a second dielectric material, having a relative dielectric constant greater than or equal to unity, disposed between the resistive layer and the second conductive surface,
   wherein the first distance, the second distance and the relative dielectric constants of dielectric layers disposed between the resistive layer and the conductive surfaces are selected such that propagation of a TE mode is suppressed in amplitude over a selected frequency interval; and, the resistive layer has an intrinsic resistance of at least 30 Ohms per square.

2. The package of claim 1, wherein the resistive layer is a continuous film without any intentional patterning.

3. The package of claim 1, wherein the resistive layer is patterned in a two dimensional array.

4. The package of claim 3, wherein the pattern of the resistive layer is geometrically a uniplanar-compact photonic bandgap (UC-PBG) structure.

5. The package of claim 3, wherein the resistive layer is patterned as a periodic structure.

6. The package of claim 3, wherein the pattern of the resistive layer is geometrically an alternating impedance EBG structure.

7. The package of claim 3, wherein the pattern of the resistive layer is geometrically an array of polygons interconnected with S-shaped bridges.

8. The package of claim 1, wherein either the first or second dielectric material is a ceramic or ceramic composite.

9. The package of claim 1, wherein the resistive layer is formed as part of a package lid.

10. A method for controlling parallel-plate waveguide (PPW) modes in a package, the method comprising:
    providing a first and a second conductive surface at least one of the surfaces being a part of the package; and
    disposing a lossy frequency selective surface (FSS) between the first conductive surface and the second conductive surface; the lossy FSS further comprising;
    a dielectric layer with a resistive film formed thereon or within, and a pattern formed in the resistive film to form an impedance sheet having both a distributed resistance and a distributed capacitance,
    wherein the resistive layer has an intrinsic resistance of at least 30 Ohms per square.

11. The method of claim 10, further comprising:
    selecting the geometric shape of the pattern, the size of the pattern and the material properties of the resistive film such that the propagation of a transverse electric (TE) wave is suppressed in amplitude over a selected frequency interval.

12. The method of claim 10, further comprising:
    disposing an array of conductive vias between the resistive film and one of the first or the second conductive surfaces to from an electrical connection therebetween, and
    selecting the spacing, shape, and dimensions and a conductivity of the conductive vias such that the propagation of TM modes is suppressed in amplitude over a desired frequency interval.

13. The method of claim 10, wherein the package is a printed wiring assembly.

* * * * *